(12) United States Patent
Kaneko et al.

(10) Patent No.: US 9,977,070 B2
(45) Date of Patent: May 22, 2018

(54) METHOD FOR INSPECTING MAGNETRON

(71) Applicant: Tokyo Electron Limited, Tokyo (JP)

(72) Inventors: Kazushi Kaneko, Miyagi (JP); Hideo Kato, Miyagi (JP); Kazunori Funazaki, Miyagi (JP); Eiji Takahashi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 290 days.

(21) Appl. No.: 14/886,425

(22) Filed: Oct. 19, 2015

(65) Prior Publication Data
US 2016/0109502 A1   Apr. 21, 2016

(30) Foreign Application Priority Data

Oct. 21, 2014 (JP) ................................. 2014-214350
Aug. 4, 2015 (JP) ................................. 2015-154248

(51) Int. Cl.
*G01R 31/25* (2006.01)
*H01J 37/32* (2006.01)
*H01J 37/34* (2006.01)

(52) U.S. Cl.
CPC ........ *G01R 31/255* (2013.01); *H01J 37/3288* (2013.01); *H01J 37/32926* (2013.01); *H01J 37/3405* (2013.01); *H01J 37/3476* (2013.01)

(58) Field of Classification Search
CPC ................ G01R 31/255; H01J 37/3288; H01J 37/3405; H01J 37/3476; H01J 37/32926
See application file for complete search history.

(56) References Cited

FOREIGN PATENT DOCUMENTS

WO    2013/146655 A1    10/2013

OTHER PUBLICATIONS

Fisk et al., The Magnetron as a Generator of Centimeter Waves, Apr. 1946, The Bell System Technical Journal, vol. 25, Issue 2, pp. 167-348.*
Abstract of Fisk Reference, Apr. 1946, 2 pp.*

* cited by examiner

*Primary Examiner* — Toan Le
(74) *Attorney, Agent, or Firm* — Pearne & Gordon LLP

(57) ABSTRACT

A magnetron can be inspected with high accuracy. A life of the magnetron is determined on the basis of a comparison between a current parameter, which indicates a current status of the magnetron and is obtained from the one or more measurement values for specifying a current status of the magnetron at a time point when a time period having a predetermined duration or more has elapsed after generation of a high frequency power by the magnetron is started, and a difference between a power of a progressive wave and a set power is equal to or lower than a first predetermined value and a power of a reflection wave is equal to or lower than a second predetermined value, and an initial parameter, which indicates an initial status of the magnetron and corresponds to the current parameter.

11 Claims, 24 Drawing Sheets

FIG. 7

| SET POWER ($P_{set}$) | INITIAL ANODE CURRENT ($I_i$) | ABSOLUTE VALUE ($V_i$) OF INITIAL ANODE VOLTAGE | INITIAL HIGH FREQUENCY CONVERSION EFFICIENCY ($\eta_i$) | INITIAL PEAK FREQUENCY ($F_i$) |
|---|---|---|---|---|
| $P_{set}(1)$ | $I_i(1)$ | $V_i(1)$ | $\eta_i(1)$ | $F_i(1)$ |
| $P_{set}(2)$ | $I_i(2)$ | $V_i(2)$ | $\eta_i(2)$ | $F_i(2)$ |
| $P_{set}(3)$ | $I_i(3)$ | $V_i(3)$ | $\eta_i(3)$ | $F_i(3)$ |
| ...... | ...... | ...... | ...... | ...... |
| $P_{set}(N-1)$ | $I_i(N-1)$ | $V_i(N-1)$ | $\eta_i(N-1)$ | $F_i(N-1)$ |
| $P_{set}(N)$ | $I_i(N)$ | $V_i(N)$ | $\eta_i(N)$ | $F_i(N)$ |

METHOD FOR INSPECTING MAGNETRON

CROSS-REFERENCE TO RELATED APPLICATION

This application claims the benefit of Japanese Patent Application Nos. 2014-214350 and 2015-154248 filed on Oct. 21, 2014 and Aug. 4, 2015, respectively, the disclosures of which are incorporated herein by reference.

TECHNICAL FIELD

The embodiments described herein pertain generally to a method for inspecting a magnetron.

BACKGROUND

In manufacturing an electronic device such as a semiconductor device, a plasma processing apparatus has been used in order to perform, for example, an etching process or a film forming process, on a target object. The plasma processing apparatus includes a device configured to generate energy to be supplied into a processing vessel in order to generate plasma of a processing gas introduced into the processing vessel. For such a device, a magnetron configured to generate a microwave is known.

A status of the magnetron is changed from an initial status immediately after being manufactured or immediately after being mounted on the plasma processing apparatus with the lapse of use time. For example, a status of the magnetron is changed as a surface carbonized layer constituting a filament is consumed. If a status of the magnetron is changed as such, a status of plasma to be generated is changed accordingly, which causes a bad influence on a process performed on the target object. Therefore, it is necessary to check a time to replace the magnetron by inspecting the magnetron.

As a method for inspecting a magnetron, for example, a technique described in Patent Document 1, i.e., International Patent Publication No. WO2013/146655 has been developed. According to the technique described in Patent Document 1, a parameter indicating a current status of a magnetron and a parameter indicating an initial status of the magnetron are compared to determine whether or not a life of the magnetron is ended, and if it is determined that a life of the magnetron is ended, a signal to request replacement of the magnetron is outputted.

Patent Document 1: International Patent Publication No. WO2013/146655

SUMMARY

The present inventors found that a magnetron cannot be appropriately inspected depending on a timing for detecting a measurement value, e.g., a measurement value for a power of a progressive wave, a measurement value for a power of a reflection wave, a measurement value for an anode voltage, a measurement value for an anode current, used for obtaining a parameter indicating a status of a magnetron. Accordingly, it is necessary to inspect a magnetron with higher accuracy, for example, determine a life of the magnetron, by using a measurement value detected at an appropriate time point.

In one exemplary embodiment, a method for inspecting a magnetron is provided. This method includes (a) starting generation of a high frequency power by a magnetron based on a set power; (b) detecting one or more measurement values for specifying a status of the magnetron; (c) determining whether or not a start time period having a predetermined duration or more has elapsed after a time point at which the generation of the high frequency power by the magnetron is started; (d) determining whether or not a difference between a power of a progressive wave based on the high frequency power generated by the magnetron and the set power is equal to or lower than a first predetermined value; (e) determining whether or not a power of a reflection wave outputted from a directional coupler provided between the magnetron and a load is equal to or lower than a second predetermined value; (f) determining a life of the magnetron on the basis of a comparison between a current parameter, which indicates a current status of the magnetron and is obtained from the one or more measurement values at a time point when use conditions where the time period having the predetermined duration or more has elapsed after the start time point, the difference between the power of the progressive wave and the set power is equal to or lower than the first predetermined value, and the power of the reflection wave is equal to or lower than the second predetermined value are satisfied, and an initial parameter, which indicates an initial status of the magnetron and corresponds to the current parameter.

The current parameters, e.g., at least one of the high frequency conversion efficiency, the anode voltage, the anode current, and the peak frequency of the progressive wave, obtained from measurement values detected immediately after the generation of the high frequency power by the magnetron are unstable, and become stabilized after a predetermined time period has elapsed. In the above-described method, the life of the magnetron is determined by using the current parameters obtained from the measurement values when the predetermined time period has elapsed after the start time point at which the generation of the high frequency power by the magnetron is started; the power of the progressive wave is substantially equal to the set power; the power of the reflection wave becomes approximately zero (0), i.e., when the use conditions are satisfied, and, thus, it is possible to inspect the magnetron with high accuracy.

In this method, the current parameter may include a current high frequency conversion efficiency of the magnetron, and the high frequency conversion efficiency is a value obtained by dividing a power of a progressive wave included in the one or more measurement values by an input power inputted to the magnetron. Further, in the determining of the life of the magnetron, when the current high frequency conversion efficiency is decreased by a predetermined ratio or more as compared with an initial high frequency conversion efficiency of the magnetron included in the initial parameter, the life of the magnetron is detected.

Further, a correction value for the high frequency conversion efficiency is obtained by subtracting an offset value for the high frequency conversion efficiency at the current time point from the current high frequency conversion efficiency, and if the correction value for the high frequency conversion efficiency is decreased by a predetermined ratio or more as compared with the initial high frequency conversion efficiency of the magnetron included in the initial parameter, the life of the magnetron may be detected. By way of example, the above method may include obtaining a first basic offset value $\eta B_{OFFSET}(T_L)$ as an output of a first function by inputting an elapsed time period $T_L$ from the start time point to the time point when the use conditions are satisfied to the first function, the first function defining a relationship between an elapsed time period $t_4$ from a time point at which a continuous generation of the high frequency power by the magnetron under a predetermined power of the progressive wave is started to a preset time point during the continuous generation of the high frequency power and a first basic offset value $\eta B_{OFFSET}(t_A)$ as an absolute value of a difference between a high frequency conversion efficiency of the magnetron at the preset time point and a convergence value of the high frequency conversion efficiency of the magnetron during the continuous generation of the high frequency power by the magnetron under the predetermined power of the progressive wave; obtaining a coefficient $B_\eta(P_{fm})$ as an output of a second function by inputting a measurement value $P_{fm}$ for the power of the progressive wave at the time point when the use conditions are satisfied to the second function, the second function defining a relationship between a power $P_A$ of the progressive wave and a coefficient $B_\eta(P_A)$ indicating a ratio of a predetermined value as a maximum variation in the high frequency conversion efficiency of the magnetron during the continuous generation of the high frequency power by the magnetron under the power of the progressive wave with respect to a predetermined maximum value of the first basic offset value $\eta B_{OFFSET}(t_A)$; obtaining a coefficient $C_\eta$ by dividing an offset value for the high frequency conversion efficiency of the magnetron obtained during the continuous generation of the high frequency power by the magnetron just before a stop time period during which the magnetron stops the generation of the high frequency power just before the start time point by the predetermined maximum value of the first basic offset value $\eta B_{OFFSET}(t_A)$; obtaining a coefficient $D_\eta(T_S)$ as an output of a third function by inputting the stop time period $T_S$ to the third function, the third function defining a relationship between a stop time period $t_{SA}$ during which the magnetron stops the generation of the high frequency power and a coefficient $D_\eta(t_{SA})$ indicating a ratio of a maximum variation in the high frequency conversion efficiency of the magnetron during the continuous generation of the high frequency power by the magnetron immediately after the magnetron stops the generation of the high frequency power for the stop time period with respect to a maximum variation in the high frequency conversion efficiency of the magnetron during the continuous generation of the high frequency power by the magnetron immediately after the magnetron stops the generation of the high frequency power for a predetermined stop time period; obtaining an offset value $\eta_{OFFSET}$ for the high frequency conversion efficiency of the magnetron by substituting the first basic offset value $\eta B_{OFFSET}(T_L)$, the coefficient $B_\eta(P_{fm})$, the coefficient $C_\eta$, and the coefficient $D_\eta(T_S)$ in an equation (1);

[Numerical expression 1]

$$\left.\begin{array}{l}\eta_{OFFSET} = \eta B_{OFFSET}(T_L) \times B_\eta(P_{fm}) \times \begin{pmatrix} C_\eta + \\ D_\eta(T_S) \end{pmatrix} \quad \text{if } C_\eta + D_\eta(T_S) \leq 1 \\ \eta_{OFFSET} = \eta B_{OFFSET}(T_L) \times B_\eta(P_{fm}) \times 1 \quad \text{if } C_\eta + D_\eta(T_S) > 1\end{array}\right\} \quad (1)$$

and obtaining a correction value $\eta_C$ for the high frequency conversion efficiency by substituting a current high frequency conversion efficiency $\eta_m$ obtained by dividing the power of the progressive wave included in the one or more measurement values at the time point when the use conditions are satisfied by the input power inputted to the magnetron and the offset value $\eta_{OFFSET}$ in an equation (2).

[Numerical expression 2]

$$\eta_C = \eta_m - \eta_{OFFSET} \quad (2)$$

Further the current parameter includes the correction value $\eta_C$ for the high frequency conversion efficiency, and in the determining of the life of the magnetron, when the correction value $\eta_C$ for the high frequency conversion efficiency included in the current parameter is decreased by a predetermined ratio or more as compared with an initial high frequency conversion efficiency of the magnetron included in the initial parameter, the life of the magnetron is detected.

In this method, the current parameter may include an absolute value of a measurement value for an anode voltage of the magnetron, which is included in the one or more measurement values, at the time point when the use conditions are satisfied, as an absolute value of a current anode voltage of the magnetron. Further, in the determining of the life of the magnetron, when the absolute value of the current anode voltage of the magnetron included in the current parameter is increased by a predetermined value or more as compared with an absolute value of an initial anode voltage of the magnetron included in the initial parameter, the life of the magnetron is detected.

Further, a correction value for the absolute value of the anode voltage of the magnetron is obtained by subtracting an offset value for the anode voltage of the magnetron at the current time point from the absolute value of the measurement value for the current anode voltage of the magnetron, and if the correction value for the absolute value of the anode voltage of the magnetron is increased by a predetermined value or more as compared with the absolute value of the initial anode voltage of the magnetron included in the initial parameter, the life of the magnetron may be detected. By way of example, the above method may include obtaining a second basic offset value $VB_{OFFSET}(T_L)$ as an output of a fourth function by inputting an elapsed time period $T_L$ from the start time point to the time point when the use conditions are satisfied to the fourth function, the fourth function defining a relationship between an elapsed time period $t_A$ from a time point at which a continuous generation of the high frequency power by the magnetron under a predetermined power of the progressive wave is started to a preset time point during the continuous generation of the high frequency power and a second basic offset value $VB_{OFFSET}(t_A)$ as an absolute value of a difference between an anode voltage of the magnetron at the preset time point and a convergence value of an anode voltage of the magnetron during the continuous generation of the high frequency power by the magnetron under the predetermined power of the progressive wave; obtaining a coefficient $B_V(P_{fm})$ as an output of a fifth function by inputting a measurement value $P_{fm}$ for the power of the progressive wave at the time point when the use conditions are satisfied to the fifth function, the fifth function defining a relationship between a power $P_A$ of the progressive wave and a coefficient $B_V(P_A)$ indicating a ratio of a predetermined value as a maximum variation in the anode voltage of the magnetron during the continuous generation of the high frequency power by the magnetron under the power $P_A$ of the progressive wave with respect to a predetermined maximum value of the second basic offset value $VB_{OFFSET}(t_A)$; obtaining a coefficient $C_V$ by dividing an offset value for the anode voltage of the magnetron obtained during the continuous generation of the high frequency power by the magnetron just before a stop time period during which the magnetron stops the generation of the high frequency power just before the start time point by the predetermined maximum value of the second basic offset value $VB_{OFFSET}(t_A)$; obtaining a coefficient $D_V(T_S)$ as an output of a sixth function by inputting the stop time period $T_S$ to the sixth function, the sixth function defining a relationship between a stop time period $t_{SA}$ during which the magnetron stops the generation of the high frequency power and a coefficient $D_V(t_{SA})$ indicating a ratio of a maximum variation in the anode voltage of the magnetron during the continuous generation of the high frequency power by the magnetron immediately after the magnetron stops the generation of the high frequency power for the stop time period with respect to a maximum variation in the anode voltage of the magnetron during the continuous generation of the high frequency power by the magnetron immediately after the magnetron stops the generation of the high frequency power for a predetermined stop time period; obtaining an offset value $V_{OFFSET}$ for the anode voltage of the magnetron by substituting the second basic offset value $VB_{OFFSET}(T_L)$, the coefficient $B_V(P_{fm})$, the coefficient $C_V$, and the coefficient $D_V(T_S)$ in an equation (3);

[Numerical expression 3]

$$\left.\begin{array}{l}V_{OFFSET} = VB_{OFFSET}(T_L) \times \begin{pmatrix} B_V(P_{fm}) \times \\ \left( C_V + \dfrac{}{D_V(T_S)} \right) \end{pmatrix} \quad \text{if } C_V + D_V(T_S) \le 1 \\ V_{OFFSET} = VB_{OFFSET}(T_L) \times B_V(P_{fm}) \times 1 \quad \text{if } C_V + D_V(T_S) > 1 \end{array}\right\} \quad (3)$$

and obtaining a correction value $V_C$ for the absolute value of the anode voltage by substituting a measurement value $V_m$ for a current anode voltage of the magnetron included in the one or more measurement values at the time point when the use conditions are satisfied and the offset value $V_{OFFSET}$ in an equation (4).

[Numerical expression 4]

$$V_C = |V_m| - V_{OFFSET} \quad (4)$$

Further in the determining of the life of the magnetron, when the correction value $V_C$ for the absolute value of the anode voltage included in the current parameter is increased by a predetermined value or more as compared with an absolute value of an initial anode voltage of the magnetron included in the initial parameter, the life of the magnetron is detected.

In this method, the current parameter may include a measurement value for an anode current of the magnetron, which is included in the one or more measurement values at the time point when the use conditions are satisfied, as a current anode current of the magnetron. Further in the determining of the life of the magnetron, when the current anode current of the magnetron included in the current parameter is increased by a predetermined value or more as compared with an initial anode current of the magnetron included in the initial parameter, the life of the magnetron is detected.

Further, a correction value for the anode current of the magnetron is obtained by adding the measurement value for the current anode current of the magnetron to an offset value for the anode current of the magnetron at the current time point, and if the correction value for the anode current of the magnetron is increased by a predetermined value or more as compared with the initial anode current of the magnetron included in the initial parameter, the life of the magnetron may be detected. By way of example, the above method may include obtaining a third basic offset value $IB_{OFFSET}(T_L)$ as an output of a seventh function by inputting an elapsed time period $T_L$ from the start time point to the time point when the use conditions are satisfied to the seventh function, the seventh function defining a relationship between an elapsed time period $t_A$ from a time point at which a continuous generation of the high frequency power by the magnetron under a predetermined power of a progressive wave is started to a preset time point during the continuous generation of the high frequency power and a third basic offset value $IB_{OFFSET}(t_A)$ as an absolute value of a difference between an anode current of the magnetron at the preset time point and a convergence value of an anode current of the magnetron during the continuous generation of the high frequency power by the magnetron under the predetermined power of the progressive wave; obtaining a coefficient $B_I(P_{fm})$ as an output of an eighth function by inputting a measurement value $P_{fm}$ for the power of the progressive wave at the time point when the use conditions are satisfied to the eighth function, the eighth function defining a relationship between a power $P_A$ of the progressive wave and a coefficient $B_I(P_A)$ indicating a ratio of a predetermined value as a maximum variation in the anode current of the magnetron during the continuous generation of the high frequency power by the magnetron under the power of the progressive wave with respect to a predetermined maximum value of the third basic offset value $IB_{OFFSET}(t_A)$; obtaining a coefficient $C_I$ by dividing an offset value for an anode current of the magnetron obtained during the continuous generation of the high frequency power by the magnetron just before a stop time period during which the magnetron stops generation of a high frequency power just before the start time point by the predetermined maximum value of the third basic offset value $IB_{OFFSET}(t_A)$; obtaining a coefficient $D_I(T_S)$ as an output of a ninth function by inputting the stop time period $T_S$ to the ninth function, the ninth function defining a relationship between a stop time period $t_{SA}$ during which the magnetron stops the generation of the high frequency power and a coefficient $D_I(t_{SA})$ indicating a ratio of a maximum variation in an anode current of the magnetron during the continuous generation of the high frequency power by the magnetron immediately after the magnetron stops the generation of the high frequency power for the stop time period with respect to a maximum variation in the anode current of the magnetron during the continuous generation of the high frequency power by the magnetron immediately after the magnetron stops generation of the high frequency power for a predetermined stop time period; obtaining an offset value $I_{OFFSET}$ for the anode current of the magnetron by substituting the third basic offset value $IB_{OFFSET}(T_L)$, the coefficient $B_I(P_{fm})$, the coefficient $C_I$, and the coefficient $D_I(T_S)$ in an equation (5);

[Numerical expression 5]

$$\left.\begin{array}{l}I_{OFFSET} = IB_{OFFSET}(T_L) \times B_I(P_{fm}) \times \begin{pmatrix} C_I + \\ \dfrac{}{D_I(T_S)} \end{pmatrix} \quad \text{if } C_I + D_I(T_S) \le 1 \\ I_{OFFSET} = IB_{OFFSET}(T_L) \times B_I(P_{fm}) \times 1 \quad \text{if } C_I + D_I(T_S) > 1 \end{array}\right\} \quad (5)$$

and obtaining a correction value $I_C$ for an anode current by substituting a measurement value $I_m$ for a current anode current of the magnetron included in the one or more measurement values at the time point when the use conditions are satisfied and the offset value $I_{OFFSET}$ in an equation (6).

[Numerical expression 6]

$$I_C = I_m + I_{OFFSET} \quad (6)$$

Further in the determining of the life of the magnetron, when the correction value $I_C$ for the anode current included in the current parameter is increased by a predetermined value or more as compared with an initial anode current of the magnetron included in the initial parameter, the life of the magnetron is detected.

In this method, the current parameter may include a measurement value for a peak frequency of the progressive wave included in the one or more measurement values at the time point when the use conditions are satisfied, as a current peak frequency of the progressive wave. Further in the determining of the life of the magnetron, when the current peak frequency of the progressive wave included in the current parameter is decreased by a predetermined value or more as compared with an initial peak frequency of the progressive wave included in the initial parameter, the life of the magnetron is detected.

Further, a correction value for the peak frequency of the progressive wave is obtained by subtracting an offset value for the peak frequency of the progressive wave at the current time point from the measurement value for the current peak frequency of the progressive wave, and if a difference between the correction value for the peak frequency of the progressive wave and the initial peak frequency of the progressive wave included in the initial parameter is equal to or higher than a predetermined value, the life of the magnetron may be detected. By way of example, the above method may include obtaining a fourth basic offset value $FB_{OFFSET}(T_L)$ as an output of a tenth function by inputting an elapsed time period $T_L$ from the start time point to the time point when the use conditions are satisfied to the tenth function, the tenth function defining a relationship between an elapsed time period $t_A$ from a time point at which a continuous generation of the high frequency power by the magnetron under a predetermined power of a progressive wave is started to a preset time point during the continuous generation of the high frequency power and a fourth basic offset value $FB_{OFFSET}(t_A)$ as an absolute value of a difference between a peak frequency of a progressive wave of the magnetron at the preset time point and a convergence value of the peak frequency of the progressive wave of the magnetron during the continuous generation of the high frequency power by the magnetron under the predetermined power of the progressive wave; obtaining a coefficient $B_F(P_{fm})$ as an output of an eleventh function by inputting a measurement value $P_{fm}$ for the power of the progressive wave at the time point when the use conditions are satisfied to the eleventh function, the eleventh function defining a relationship between a power $P_A$ of the progressive wave and a coefficient $B_F(P_A)$ indicating a ratio of a predetermined value as a maximum variation in the peak frequency of the progressive wave during the continuous generation of the high frequency power by the magnetron under the power $P_A$ of the progressive wave with respect to a predetermined maximum value of the fourth basic offset value $FB_{OFFSET}(t_A)$; obtaining a coefficient $C_F$ by dividing an offset value for the peak frequency of the progressive wave obtained during the continuous generation of the high frequency power by the magnetron just before a stop time period during which the magnetron stops generation of a high frequency power just before the start time point by the predetermined maximum value of the fourth basic offset value; obtaining a coefficient $D_F(T_S)$ as an output of a twelfth function by inputting the stop time period $T_S$ to the twelfth function, the twelfth function defining a relationship between a stop time period $t_{SA}$ during which the magnetron stops the generation of the high frequency power and a coefficient $D_F(t_{SA})$ indicating a ratio of a maximum variation in a peak frequency of the progressive wave during the continuous generation of the high frequency power by the magnetron immediately after the magnetron stops the generation of the high frequency power for the stop time period with respect to a maximum variation in the peak frequency of the progressive wave during the continuous generation of the high frequency power by the magnetron immediately after the magnetron stops generation of the high frequency power for a predetermined stop time period; obtaining an offset value $F_{OFFSET}$ for the peak frequency of the progressive wave by substituting the fourth basic offset value $FB_{OFFSET}(T_L)$, the coefficient $B_F(P_{fm})$, the coefficient $C_F$, and the coefficient $D_F(T_S)$ in an equation (7);

[Numerical Expression 7]

$$\begin{aligned} F_{OFFSET} &= FB_{OFFSET}(T_L) \times B_F(P_{fm}) \times & \text{if } C_F + D_F(T_S) \leq 1 \\ & (C_F + D_F(T_S)) \\ F_{OFFSET} &= FB_{OFFSET}(T_L) \times B_F(P_{fm}) \times 1 & \text{if } C_F + D_F(T_S) > 1 \end{aligned} \quad (7)$$

and obtaining a correction value $F_C$ for a peak frequency of the progressive wave by substituting a measurement value $F_m$ for the peak frequency of the progressive wave included in the one or more measurement values at the time point when the use conditions are satisfied and the offset value $F_{OFFSET}$ in an equation (8).

[Numerical expression 8]

$$F_C = F_m - F_{OFFSET} \quad (8)$$

Further in the determining of the life of the magnetron, when the correction value $F_C$ for the peak frequency of the progressive wave included in the current parameter is decreased by a predetermined value or more as compared with an initial peak frequency of the progressive wave included in the initial parameter, the life of the magnetron is detected.

Further, the life of the magnetron may be determined by using two or more parameters of the high frequency conversion efficiency, the anode voltage, the anode current, the peak frequency, and the correction values thereof.

The above method may further include predicting a current remaining time period to the life of the magnetron.

In the predicting of the remaining time period, a current use time period of the magnetron corresponding to the current high frequency conversion efficiency is obtained by referring to data in which the use time period of the magnetron is corresponded to the high frequency conversion efficiency of the magnetron, and a difference between a predetermined life of the magnetron and the current use time period of the magnetron may be obtained as the remaining time period.

Further, In the predicting of the remaining time period, a constant A is calculated by substituting a current use time period $t_c$ of the magnetron, the initial high frequency conversion efficiency $\eta_{ic}$, and the current high frequency conversion efficiency $\eta_m$ in an equation (9),

[Numerical expression 9]

$$t_c = \frac{1}{A} \log_e \frac{\eta_m}{\eta_{ic}} \quad (9)$$

a life $t_d$ is obtained by substituting a high frequency conversion efficiency $\eta_d$ when a predetermined life of the magnetron is ended, the calculated constant A, and the initial high frequency conversion efficiency $\eta_{ic}$ in an equation (10), and

[Numerical expression 10]

$$t_d = \frac{1}{A}\log_e\frac{\eta_d}{\eta_{ic}} \qquad (10)$$

a difference between the calculated life $t_d$ and the current use time period $t_c$ may be obtained as the remaining time period. The magnetron has a machine difference. However, in this case, the constant A that reflects the machine difference is calculated and the remaining time period is calculated on the basis of the calculated constant A, and, thus, the remaining time period can be obtained with higher accuracy.

As described above, it is possible to inspect the magnetron with high accuracy.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 7 is a diagram illustrating initial parameters stored in a memory;

DETAILED DESCRIPTION

Figure 1:
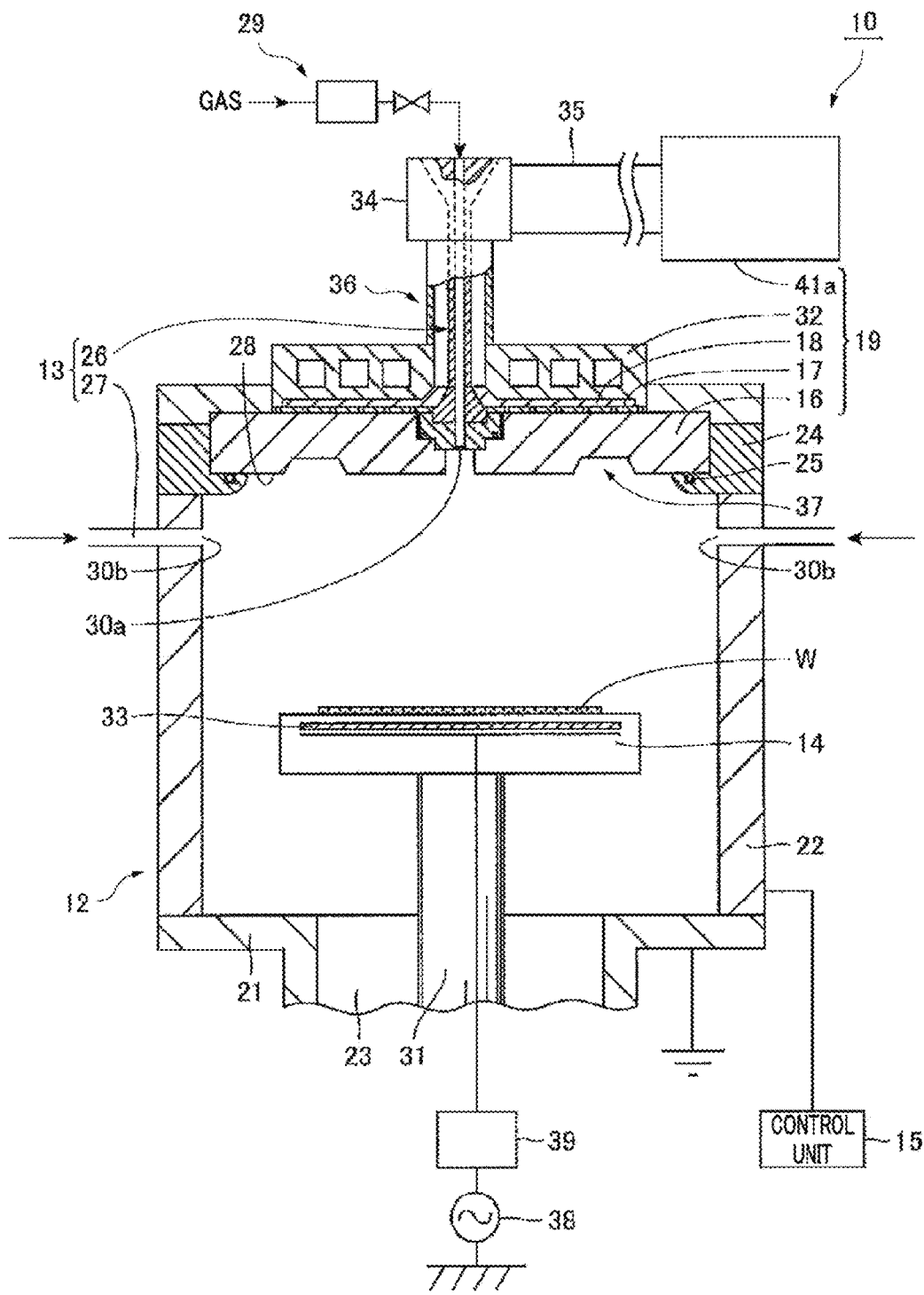
FIG. 1 is a schematic diagram illustrating an example of a plasma processing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

An example of a plasma processing apparatus including a magnetron to be inspected by a method according to an exemplary embodiment will be described. FIG. 1 is a schematic diagram illustrating an example of a plasma processing apparatus. A plasma processing apparatus 10 illustrated in FIG. 1 is configured to perform a plasma process on a target object W. Examples of the plasma process to be performed in the plasma processing apparatus 10 may include the etching process and the CVD.

The plasma processing apparatus 10 includes a processing vessel 12, a gas supply unit 13, a mounting table 14, a plasma generation device 19, and a control unit 15. In the processing vessel 12, there is formed an inner space in which a plasma process is performed on the target object W. The gas supply unit 13 is configured to supply a processing gas for the plasma process into the processing vessel 12. The mounting table 14 is configured to hold the target object W thereon. The plasma generation device 19 is configured to generate plasma within the processing vessel 12. Further, the control unit 15 is configured to control the overall operations of the plasma processing apparatus 10. The control unit 15 controls operations of the plasma processing apparatus 10 including a flow rate of a gas supplied from the gas supply unit 13, a pressure within the processing vessel 12, and the like.

The processing vessel 12 includes a bottom portion 21 and a sidewall 22. The bottom portion 21 is located under the mounting table 14. The sidewall 22 has a substantially cylindrical shape and is extended upwards from an edge of the bottom portion 21. A gas exhaust hole 23 for gas exhaust is formed through a part of the bottom portion 21 of the processing vessel 12.

A cover member 24, a dielectric window 16, and an O-ring 25 are provided at an upper portion of the processing vessel 12. The cover member 24 is provided on the upper portion of the processing vessel 12, and the O-ring 25 is interposed between the cover member 24 and the dielectric window 16. An opening is formed at the upper portion of the processing vessel 12, and the opening is closed to be airtightly sealed by the cover member 24, the dielectric window 16, and the O-ring 25.

The gas supply unit 13 includes a first gas supply unit 26 and a second gas supply unit 27. The first gas supply unit 26 is configured to supply a gas toward a central portion of the target object W through a first flow path. The second gas supply unit 27 is configured to supply a gas through a second flow path provided above and outside the target object W. The first flow path of the first gas supply unit 26 communicates with a gas supply hole 30a. The gas supply hole 30a is formed at a central portion of the dielectric window 16 in a diametrical direction thereof. The first gas supply unit 26 is connected to a gas supply system 29. The gas supply system 29 is configured to control a flow rate of the gas supplied to the first gas supply unit 26. The second gas supply unit 27 includes multiple gas supply holes 30b. These gas supply holes 30b are formed at positions of an upper portion of the sidewall 22. Further, the multiple gas supply holes 30b are arranged at a regular distance therebetween in a circumferential direction. The same kind of gas may be supplied to the first gas supply unit 26 and the second gas supply unit 27 from the same gas source. Otherwise, different kinds of gases may be supplied to the first gas supply unit 26 and the second gas supply unit 27.

The mounting table 14 includes a lower electrode. The lower electrode is electrically connected to a high frequency power supply 38 for high frequency bias via a matching unit 39. The high frequency power supply 38 is configured to output a high frequency power of, for example, 13.56 MHz having a predetermined power (bias power). The matching unit 39 includes a matching device configured to match an impedance at the side of the high frequency power supply 38 and an impedance at a load side mainly such as an electrode, plasma, and the processing vessel 12. Within the matching device of the matching unit 39, a blocking capacitor for generating a self-bias is included. Further, during a plasma process, a bias voltage may be applied to the mounting table 14 when necessary.

Further, the mounting table 14 further includes an electrostatic chuck, and the target object W may be held thereon. Furthermore, the mounting table 14 may include a temperature control device 33 such as a heater for heating. The mounting table 14 is supported on an insulating cylindrical supporting member 31 uprightly extended from below the bottom portion 21. The gas exhaust hole 23 is formed through a central portion of the bottom portion 21 of the processing vessel 12, and the cylindrical supporting member 31 penetrates the gas exhaust hole 23. Therefore, the gas exhaust hole 23 has an annular shape. The annular gas exhaust hole 23 is connected via a gas exhaust line to a gas exhaust device provided under the gas exhaust hole 23. The gas exhaust device includes a vacuum pump such as a turbo molecular pump. The inside of the processing vessel 12 can be depressurized to a predetermined pressure by the gas exhaust device.

The plasma generation device 19 is provided outside of the processing vessel 12. The plasma generation device 19 includes a microwave generator 41a. The microwave generator 41a is configured to generate a microwave as a high frequency power for plasma generation. Further, the plasma generation device 19 includes the dielectric window 16. The dielectric window 16 is arranged at the upper portion of the processing vessel 12 to face the mounting table 14. The dielectric window 16 is configured to introduce the microwave from the microwave generator 41a into the processing vessel 12.

Further, the plasma generation device 19 includes an antenna 17. The antenna 17 is provided on the dielectric window 16. The antenna 17 includes multiple slot holes configured to radiate the microwave to the dielectric window 16. Furthermore, the plasma generation device 19 includes a dielectric plate 18. The dielectric plate 18 is arranged on the antenna 17. The dielectric plate 18 is configured to propagate the microwave, which is introduced through a coaxial waveguide 36 to be described later, in a diametrical direction thereof. Further, the dielectric plate 18 has a function of delaying the microwave.

The microwave generator 41a is connected to an upper portion of the coaxial waveguide 36 via a mode converter 34 and a rectangular waveguide 35. By way of example, a TE mode of the microwave generated by the microwave generator 41a passes through the rectangular waveguide 35, and then, is converted into a TEM mode by the mode converter 34. The microwave in the TEM mode from the mode converter 34 is propagated in the coaxial waveguide 36. A detailed configuration of the microwave generator 41a will be described later. Further, a side at which the rectangular waveguide 35 is located with respect to the microwave generator 41a is a side of a load to be described later.

The dielectric window 16 has a substantially circular plate shape and is made of a dielectric material such as quartz or alumina. An annular recess 37 recessed in a tapered shape or recessed in a circular shape is formed in a part of a bottom surface 28 of the dielectric window 16 in order to easily generate a standing wave by the introduced microwave. By providing the recess 37, it is possible to efficiently generate plasma directly under the dielectric window 16.

Figure 2:
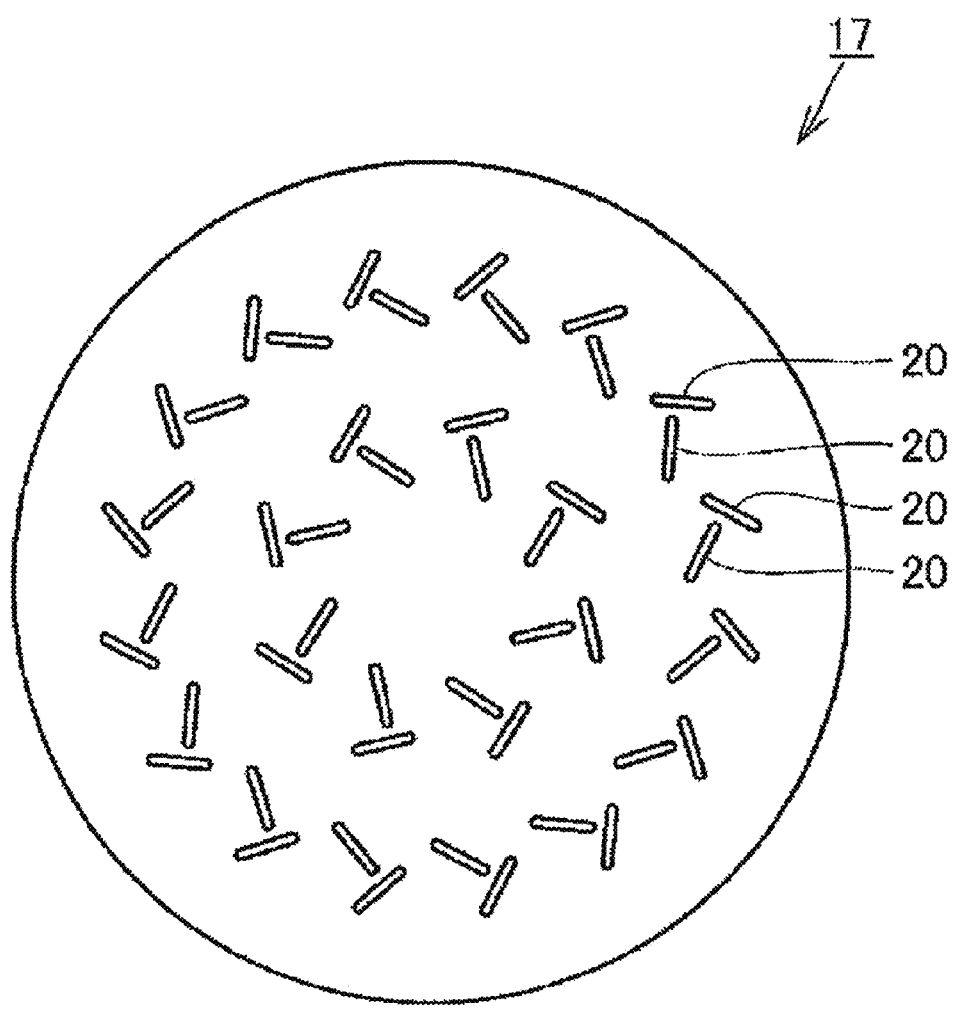
FIG. 2 is a plan view illustrating an antenna of the plasma processing apparatus illustrated in FIG. 1.

The antenna 17 has a thin circular plate shape. FIG. 2 is a plan view illustrating an antenna of the plasma processing apparatus illustrated in FIG. 1. As depicted in FIG. 2, the antenna 17 includes multiple slot holes 20. Each of the multiple slot holes 20 has a long hole shape. The multiple slot holes 20 are provided to be multiple slot pairs. Each of the multiple slot pairs includes two slot holes extended in directions orthogonal to or crossing each other. These multiple slot pairs are arranged along one or more concentric circles.

The microwave generated by the microwave generator 41a is propagated to the dielectric plate 18 through the coaxial waveguide 36. Further, the microwave is propagated radially outwards within the dielectric plate 18 between the antenna 17 and a cooling jacket 32, and then radiated to the dielectric window 16 from the multiple slot holes 20 of the antenna 17. The microwave transmitted through the dielectric window 16 generates an electric field directly under the dielectric window 16. Thus, plasma is generated within the processing vessel 12.

Figure 3:
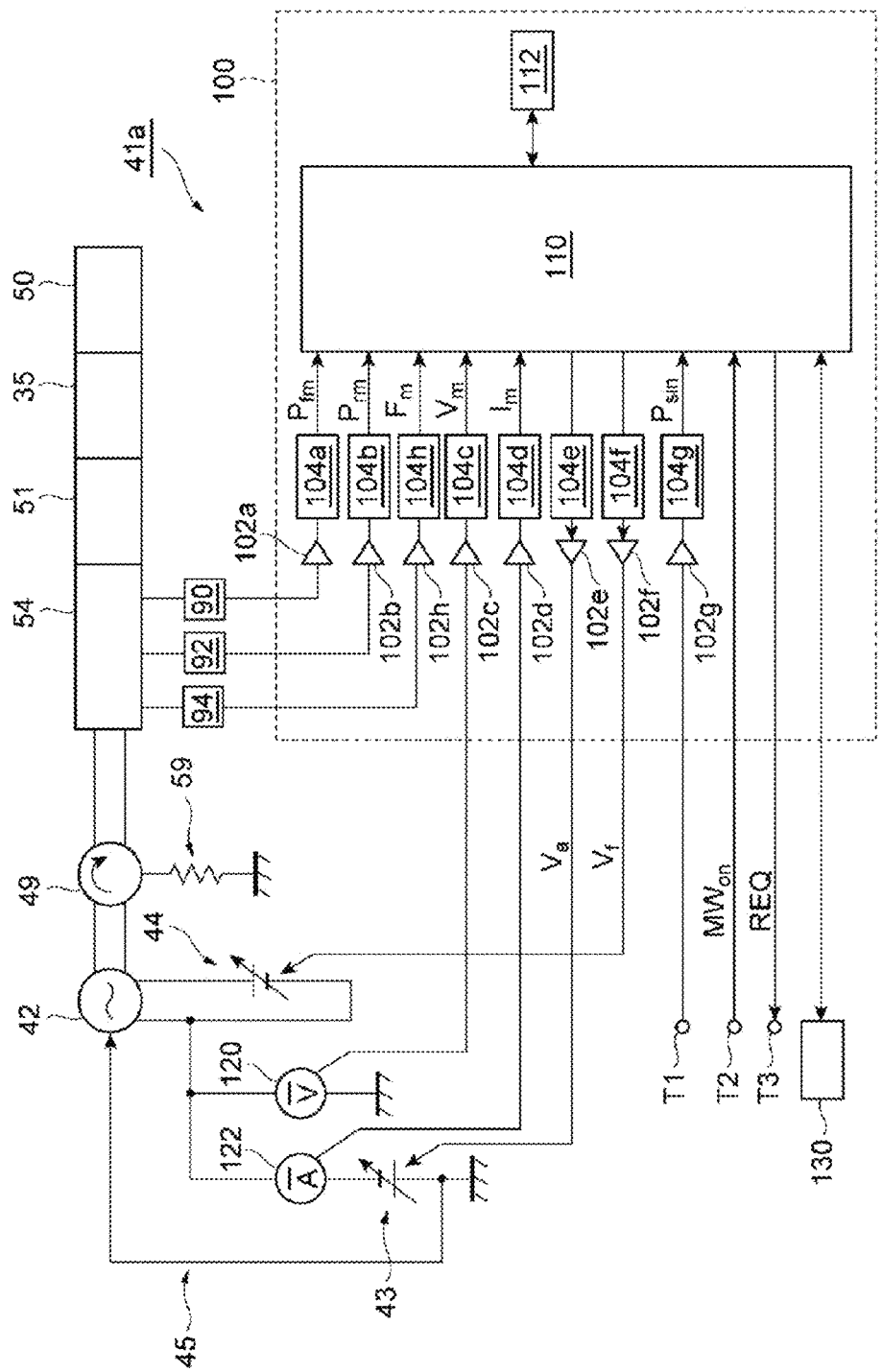
FIG. 3 is a diagram illustrating a configuration of a microwave generator.
Figure 4:
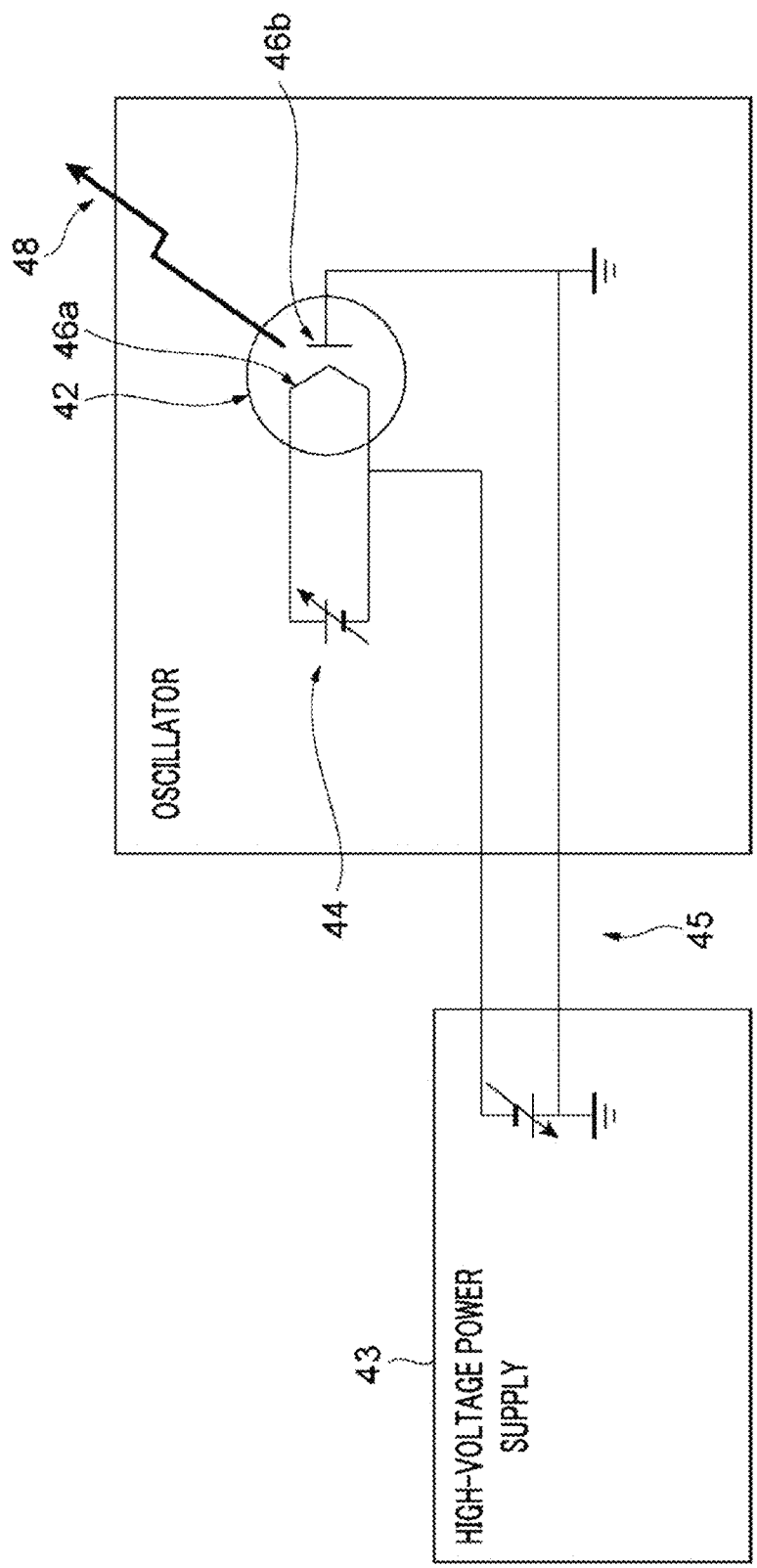
FIG. 4 is a diagram illustrating a magnetron of the microwave generator illustrated in FIG. 3.
Figure 5:
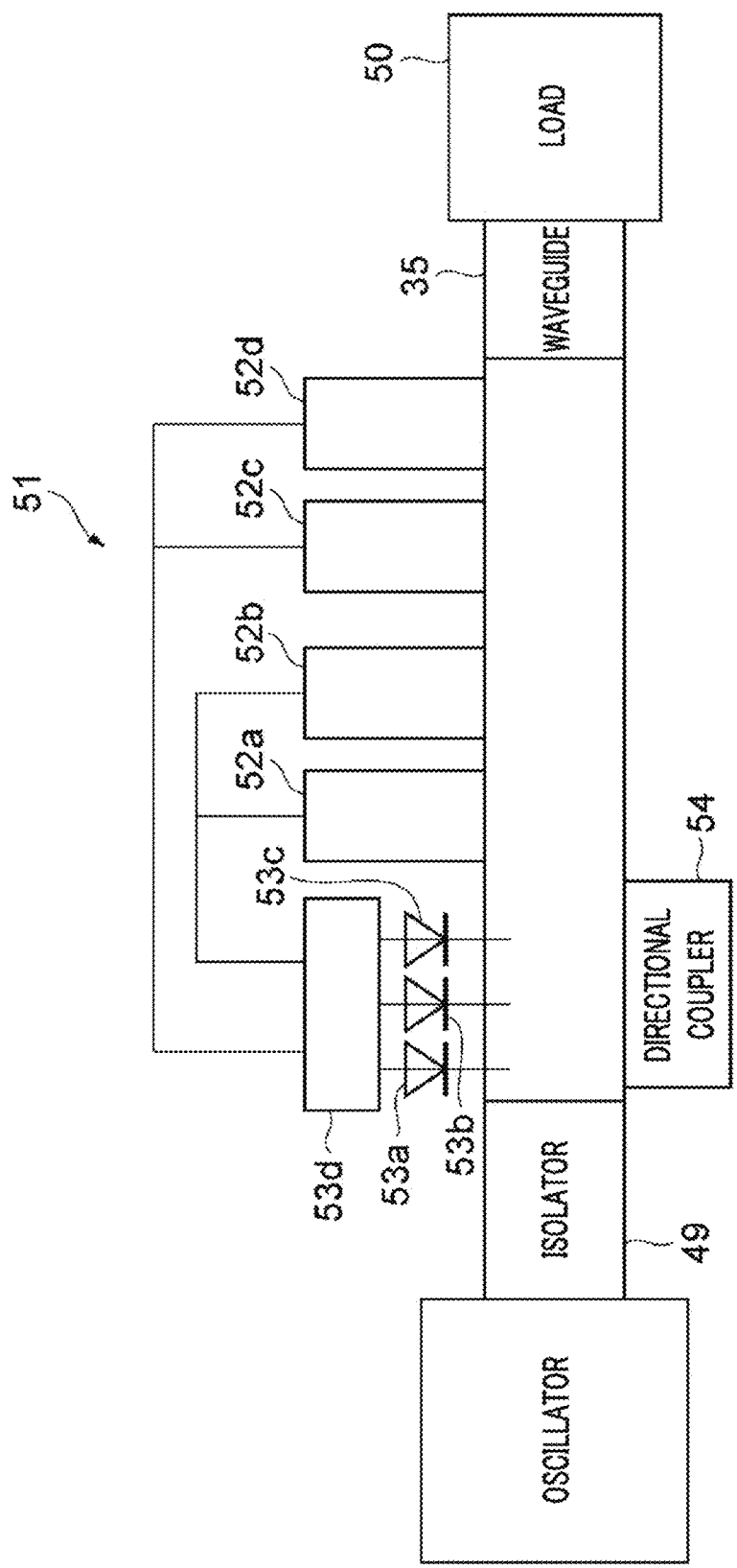
FIG. 5 is a diagram illustrating a configuration of a 4E tuner of the microwave generator illustrated in FIG. 3.

Hereinafter, a configuration of the microwave generator 41*a* will be described in detail. FIG. 3 is a diagram illustrating a configuration of the microwave generator. FIG. 4 is a diagram illustrating the magnetron of the microwave generator illustrated in FIG. 3. FIG. 5 is a diagram illustrating a configuration of a 4E tuner of the microwave generator illustrated in FIG. 3.

As illustrated in FIG. 3, the microwave generator 41*a* includes a magnetron 42, a high-voltage power supply 43, and a filament power supply 44. The magnetron 42 serves as a high frequency oscillator configured to generate a microwave as a high frequency wave. The high-voltage power supply 43 is configured to supply a voltage to the magnetron 42. Further, the filament power supply 44 is configured to supply a power to a filament constituting a cathode electrode 46*a* of the magnetron 42.

A circuit 45 is provided between the magnetron 42 and the high-voltage power supply 43. In the microwave generator 41*a*, an anode current is supplied from the side of the high-voltage power supply 43 to the side of the magnetron 42 through the circuit 45. As illustrated in FIG. 4, the filament is provided on the circuit 45 within the magnetron 42. The filament constitutes the cathode electrode 46*a*. The cathode electrode 46*a* is connected to the cathode side of the high-voltage power supply 43. Further, an anode electrode 46*b* provided within the magnetron 42 is connected to the anode side of the high-voltage power supply 43. The anode side of the high-voltage power supply 43, i.e., the anode electrode 46*b* is grounded. Therefore, an anode voltage to be described later is measured as a negative value.

The magnetron 42 is configured to generate a microwave 48 by the anode electrode 46*b* and the cathode electrode 46*a* by applying the anode current from the high-voltage power supply 43 to the anode electrode 46*b*. Further, the filament constituting the cathode electrode 46*a* and an anode vane constituting the anode electrode 46*b* are machined components manufactured by machining.

Further, as illustrated in FIG. 3, the microwave generator 41*a* further includes an isolator 49, a directional coupler 54, and a 4E tuner 51 as a matching device. The directional coupler 54 is connected to the magnetron 42 via the isolator 49. The isolator 49 is provided to use one of ports of a circulator serving as a passive device as a dummy load 59. That is, a first port of the isolator 49 at the side of the magnetron 42 is connected to an oscillator (see FIG. 5) including the magnetron 42, a second port of the isolator 49 at the side of the 4E tuner 51 is connected to the 4E tuner 51, and a third port of the isolator 49 is connected to the dummy load 59. Thus, the isolator 49 can transmit a high frequency signal in one direction from the magnetron 42 to the side of the load 50.

As illustrated in FIG. 5, the 4E tuner 51 includes movable short-circuit units 52*a*, 52*b*, 52*c*, and 52*d*. Each of the movable short-circuit units 52*a*, 52*b*, 52*c*, and 52*d* includes a movable short-circuit plate. The movable short-circuit plates are arranged at intervals in the propagating direction of the microwave. Further, the 4E tuner 51 includes three probes 53*a*, 53*b*, and 53*c*. The probes 53*a*, 53*b*, and 53*c* are arranged at the side of the magnetron 42 with respect to the movable short-circuit unit 52*a*. The probes 53*a*, 53*b*, and 53*c* are spaced apart from each other at a distance of ⅛ of a basic frequency (λ), i.e., at a distance of λ/8, in the propagating direction of the microwave. Further, by an operation circuit 53*d* connected to the probes 53*a*, 53*b*, and 53*c*, protrusion amounts of tuning rods respectively corresponding to the probes 53*a* to 53*c* are calculated.

The 4E tuner 51 is connected to the load 50 via the rectangular waveguide 35. Further, the load 50 includes a member, such as the mode converter 34, which is located at the downstream side with respect to the rectangular waveguide 35. Further, the directional coupler 54 is arranged at the side of the magnetron 42 with respect to the movable short-circuit unit 52*a* of the 4E tuner 51. The directional coupler 54 is a bi-directional coupler. Further, the directional coupler 54 may be positioned to face or not to face the probes 53*a*, 53*b*, and 53*c*.

As illustrated in FIG. 3, the directional coupler 54 is connected to a detector 90 and a detector 92. The detector 90 is configured to detect a power of a progressive wave, i.e., a microwave propagating from the side of the magnetron 42 to the side of the load 50. The detector 90 is configured to output an analog signal corresponding to the detected power of the progressive wave. The analog signal from the detector 90 is converted into a digital value, i.e., a measurement value $P_{fm}$ for the power of the progressive wave, through an amplifier 102*a* and an A/D converter 104*a* of a control circuit 100. The measurement value $P_{fm}$ for the power of the progressive wave is inputted to a processor 110. Further, the detector 92 is configured to detect a power of a reflection wave, i.e., a microwave propagating from the side of the load 50 to the side of the magnetron 42. The detector 92 is configured to output an analog signal corresponding to the detected power of the reflection wave. The analog signal from the detector 92 is converted into a digital value, i.e., a measurement value $P_{rm}$ for the power of the reflection wave, through an amplifier 102*b* and an A/D converter 104*b* of the control circuit 100. The measurement value $P_{rm}$ for the power of the reflection wave is inputted to the processor 110.

The processor 110 of the control circuit 100 is connected to a terminal T1 via an amplifier 102*g* and an A/D converter 104*g*. An analog signal corresponding to a set power is inputted to the terminal t1. The analog signal from the terminal t1 is converted into a digital value, i.e., a set power $P_{sin}$, through the amplifier 102*g* and the A/D converter 104*g*. Further, the set power $P_{sin}$ represents a power of the microwave to be supplied to the load 50. The processor 110 is configured to control the high-voltage power supply 43 and the filament power supply 44 to match a power of the progressive wave from the microwave generator 41*a* to the set power $P_{sin}$ on the basis of the set power $P_{sin}$, the measurement value $P_{fm}$ for the power of the progressive wave, and the measurement value $P_{rm}$ for the power of the reflection wave. To be specific, the processor 110 is configured to output a control signal (digital signal) to control a voltage of the high-voltage power supply 43. The control signal is converted into an analog control signal by a D/A converter 104*e* and then amplified by an amplifier 102*e*. The analog control signal $V_a$ amplified by the amplifier 102*e* is given to the high-voltage power supply 43, and, thus, the high-voltage power supply 43 is controlled. Further, the processor 110 is configured to output a control signal (digital signal) to control a voltage of the filament power supply 44. The control signal is converted into an analog control signal by a D/A converter 104*f* and then amplified by an amplifier 102*f*. The analog control signal $V_f$ amplified by the amplifier 102*f* is given to the filament power supply 44, and, thus, filament power supply 44 is controlled.

Further, the control circuit 110 further includes an amplifier 102*c*, an amplifier 102*d*, an amplifier 102*h*, an A/D converter 104c, an A/D converter 104d, an A/D converter 104h, and a memory 112 in addition to the processor 110, the amplifier 102a, the amplifier 102b, the amplifier 102e, the amplifier 102f, the amplifier 102g, the A/D converter 104a, the A/D converter 104b, the D/A converter 104e, the D/A converter 104f, and the A/D converter 104g.

The processor 110 is connected to a voltage monitor 120 via the amplifier 102c and the A/D converter 104c. The voltage monitor 120 is configured to measure an anode voltage of the magnetron 42 and output an analog signal corresponding to the anode voltage. The analog signal is converted into a digital value, i.e., a measurement value $V_m$ for the anode voltage, through the amplifier 102c and the A/D converter 104c. The measurement value $V_m$ for the anode voltage is inputted to the processor 110.

The processor 110 is connected to a current monitor 122 via the amplifier 102d and the A/D converter 104d. The current monitor 122 is configured to measure an anode current and output an analog signal corresponding to the anode current. The analog signal is converted into a digital value, i.e., a measurement value $I_m$ for the anode current, through the amplifier 102d and the A/D converter 104d. The measurement value $I_m$ for the anode current is inputted to the processor 110.

Further, the processor 110 is connected to a frequency detector 94 via the amplifier 102h and the A/D converter 104h. The frequency detector 94 is connected to the directional coupler 54 and configured to detect a peak frequency of a progressive wave and output an analog signal corresponding to the peak frequency. The analog signal is converted into a digital signal through the amplifier 102h and the A/D converter 104h. The digital signal is inputted as a measurement value $F_m$ for the peak frequency of the progressive wave to the processor 110.

Furthermore, the processor 110 is connected to a terminal t2 and a terminal t3. An operation signal $MW_{on}$ for operating the magnetron 42 is supplied to the terminal t2. The processor 110 is configured to control the high-voltage power supply 43 and the filament power supply 44 in response to the operation signal $MW_{on}$ to generate a microwave from the magnetron 42. Further, in the following description, when the operation signal $MW_{on}$ is "1", the magnetron 42 is operated to generate a microwave, and when the operation signal $MW_{on}$ is "0", the generation of the microwave by the magnetron 42 is stopped. The operation signal $MW_{on}$ is set to "1" during a period in which the magnetron 42 generates a microwave.

Moreover, if it is determined that a life of the magnetron 42 is ended by a process to be described later, the processor 110 outputs a replacement request signal REQ to the terminal t3. The terminal t3 may be connected to an alarm device. If the alarm device receives the replacement request signal, the alarm device generates an alarm in order to urge an operator of the plasma processing apparatus 10 to replace the magnetron 42. The alarm may be a voice alarm or may be displayed on a display.

Further, the processor 110 is connected to an external computer device 130. The external computer device 130 and the processor 110 are bi-directionally connected to each other. The external computer device 130 can read data in the memory 112 connected to the processor 110, via the processor 110, and can also store data to the memory 112 through the processor 110 by receiving the data from the external computer device 130.

Furthermore, the processor 110 may perform a process for inspecting the magnetron 42. The inspecting of the magnetron 42 includes determining a life of the magnetron 42.

Further, in an exemplary embodiment, the inspecting of the magnetron 42 includes predicting a remaining time period to the life of the magnetron 42. The processor 110 is operated according to a program stored in a memory outside or inside the processor 110 in order to perform the process for inspecting the magnetron 42.

Figure 6:
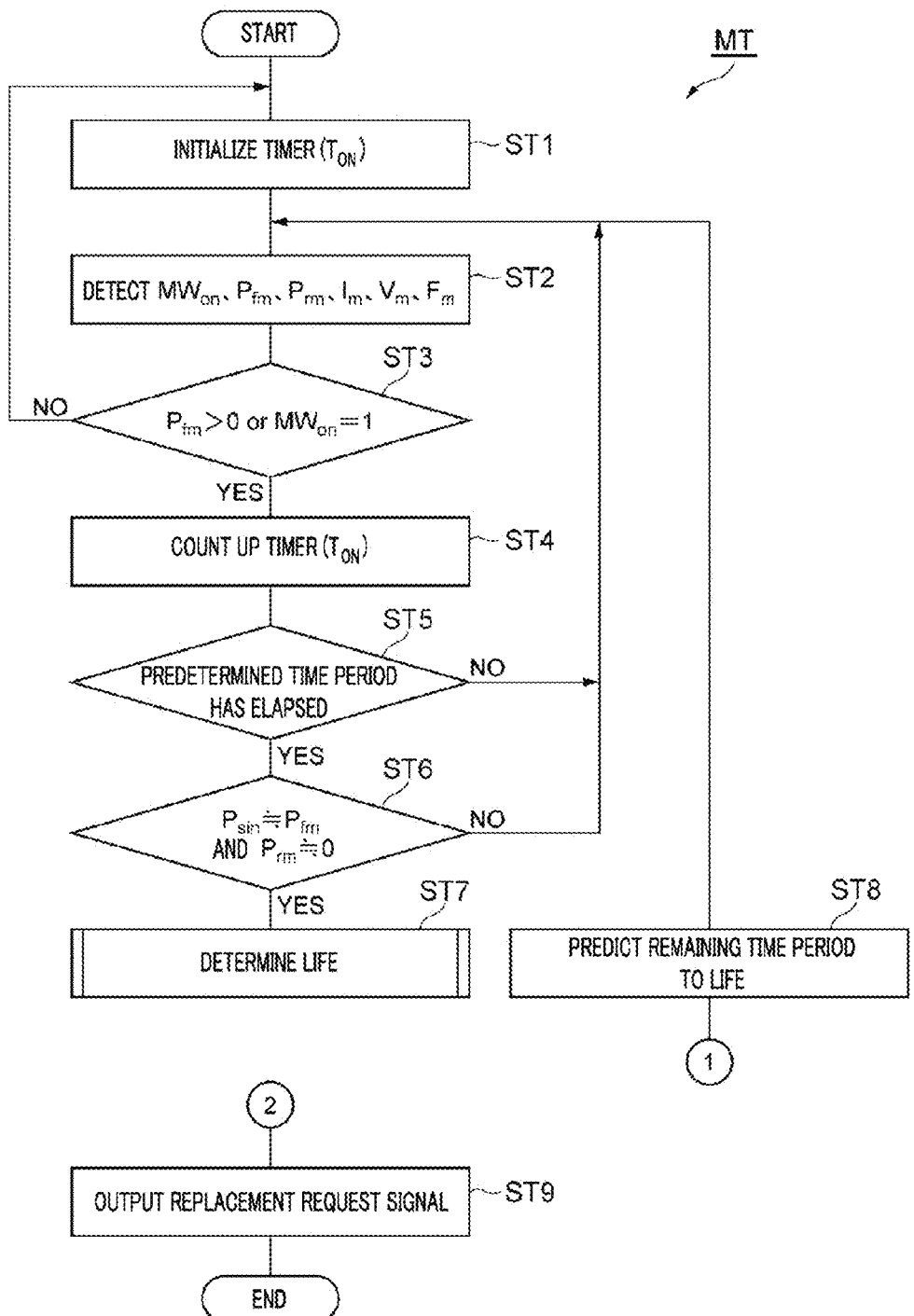
FIG. 6 is a flowchart showing a method for inspecting the magnetron in accordance with an exemplary embodiment.

Hereinafter, a process for inspecting the magnetron 42 by the processor 110 will be described, and also, a method for inspecting a magnetron in accordance with the exemplary embodiment will be described. FIG. 6 is a flowchart showing a method for inspecting a magnetron in accordance with the exemplary embodiment. In a method MT illustrated in FIG. 6, initial parameters indicating an initial status of the magnetron 42 is used. Therefore, before the method MT is performed, the initial parameters are stored in the memory 112.

The initial parameters may be supplied as data indicating initial specifications from a manufacturer of the magnetron 42 or the operator of the plasma processing apparatus 10, and then stored in the memory 112. When the initial parameters are stored in the memory 112, the initial parameter may be transmitted from the external computer device 130 to the memory 112 through the processor 110. Otherwise, the initial parameters may be obtained from a measurement value for specifying a status of the magnetron 42, which is actually measured immediately after the magnetron 42 is mounted on the plasma processing apparatus 10, and then stored in the memory 112. In this case, in the same manner as the following case where a current parameter of the magnetron 42 is obtained, the initial parameters are obtained from measurement values measured when a time period having a predetermined duration or more has elapsed after a start time point at which the generation of the high frequency power by the magnetron 42 is started; the power of the progressive wave is substantially equal to the set power; and the power of the reflection wave becomes approximately zero (0), i.e., when use conditions are satisfied. Further, when the initial parameter obtained from the measurement values are stored in the memory 112, the initial parameters are sent to the memory 112 from the processor 110.

FIG. 7 is a diagram illustrating initial parameters stored in the memory. As illustrated in FIG. 7, the initial parameters of a table form may be stored in the memory 112. A set power $P_{set}$ is shown in a first left column in FIG. 7. Since the initial parameters depend on a magnitude of the set power $P_{set}$, the initial parameters are stored corresponding to N number of set powers $P_{set}(1)$ to $P_{set}(N)$ having various values. In the example illustrated in FIG. 7, initial anode currents $I_i(1)$ to $I_i(N)$, absolute values $V_i(1)$ to $V_i(N)$ of initial anode voltages, initial high frequency conversion efficiencies $\eta_i(1)$ to $\eta_i(N)$, and initial peak frequencies $F_i(1)$ to $F_i(N)$ are stored corresponding to the set powers $P_{set}(1)$ to $P_{set}(N)$, respectively. Further, the initial high frequency conversion efficiency is defined as a value obtained by dividing an initial power of a progressive wave by an absolute value of the product of the initial anode current and the initial anode voltage.

Referring to FIG. 6 again, the method MT is performed after the above-described initial parameters are stored in the memory 112. In the method MT, the operation signal $MW_{on}$ is inputted to the processor 110 via the terminal t2 and the set power $P_{sin}$ is inputted thereto via the terminal t1, current parameters indicating a current status of the magnetron 42 are obtained from measurement values when a time period having a predetermined duration has elapsed after the start time point at which the generation of the high frequency power, i.e., a microwave, by the magnetron 42 is started.

Figure 8:
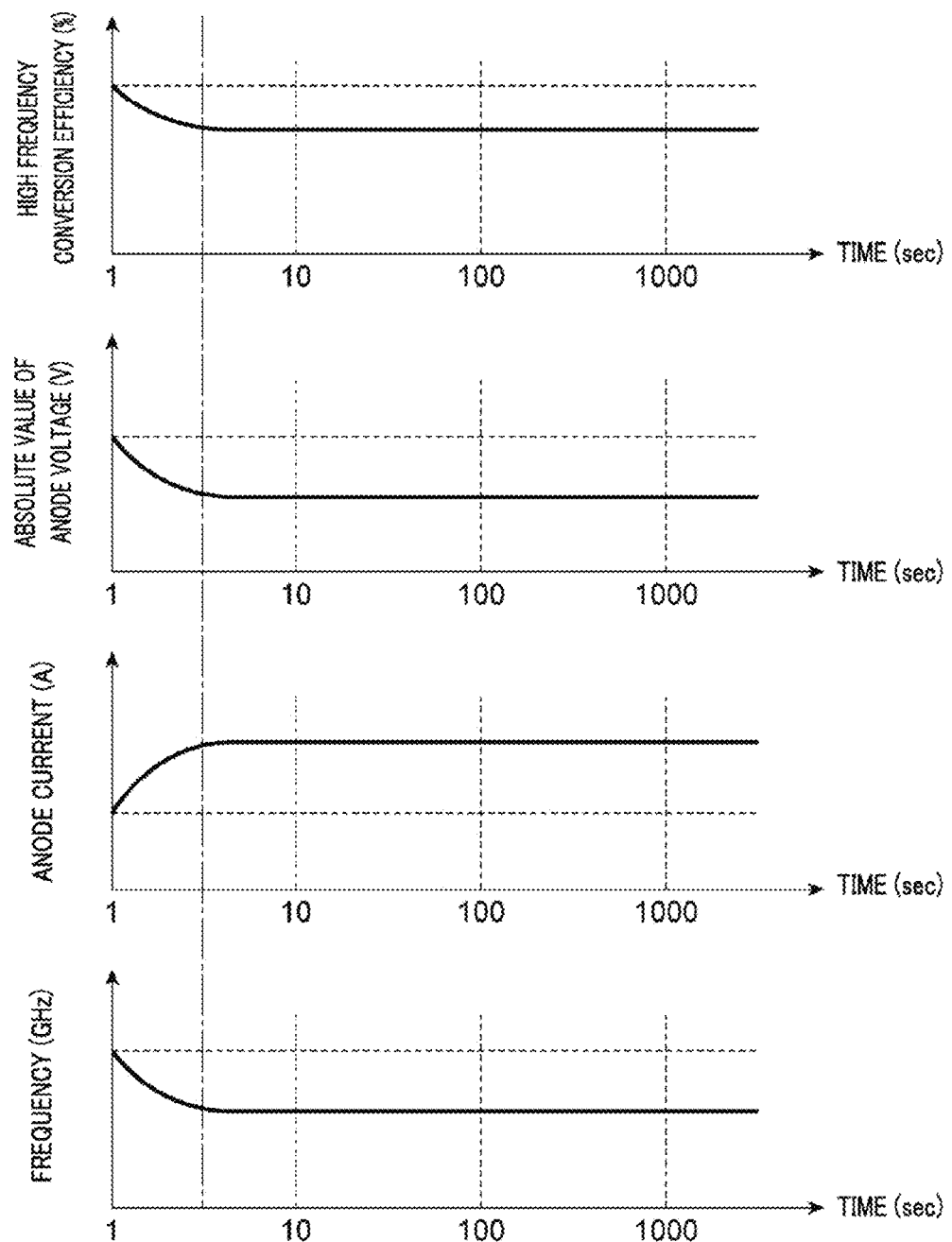
FIG. 8 is a diagram illustrating changes in high frequency conversion efficiency, an absolute value of an anode voltage, an anode current, and a peak frequency of a progressive wave with the lapse of time.

Herein, referring to FIG. 8, FIG. 8 is a diagram illustrating changes in the high frequency conversion efficiency, the absolute value of the anode voltage, the anode current, and the peak frequency of the progressive wave with the lapse of time. The high frequency conversion efficiency, the absolute value of the anode voltage, the anode current, and the peak frequency of the progressive wave (i.e., frequency in the lowest graph) shown in FIG. 8 are examples of the current parameters indicating the current status of the magnetron 42. As illustrated in FIG. 8, the high frequency conversion efficiency, the absolute value of the anode voltage, the anode current, and the peak frequency of the progressive wave have unstable values during a time period immediately after the generation of the microwave by the magnetron 42 is started. To be specific, during a time period in which the magnetron 42 continuously generates the high frequency power, the high frequency conversion efficiency, the absolute value of the anode voltage, and the peak frequency of the progressive wave gradually decrease to reach convergence values thereof, respectively, and the anode current gradually increases to reach convergence value thereof. Therefore, if the current parameters obtained immediately after the generation of the microwave by the magnetron 42 is started are used, it is difficult to accurately inspect the magnetron 42. Meanwhile, as illustrated in FIG. 8, the high frequency conversion efficiency, the absolute value of the anode voltage, the anode current, and the peak frequency of the progressive wave have stable values when a time period having a predetermined duration (for example, 10 seconds) has elapsed after a time point at which the continuous generation of the microwave by the magnetron 42 is started. Therefore, by using the current parameters obtained when the time period having the predetermined duration has elapsed after the generation of the microwave by the magnetron 42 is started, it is possible to inspect the magnetron 42 with high accuracy.

For this reason, in the method MT, it is necessary to measure an elapsed time from a time point when the input of the operation signal $MW_{on}$ having a value "1" is started. Therefore, in the exemplary embodiment, a timer $T_{ON}$ is used, and the timer is initialized by the processor 110 in a process ST1.

In a subsequent process ST2, the operation signal $MW_{on}$, the measurement value $P_{fm}$ for the power of the progressive wave, the measurement value $P_{rm}$ for the power of the reflection wave, the measurement value $I_m$ for the anode current, the measurement value $V_m$ for the anode voltage, and the measurement value $F_m$ for the peak frequency of the progressive wave are detected by the processor 110.

In a subsequent process ST3, the processor 110 determines whether or not the measurement value $P_{fm}$ for the power of the progressive wave detected in the process ST2 is higher than 0 and whether or not the operation signal $MW_{on}$ is "1". That is, the processor 110 determines whether or not the generation of the high frequency power by the magnetron 42 is started. In the process ST3, if it is determined that the measurement value $P_{fm}$ for the power of the progressive wave is equal to or lower than 0 and the operation signal $MW_{on}$ is "0", since the generation of the high frequency power by the magnetron 42 is not started, the process ST1 is repeated. Meanwhile, in the process ST3, if it is determined that the measurement value $P_{fm}$ for the power of the progressive wave is higher than 0 or the operation signal $MW_{on}$ is "1", since the generation of the high frequency power by the magnetron 42 is started, the timer $T_{ON}$ is counted up by the processor 110 in a subsequent process ST4.

In a subsequent process ST5, the processor 110 determines whether or not the time point for detecting the measurement values in the latest process ST2 is a time point when a time period having a predetermined duration or more has elapsed after the start time point at which the generation of the high frequency power by the magnetron 42 is started. To be specific, if a count value of the timer $T_{ON}$ is lower than a predetermined value, it is determined that the time point for detecting the measurement values in the latest process ST2 is not the time point when the time period having the predetermined duration or more has elapsed after the generation of the high frequency power by the magnetron 42 is started. Meanwhile, if the count value of the timer $T_{ON}$ is equal to or higher than the predetermined value, it is determined that the time point for detecting the measurement values in the latest process ST2 is the time point when the time period having the predetermined duration or more has elapsed after the start time point at which the generation of the high frequency power by the magnetron 42 is started. In the process ST5, if it is determined that the time point for detecting the measurement values in the latest process ST2 is not the time point when the time period having a predetermined duration or more has elapsed after the start time point at which the generation of the high frequency power by the magnetron 42 is started, the process from the process ST2 is repeated. Meanwhile, in the process ST5, if it is determined that the time point for detecting the measurement values in the latest process ST2 is the time point when the time period having the predetermined duration or more elapsed after the start time point at which the generation of the high frequency power by the magnetron 42 is started, a subsequent process ST6 is performed by the processor 110.

In the process ST6, it is determined whether or not the set power $P_{sin}$ is substantially equal to the power of the progressive wave and whether or not the power of the reflection wave is approximately zero (0). By way of example, the processor 110 determines whether or not a difference between the measurement value $P_{fm}$ for the power of the progressive wave and the set power $P_{sin}$ is equal to or lower than a first predetermined value and whether or not the measurement value $P_{rm}$ for the power of the reflection wave is equal to or lower than a second predetermined value. In the process ST6, if it is determined that the set power $P_{sin}$ is not substantially equal to the power of the progressive wave (measurement value $P_{fm}$) or the power of the reflection wave (measurement value $P_{rm}$) is not approximately zero (0), it is assumed that the operation of the magnetron 42 is still unstable. Therefore, the process ST2 is performed again. Meanwhile, if it is determined that the set power $P_{sin}$ is substantially equal to the power of the progressive wave (measurement value $P_{fm}$) and the power of the reflection wave (measurement value $P_{rm}$) is approximately zero (0), a life determination of the magnetron 42 is performed by the processor 110 in a subsequent process ST7.

FIG. 9 to FIG. 12 are flowcharts each showing a process which can be used in a process ST7 of the method illustrated in FIG. 6. In the life determination in the process ST7, one or more of the processes illustrated in FIG. 9 to FIG. 12 may be performed. All of the processes illustrated in FIG. 9 to FIG. 12 are performed to determine whether or not the life of the magnetron 42 is ended on the basis of a comparison between the current parameters, which indicate the current status of the magnetron 42 and which are obtained from the current measurement values as the measurement values at a time point when the use conditions i.e., the determination reference in the process ST5 and the determination reference in the process ST6 are satisfied and the initial parameters indicating the initial status of the magnetron 42. Hereinafter, the processes respectively illustrated in FIG. 9 to FIG. 12 will be described.

Figure 9:
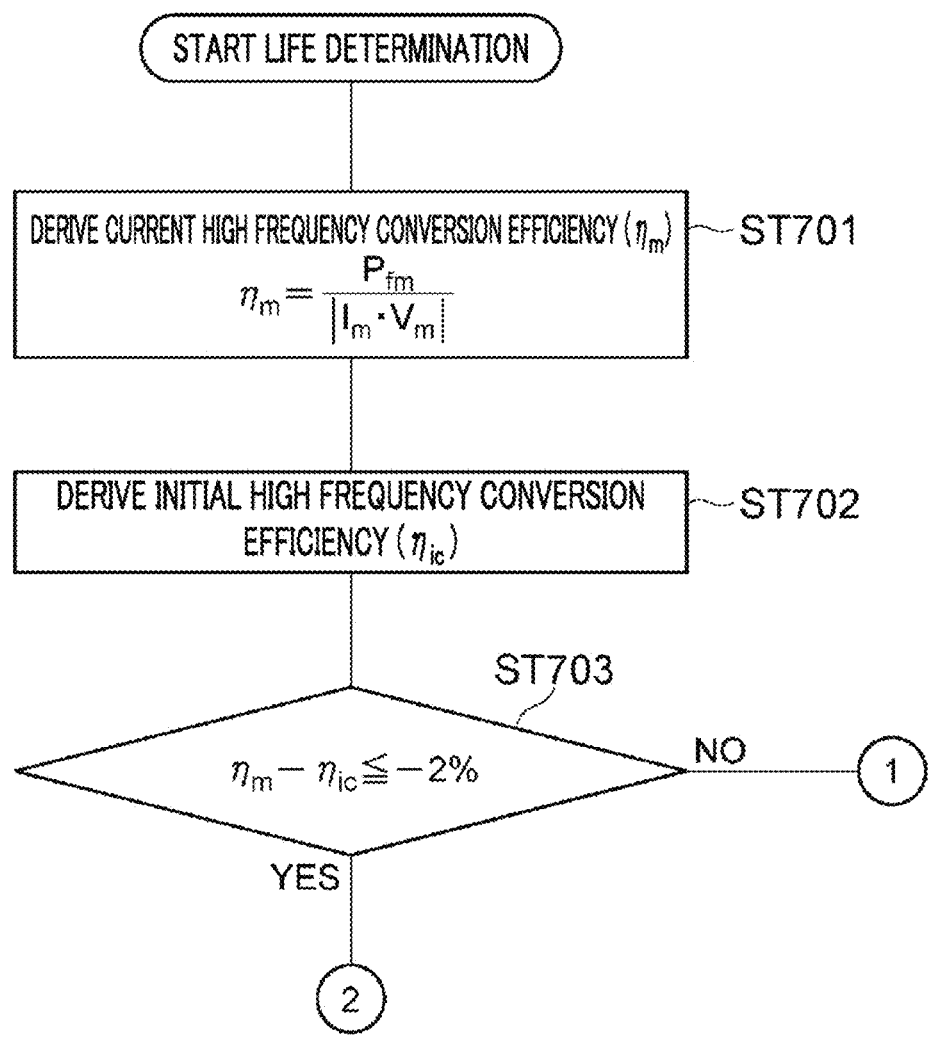
FIG. 9 is a flowchart showing a process which can be used in a process ST7 of the method illustrated in FIG. 6.

In the process illustrated in FIG. 9, it is determined whether or not the life of the magnetron 42 is ended on the basis of a comparison between the current high frequency conversion efficiency as the current parameter indicating a current status of the magnetron 42 and the initial high frequency conversion efficiency of the magnetron 42 as the initial parameter.

To be specific, in the process illustrated in FIG. 9, in a process ST701, the current high frequency conversion efficiency $\eta_m$ as the current parameter indicating a current status of the magnetron 42 is calculated. The current high frequency conversion efficiency $\eta_m$ is calculated as a value obtained by dividing the measurement value $P_{fm}$ for the current power of the progressive wave by the absolute value of an input power, i.e., the product of the measurement value $I_m$ for the current anode current and the measurement value $V_m$ for the current anode voltage, as illustrated in FIG. 9. Further, the measurement value $I_m$ for the current anode current, the measurement value $V_m$ for the current anode voltage, and the measurement value $P_{fm}$ for the current power of the progressive wave are the measurement value $I_m$ for the anode current, the measurement value $V_m$ for the anode voltage, and the measurement value $P_{fm}$ for the power of the progressive wave detected in the process ST2 just before the process ST701 is performed.

In a subsequent process ST702, the initial parameter is derived. Herein, the initial high frequency conversion efficiency q is derived. To be specific, in the process ST702, if any one of the set powers $P_{set}$, $P_{set}(1)$ to $P_{set}(N)$, stored in the memory 112 is equal to the set power $P_{sin}$, an initial high frequency conversion efficiency $\eta_i(j)$ corresponding to a set power $P_{set}(j)$ equal to the set power $P_{sin}$ among $P_{set}(1)$ to $P_{set}(N)$ is derived as the initial high frequency conversion efficiency $\eta_{ic}$. Meanwhile, if all of $P_{set}(1)$ to $P_{set}(N)$ are not equal to the set power $P_{sin}$, the initial high frequency conversion efficiency $\eta_{ic}$ is derived by proportionally dividing an initial high frequency conversion efficiency $\eta_i(k-1)$ corresponding to a set power $P_{set}(k-1)$ nearest to the set power $P_{sin}$ among the set powers $P_{set}$ lower than the set power $P_{sin}$ and an initial high frequency conversion efficiency $\eta_i(k)$ corresponding to a set power $P_{set}(k)$ nearest to the set power $P_{sin}$ among the set powers $P_{set}$ higher than the set power $P_{sin}$.

In a subsequent process ST703, it is determined whether or not the current high frequency conversion efficiency $\eta_m$ is decreased by a predetermined ratio or more as compared with the initial high frequency conversion efficiency $\eta_{ic}$. By way of example, it is determined whether or not the current high frequency conversion efficiency $\eta_m$ is decreased by 2% or more as compared with the initial high frequency conversion efficiency $\eta_{ic}$. In general, as a life of the magnetron 42 is close to the end thereof, a high frequency conversion efficiency of the magnetron 42 is decreased as compared with an initial high frequency conversion efficiency. If it is determined that the current high frequency conversion efficiency $\eta_m$ is not decreased by the predetermined ratio or more as compared with the initial high frequency conversion efficiency $\eta_{ic}$ in the process ST703, the process to the process ST2 in the flowchart illustrated in FIG. 6 is performed. Meanwhile, if it is determined that the current high frequency conversion efficiency $\eta_m$ is decreased by the predetermined ratio or more as compared with the initial high frequency conversion efficiency $\eta_{ic}$ in the process ST703, it is determined that the life of the magnetron 42 is ended, and in a subsequent process ST9, the replacement request signal is outputted from the processor 110.

Figure 10:
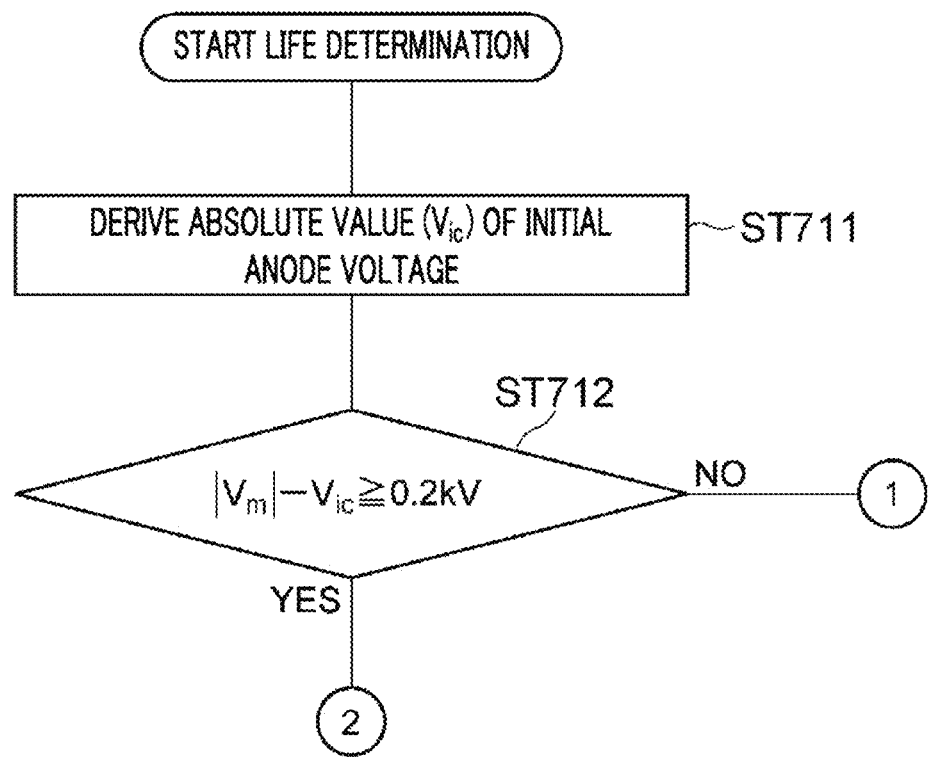
FIG. 10 is a flowchart showing a process which can be used in the process ST7 of the method illustrated in FIG. 6.

In the process illustrated in FIG. 10, it is determined whether or not the a life of the magnetron 42 is ended on the basis of a comparison between an absolute value of a current anode voltage of the magnetron 42 as a current parameter indicating a current status of the magnetron 42 and an absolute value of an initial anode voltage of the magnetron 42 as an initial parameter.

To be specific, in the process illustrated in FIG. 10, in a process ST711, an absolute value $V_{ic}$ of an initial anode voltage is derived. In the process ST711, if any one of the set powers $P_{set}$, i.e., $P_{set}(1)$ to $P_{set}(N)$, stored in the memory 112 is equal to the set power $P_{sin}$, an absolute value $V_i(j)$ of an initial anode voltage corresponding to the set power $P_{set}(j)$ equal to the set power $P_{sin}$, among $P_{set}(1)$ to $P_{set}(N)$ is derived as the absolute value $V_{ic}$ of the initial anode voltage. Meanwhile, if all of $P_{set}(1)$ to $P_{set}(N)$ are not equal to the set power $P_{sin}$, the absolute value $V_{ic}$ of the initial anode voltage is derived by proportionally dividing an absolute value $V_i(k-1)$ of an initial anode voltage corresponding to the set power $P_{set}(k-1)$ nearest to the set power $P_{sin}$ among the set powers $P_{set}$ lower than the set power $P_{sin}$ and an absolute value $V_i(k)$ of an initial anode voltage corresponding to the set power $P_{set}(k)$ nearest to the set power $P_{sin}$ among the set powers $P_{set}$ higher than the set power $P_{sin}$.

In a subsequent process ST712, the life determination is performed on the basis of a comparison between an absolute value of the current anode voltage and an absolute value of the initial anode voltage. To be specific, it is determined whether or not an absolute value |Vm| of a measurement value $V_m$ for the current anode voltage is increased by a predetermined value or more as compared with the absolute value $V_{ic}$ of the initial anode voltage. By way of example, it is determined whether or not the absolute value |Vm| of the measurement value $V_m$ for the current anode voltage is increased by 0.2 kV or more as compared with the absolute value $V_{ic}$ of the initial anode voltage. Herein, the absolute value |Vm| of the measurement value $V_m$ for the current anode voltage is the absolute value |Vm| of the measurement value $V_m$ for the anode voltage detected in the process ST2 just before the process ST712 is performed. In general, as a life of the magnetron 42 is close to the end thereof, an absolute value of an anode voltage of the magnetron 42 is increased as compared with an absolute value of an initial anode voltage. If it is determined that the absolute value |Vm| of the measurement value $V_m$ for the current anode voltage is not increased by the predetermined value or more as compared with the absolute value $V_{ic}$ of the initial anode voltage in the process ST712, the process to the process ST2 in the flowchart illustrated in FIG. 6 is performed. Meanwhile, if it is determined that the absolute value |Vm| of the measurement value $V_m$ for the current anode voltage is increased by the predetermined value or more as compared with the absolute value $V_{ic}$ of the initial anode voltage, it is determined that the life of the magnetron 42 is ended, and in the subsequent process ST9, a replacement request signal is outputted from the processor 110.

Figure 11:
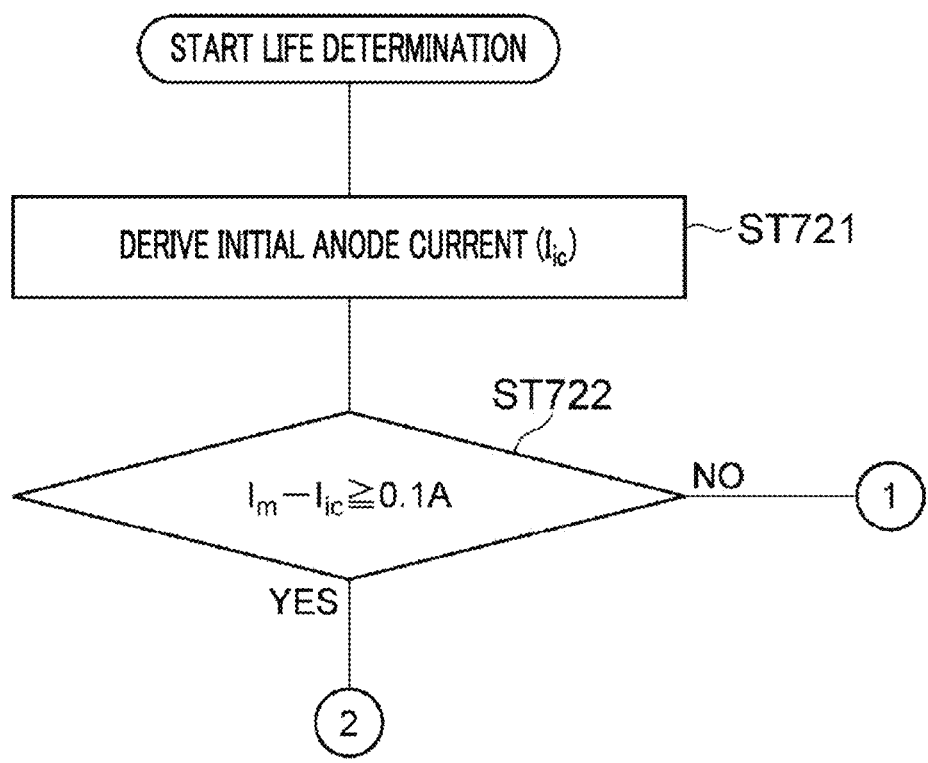
FIG. 11 is a flowchart showing a process which can be used in the process ST7 of the method illustrated in FIG. 6.

In the process illustrated in FIG. 11, it is determined whether or not the life of the magnetron 42 is ended on the basis of a comparison between a current anode current of the magnetron 42 as a current parameter indicating a current status of the magnetron 42 and an initial anode current of the magnetron 42 as an initial parameter.

To be specific, in the process illustrated in FIG. 11, in a process ST721, the initial anode current $I_{ic}$ is derived. In the process ST721, if any one of the set powers $P_{set}$, i.e., $P_{set}(1)$ to $P_{set}(N)$, stored in the memory 112 is equal to the set power $P_{sin}$, an initial anode current $I_i(j)$ corresponding to the set power $P_{set}(j)$ equal to the set power $P_{sin}$ among $P_{set}(1)$ to $P_{set}(N)$ is derived as the initial anode current $I_{ic}$. Meanwhile, if all of $P_{set}(1)$ to $P_{set}(N)$ are not equal to the set power $P_{sin}$, the initial anode current $I_{ic}$ is derived by proportionally dividing an initial anode current $I_i(k-1)$ corresponding to the set power $P_{set}(k-1)$ nearest to the set power $P_{sin}$ among the set powers $P_{set}$ lower than the set power $P_{sin}$ and an initial anode current $I_i(k)$ corresponding to the set power $P_{set}(k)$ nearest to the set power $P_{sin}$ among the set powers $P_{set}$ higher than the set power $P_{sin}$.

In a subsequent process ST722, the life determination is performed on the basis of a comparison between the current anode current and the initial anode current. To be specific, it is determined whether or not a measurement value $I_m$ for the current anode current is increased by a predetermined value or more as compared with the initial anode current $I_{ic}$. By way of example, it is determined whether or not the measurement value $I_m$ for the current anode current is increased by 0.1 A or more as compared with the initial anode current $I_{ic}$. Herein, the measurement value $I_m$ for the current anode current is the measurement value $I_m$ for the anode current detected in the process ST2 just before the process ST722 is performed. In general, as a life of the magnetron 42 is close to the end thereof, an anode current of the magnetron 42 is increased as compared with an initial anode current. If it is determined that the measurement value $I_m$ for the current anode current is not increased by a predetermined value or more as compared with the initial anode current $I_{ic}$ in the process ST722, the process to the process ST2 in the flowchart illustrated in FIG. 6 is performed. Meanwhile, if it is determined that the measurement value $I_m$ for the current anode current is increased by a predetermined value or more as compared with the initial anode current $I_{ic}$, it is determined that a life of the magnetron 42 is ended, and in the subsequent process ST9, a replacement request signal is outputted from the processor 110.

Figure 12:
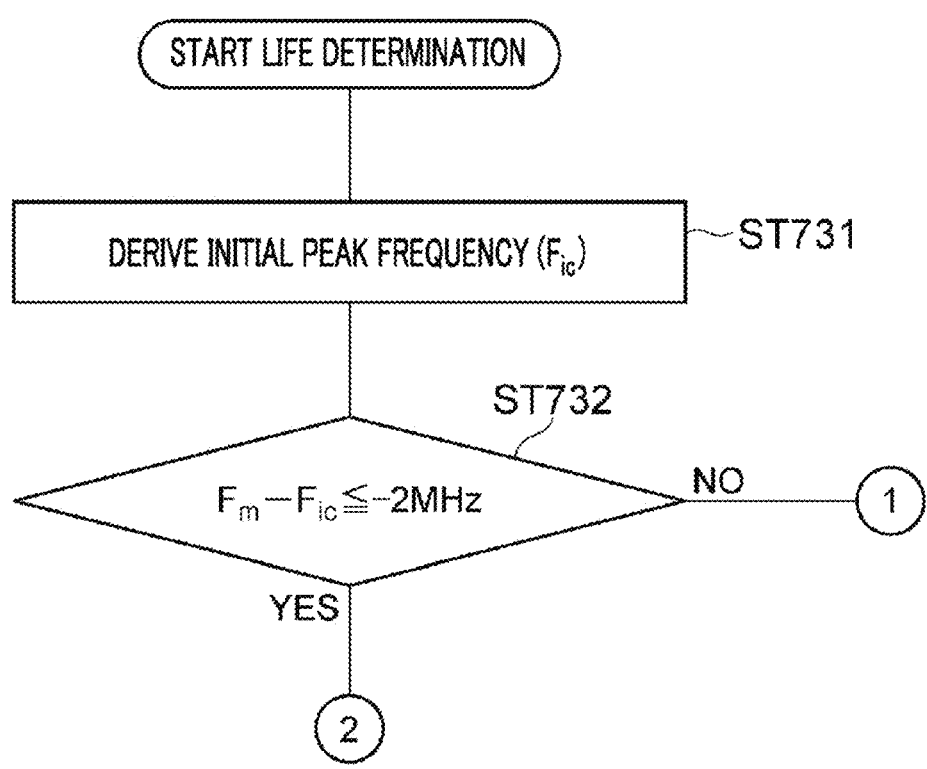
FIG. 12 is a flowchart showing a process which can be used in the process ST7 of the method illustrated in FIG. 6.

In the process illustrated in FIG. 12, a current peak frequency of a high frequency generated by the magnetron 42 is used as a current parameter indicating a current status of the magnetron 42 and an initial peak frequency of the high frequency generated by the magnetron 42 is used as an initial parameter. In the process illustrated in FIG. 12, it is determined whether or not a life of the magnetron 42 is ended on the basis of a comparison between the current peak frequency and the initial peak frequency.

To be specific, in the process illustrated in FIG. 12, in a process ST731, an initial peak frequency $F_{ic}$ is derived. In the process ST731, if any one of the set powers $P_{set}$, i.e., $P_{set}(1)$ to $P_{set}(N)$, stored in the memory 112 is equal to the set power $P_{sin}$, an initial peak frequency $F_i(j)$ corresponding to the set power $P_{set}(j)$ equal to the set power $P_{sin}$ among $P_{set}(1)$ to $P_{set}(N)$ is derived as the initial peak frequency $F_{ic}$. Meanwhile, if all of $P_{set}(1)$ to $P_{set}(N)$ are not equal to the set power $P_{sin}$, the initial peak frequency $F_{ic}$ is derived by proportionally dividing an initial peak frequency $F_i(k-1)$ corresponding to the set power $P_{set}(k-1)$ nearest to the set power $P_{sin}$ among the set powers $P_{set}$ lower than the set power $P_{sin}$ and an initial peak frequency $F_i(k)$ corresponding to the set power $P_{set}(k)$ nearest to the set power $P_{sin}$ among the set powers $P_{set}$ higher than the set power $P_{sin}$.

In a subsequent process ST732, the life determination is performed on the basis of a comparison between the current peak frequency and the initial peak frequency. To be specific, it is determined whether or not a measurement value $F_m$ for the current peak frequency is decreased by a predetermined value (e.g., 2 MHz) or more as compared with the initial peak frequency $F_{ic}$. Herein, the measurement value $F_m$ for the current peak frequency is the measurement value $F_m$ for the peak frequency detected in the process ST2 just before the process ST732 is performed. If it is determined that the measurement value $F_m$ for the current peak frequency is not decreased by a predetermined value or more as compared with the initial peak frequency $F_{ic}$ in the process ST732, the process to the process ST2 in the flowchart illustrated in FIG. 6 is performed. Meanwhile, if it is determined that the measurement value $F_m$ for the current peak frequency is decreased by a predetermined value or more as compared with the initial peak frequency $F_{ic}$, it is determined that a life of the magnetron 42 is ended, and in the subsequent process ST9, a replacement request signal is outputted from the processor 110.

As described above, in the method MT, the life of the magnetron 42 is determined by using the current parameters, for example, the current high frequency conversion efficiency, the current anode current, the current anode voltage, the current peak frequency, etc., of the magnetron 42 obtained from the measurement values detected at an appropriate time point. As a result, it is possible to inspect the magnetron 42 with high accuracy.

Figure 13:
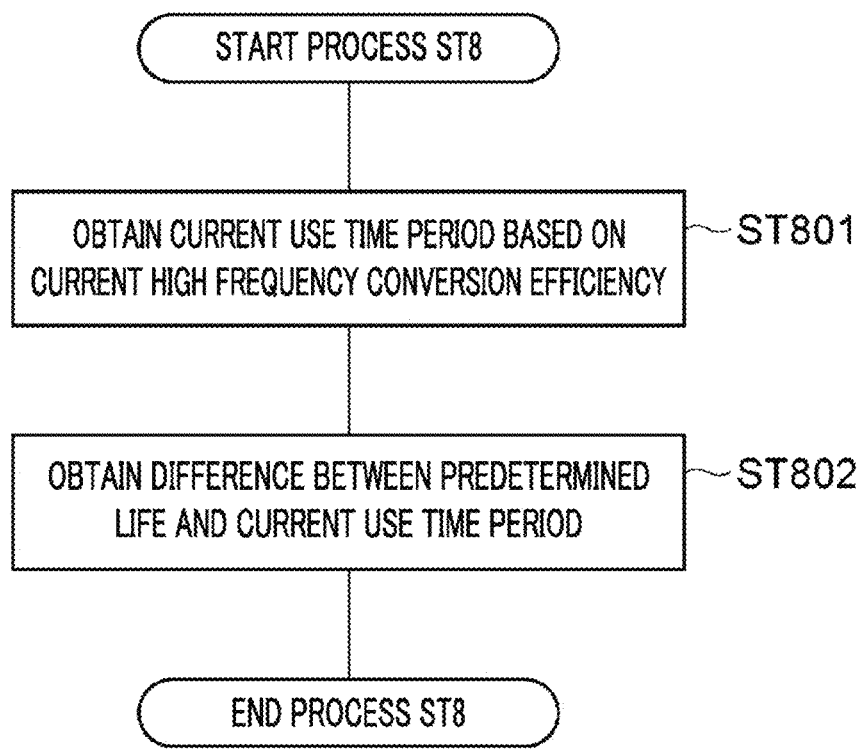
FIG. 13 is a flowchart showing a process which can be used in a process ST8 of the method illustrated in FIG. 6.
Figure 14:
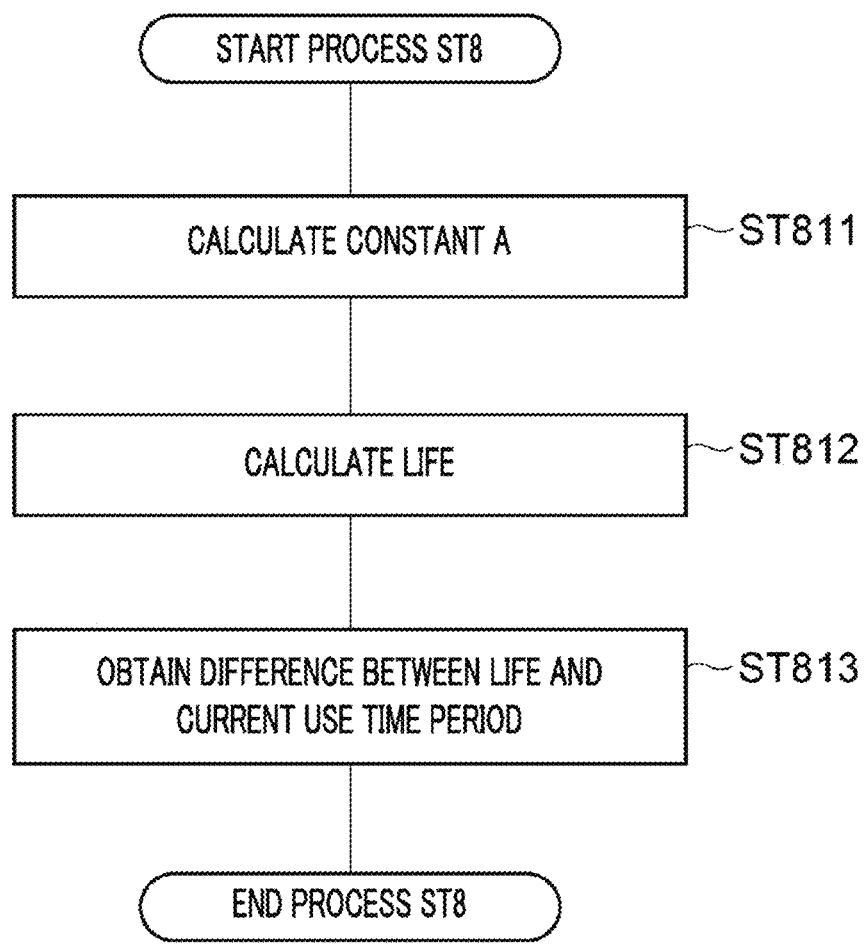
FIG. 14 is a flowchart showing a process which can be used in the process ST8 of the method illustrated in FIG. 6.

Referring to FIG. 6 again, in the exemplary embodiment, according to the method MT, the processor 110 performs a process ST8, and, thus, it is possible to predict a remaining time period to the life of the magnetron 42. FIG. 13 and FIG. 14 are flowcharts each showing a process which can be used in the process ST8 of the method illustrated in FIG. 6. In the predicting of a remaining time period in the process ST8, one or more of the processes illustrated in FIG. 13 and FIG. 14 may be performed.

Figure 15:
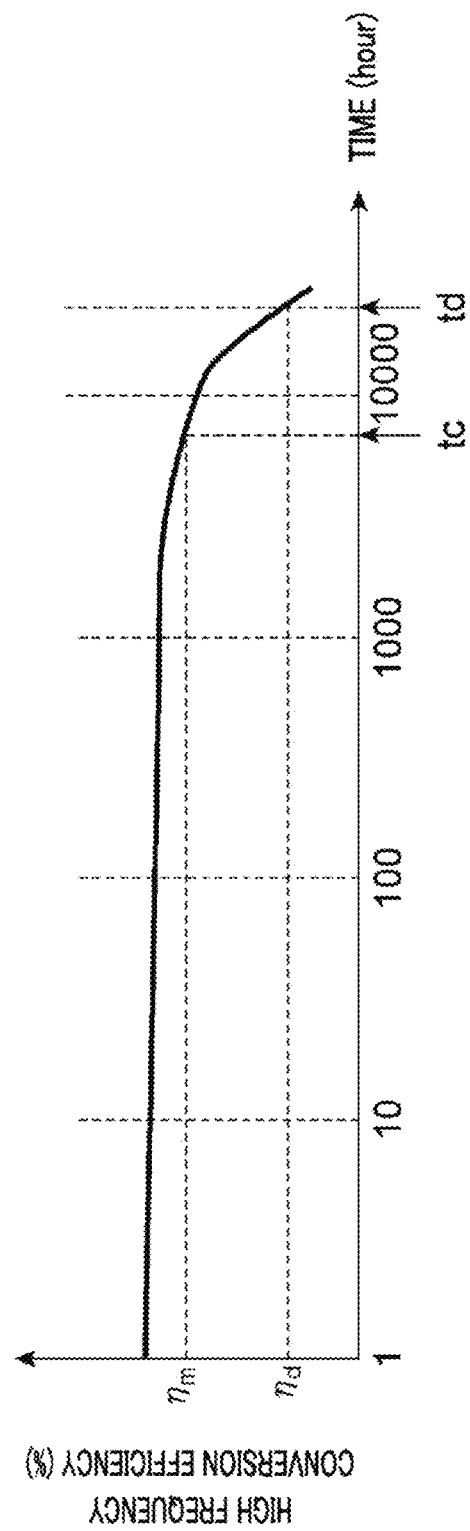
FIG. 15 is a diagram illustrating a relationship between a using time period of the magnetron and the high frequency conversion efficiency of the magnetron.

In the process illustrated in FIG. 13, data, in which a use time period of the magnetron 42 is corresponded to a high frequency conversion efficiency of the magnetron 42 is stored, are used. FIG. 15 is a diagram illustrating a relationship between a use time period of a magnetron and a high frequency conversion efficiency of the magnetron. As illustrated in FIG. 15, a high frequency conversion efficiency of the magnetron 42 is decreased with the lapse of use time. However, the apparatus difference may cause a slight difference between the use time period of the magnetron 42 and the high frequency conversion efficiency of the magnetron 42. For this reason, the data, in which the use time period of the magnetron 42 and the high frequency conversion efficiency of the magnetron 42 averaged considering the apparatus difference of the magnetron 42 are corresponded to each other, are stored in advance in the memory 112. Further, the data, in which the use time period of the magnetron 42 is corresponded to the high frequency conversion efficiency of the magnetron 42, may be a table form or may be a function.

In the process illustrated in FIG. 13, in a process ST801, a current use time period of the magnetron 42 is obtained on the basis of a current high frequency conversion efficiency $\eta_m$. As the current high frequency conversion efficiency $\eta_m$, the current high frequency conversion efficiency $\eta_m$ obtained in the process ST701 may be used. In the process ST801, a use time period corresponding to the current high frequency conversion efficiency $\eta_m$ is obtained with reference to the data in which the use time period of the magnetron 42 is corresponded to the high frequency conversion efficiency of the magnetron 42.

In a subsequent process ST802, a remaining time period to the life of the magnetron 42 is obtained from a difference between the preset life of the magnetron and the current use time period obtained in the process ST801.

In the process illustrated in FIG. 14, in a process ST811, a constant A is obtained on the basis of the following equation (9) using a current use time period $t_c$ of the magnetron 42, an initial high frequency conversion efficiency $\eta_{ic}$, and a current high frequency conversion efficiency $\eta_m$. The constant A reflects an imbalance in characteristics of the magnetron 42 as the inspection target with respect to the general magnetron. Further, as the current high frequency conversion efficiency $\eta_m$, the current high frequency conversion efficiency $\eta_m$ obtained in the process ST701 may be used. Furthermore, as the initial high frequency conversion efficiency $\eta_{ic}$, the initial high frequency conversion efficiency $\eta_{ic}$ derived in the process ST702 may be used. Moreover, the current use time period $t_c$ may be obtained by integrating a time period during which the magnetron 42 is operated after the magnetron 42 is first operated, and storing the integrated time period in the memory 112.

[Numerical expression 11]

$$t_c = \frac{1}{A} \log_e \frac{\eta_m}{\eta_{ic}} \quad (9)$$

In a subsequent process ST812, a life $t_d$ is obtained on the basis of the following equation (10) using a high frequency conversion efficiency $\eta_d$ when the predetermined life of the magnetron 42 is ended, the constant A obtained in the process ST811, and the initial high frequency conversion efficiency $\eta_{ic}$. Further, the high frequency conversion efficiency $\eta_d$ when the life of the magnetron 42 is ended may be obtained by storing the high frequency conversion efficiency $\eta_d$ in advance in the memory 112.

[Numerical expression 12]

$$t_d = \frac{1}{A} \log_e \frac{\eta_d}{\eta_{ic}} \quad (10)$$

In a subsequent process ST813, a remaining time period to the life of the magnetron 42 is obtained from a difference between the obtained life $t_d$ and the current use time period $t_c$. In the process illustrated in FIG. 14, the constant A that reflects the apparatus difference is calculated and the remaining time period is calculated on the basis of the calculated constant A. As a result, it is possible to obtain the remaining time period with higher accuracy.

The remaining time period obtained by performing the process ST8 on the basis of the process illustrated in FIG. 13 or FIG. 14 may be displayed on a display. Therefore, the operator of the plasma processing apparatus 10 can be aware of the remaining time period to a time point to replace the magnetron 42. After the process ST8 is performed, the method MT is performed again from the process ST2. Thus, it is possible to inspect the magnetron 42 while the magnetron 42 is operated. Therefore, it is possible to replace the magnetron 42 at an appropriate time point.

Figure 16:
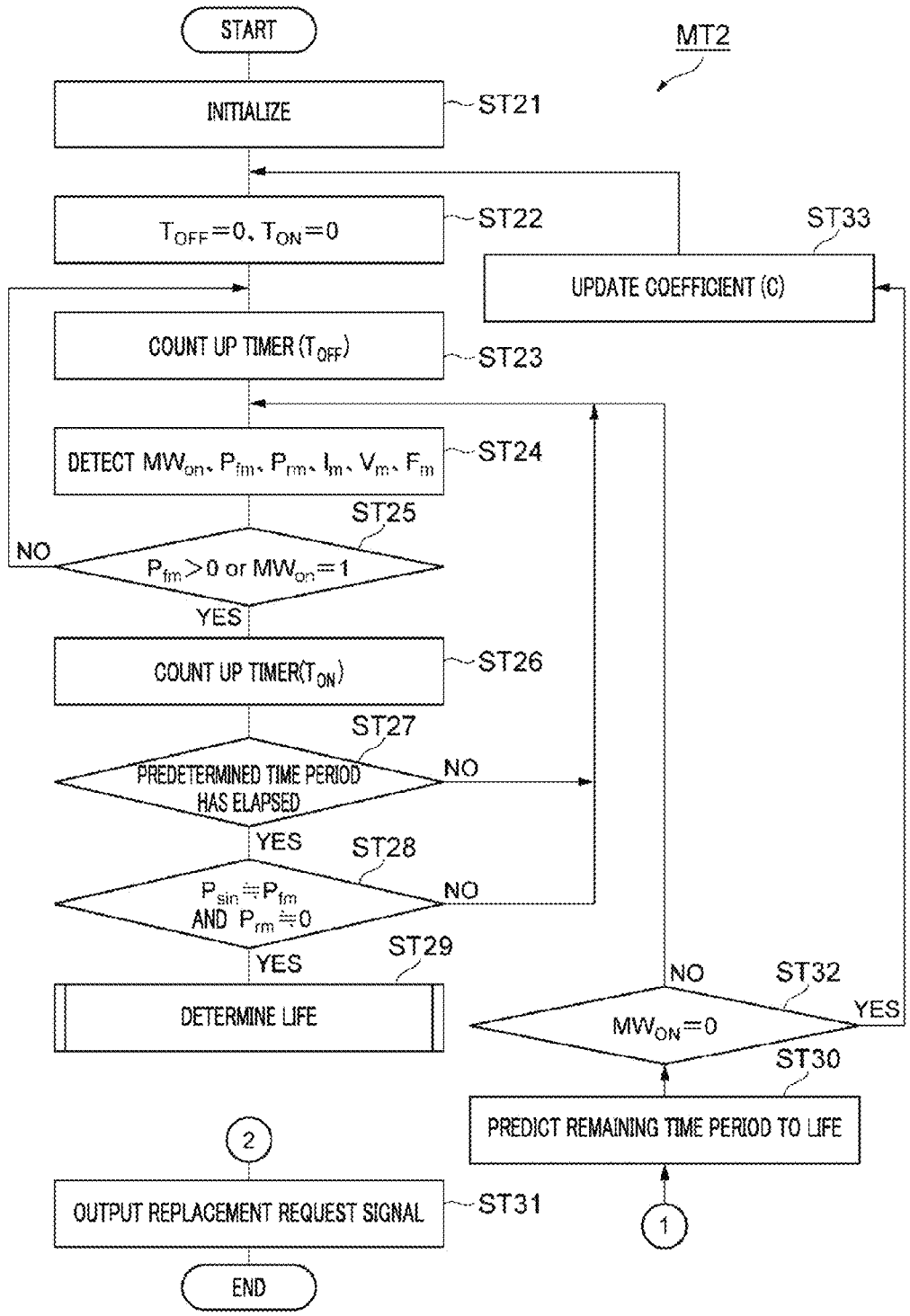
FIG. 16 is a flowchart showing a method for inspecting a magnetron in accordance with another exemplary embodiment.

Hereinafter, a method for inspecting a magnetron in accordance with another exemplary embodiment will be described. FIG. 16 is a flowchart showing a method for inspecting a magnetron in accordance with another exemplary embodiment. A method MT2 illustrated in FIG. 16 can be used for inspecting the magnetron 42 by the processor 110 of the plasma processing apparatus 10.

Figure 17A:
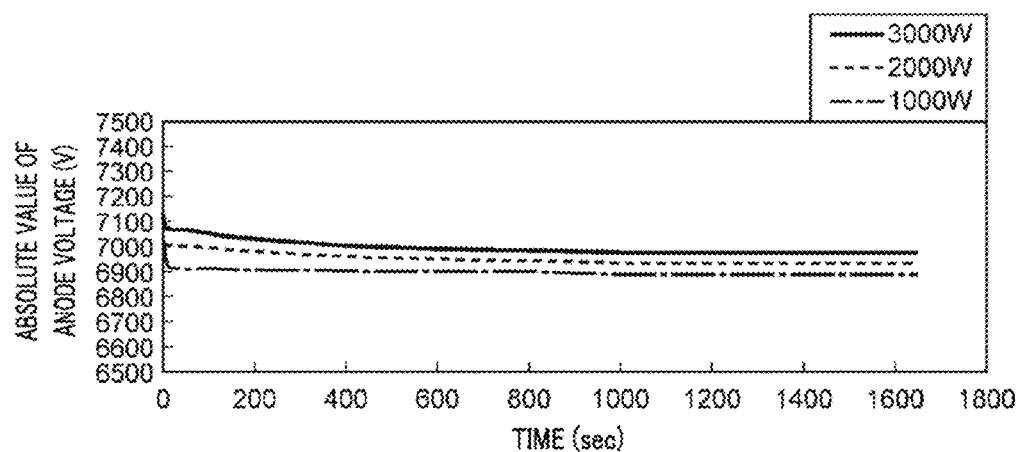
FIG. 17A to FIG. 17C are diagrams illustrating a change in an absolute value of an anode voltage, an anode current, and a high frequency conversion efficiency of a magnetron with the lapse of time, respectively.
Figure 17B:
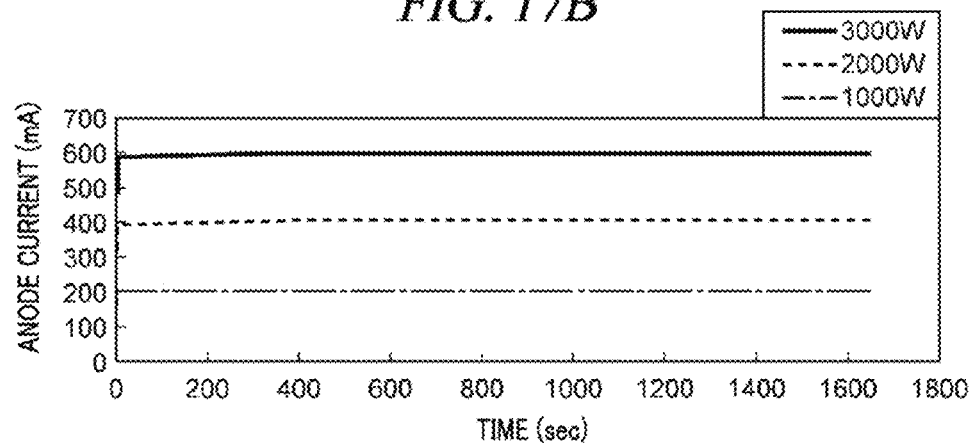
Figure 17C:
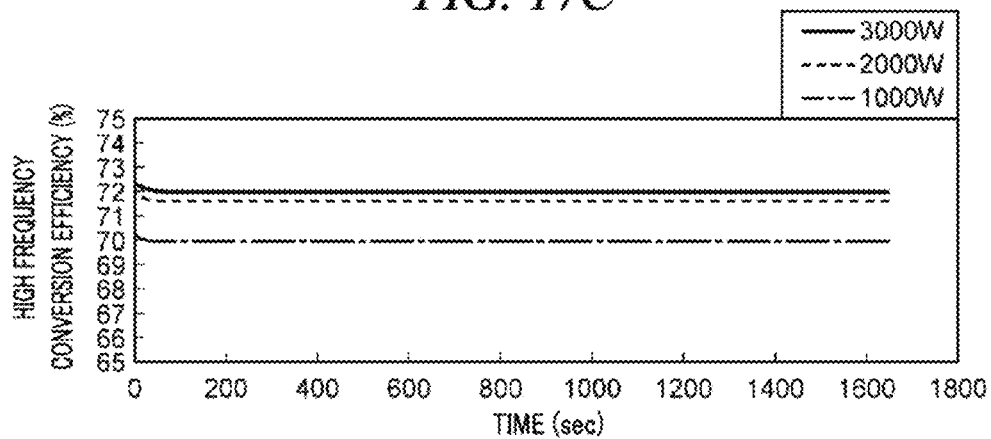

Hereinafter, FIG. 17A to FIG. 17C will be referred to before describing the method MT2 illustrated in FIG. 16. FIG. 17A to FIG. 17C are diagrams illustrating changes in the absolute value of the anode voltage, the anode current, and the high frequency conversion efficiency of the magnetron with the lapse of time. FIG. 17A to FIG. 17C illustrate changes in an absolute value of an anode voltage, an anode current, and a high frequency conversion efficiency of a magnetron with the lapse of time in the cases where set powers are 3000 W, 2000 W, and 1000 W, respectively. As illustrated in FIG. 17A to FIG. 17C, the absolute value of the anode voltage, the anode current, and the high frequency conversion efficiency of the magnetron may be stabilized to their convergence values when a relatively long time period (e.g., 900 seconds or more) shorter than the life has elapsed after a time point at which the generation of the high frequency power by the magnetron is started. For this reason, a minimum value of a difference with respect to the convergence value may not be obtained at a time period, for example, several tens of seconds, has elapsed after the time point at which the generation of the high frequency power by the magnetron is started. This tendency may also be found in the peak frequency of the progressive wave. Therefore, in the method MT2, as the current parameters indicating a current status of the magnetron 42, values, which are obtained by reflecting offset values for convergence values on the high frequency conversion efficiency, the absolute value of the measurement value for the anode voltage, the measurement value for the anode current, and the measurement value for the peak frequency of the progressive wave, respectively, are used.

In the method MT2, initial parameters are stored in the memory 112 as illustrated in FIG. 7. The initial parameters may be supplied as data indicating initial specifications from the manufacturer of the magnetron 42 or the operator of the plasma processing apparatus 10, and then stored in the memory 112. Otherwise, the initial parameters may be obtained from measurement values for specifying a status of the magnetron 42, which is actually measured immediately after the magnetron 42 is mounted on the plasma processing apparatus 10, and then stored in the memory 112. However, in this case, the initial parameters are obtained in the same manner as the following correction values for the high frequency conversion efficiency, the absolute value of the anode voltage, the anode current, and the peak frequency of the progressive wave.

Figure 18:
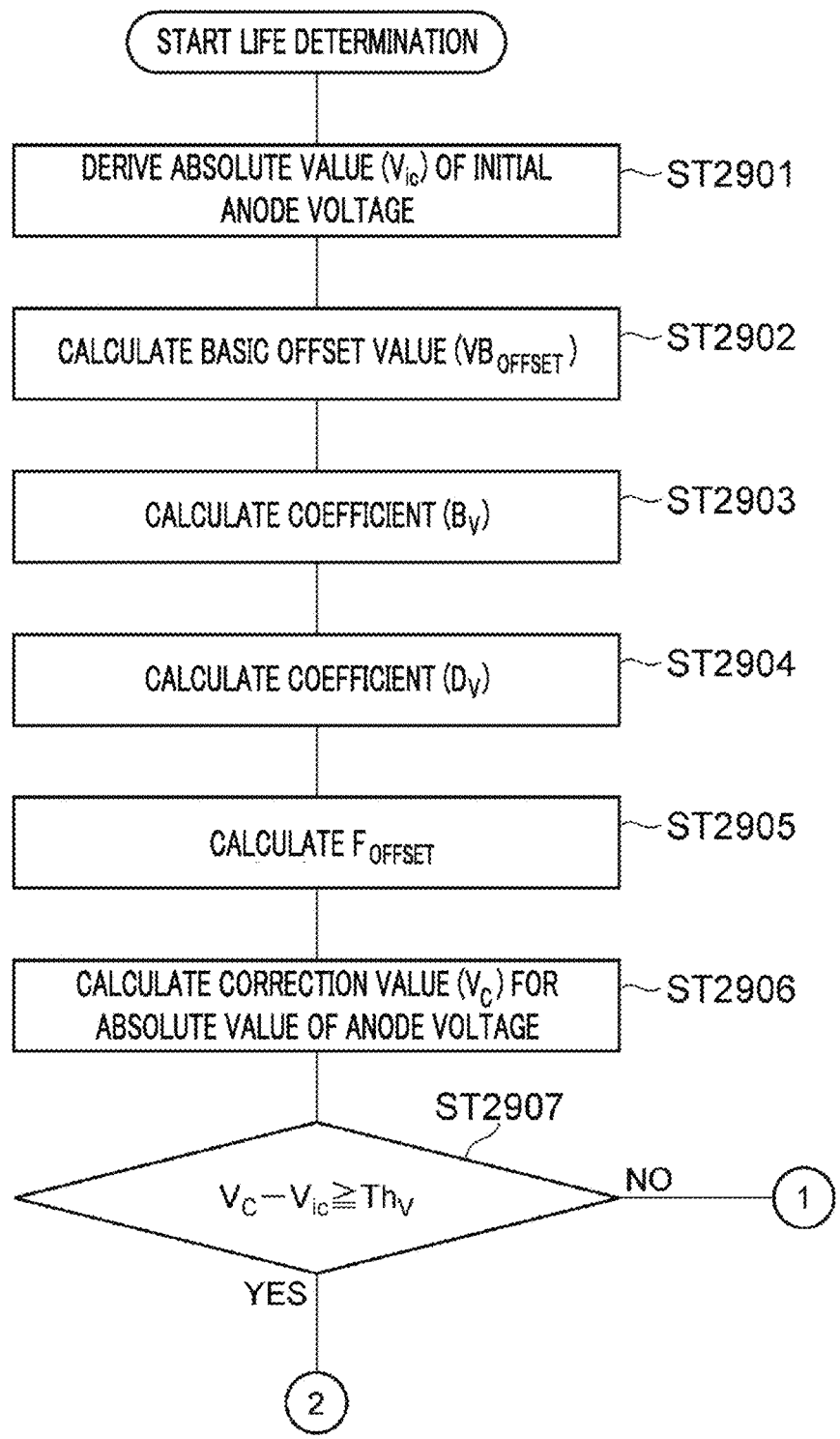
FIG. 18 is a flowchart showing a process which can be used in a process S29 of the method illustrated in FIG. 16.
Figure 19:
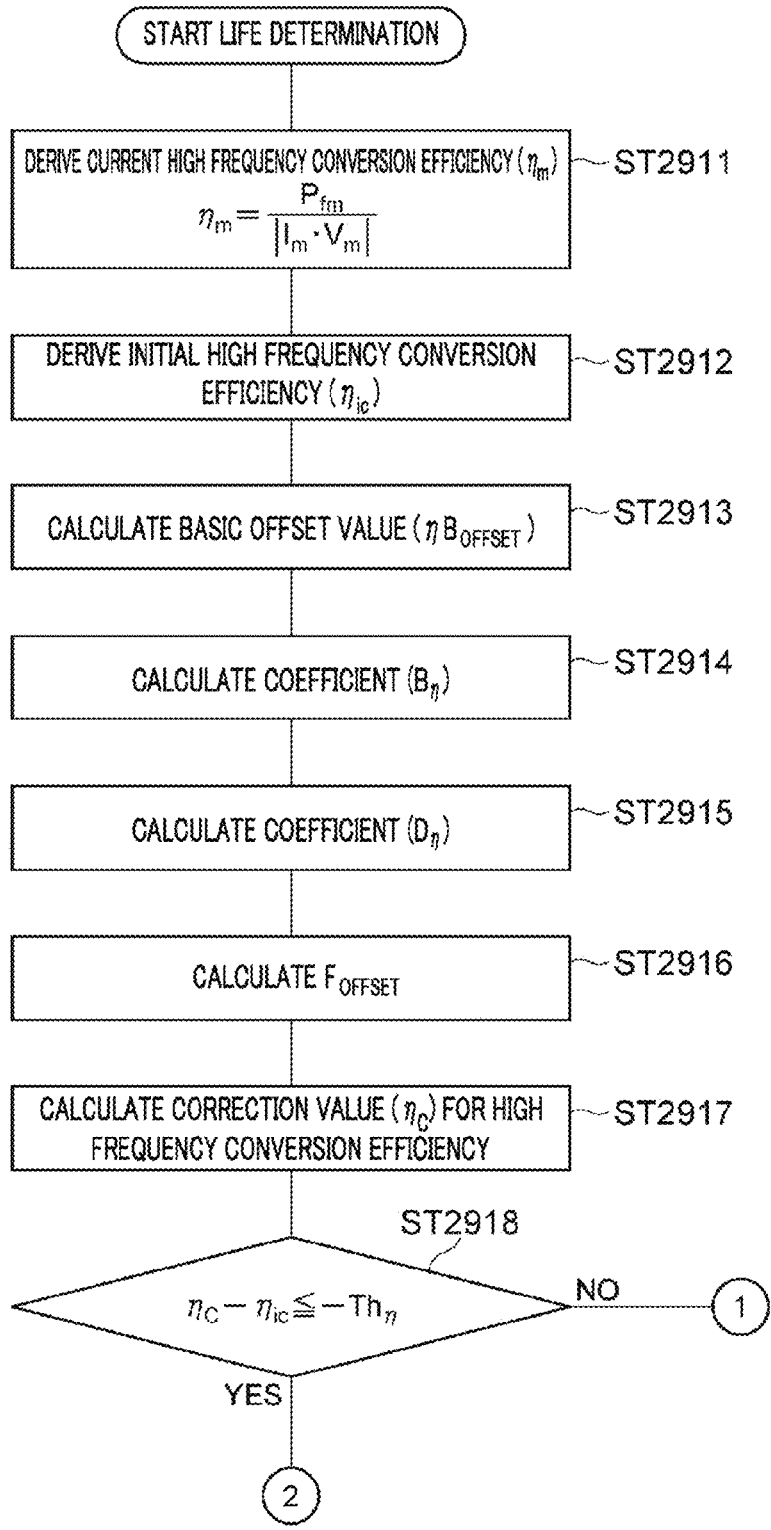
FIG. 19 is a flowchart showing a process which can be used in the process S29 of the method illustrated in FIG. 16.
Figure 20:
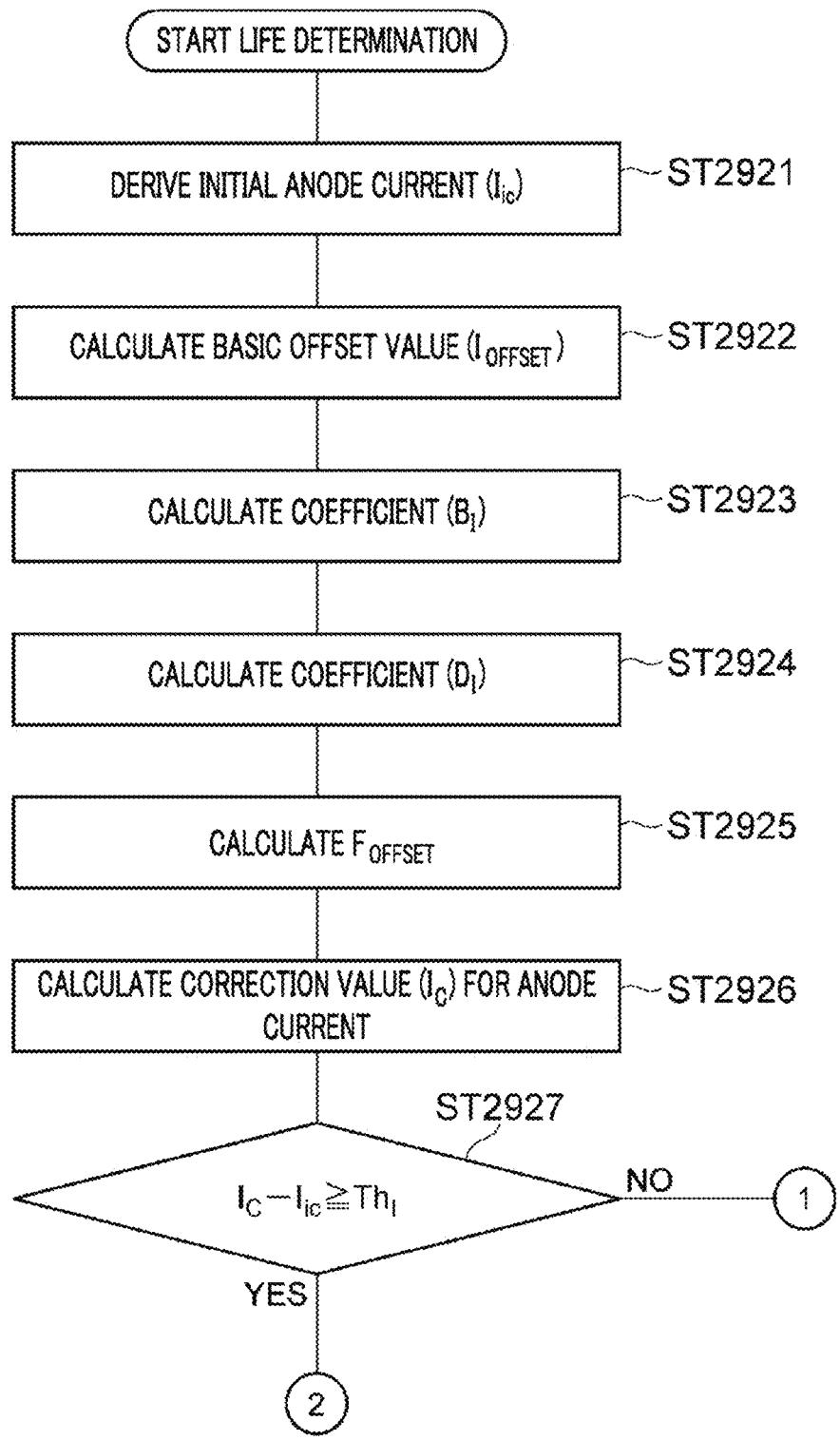
FIG. 20 is a flowchart showing a process which can be used in the process S29 of the method illustrated in FIG. 16.
Figure 21:
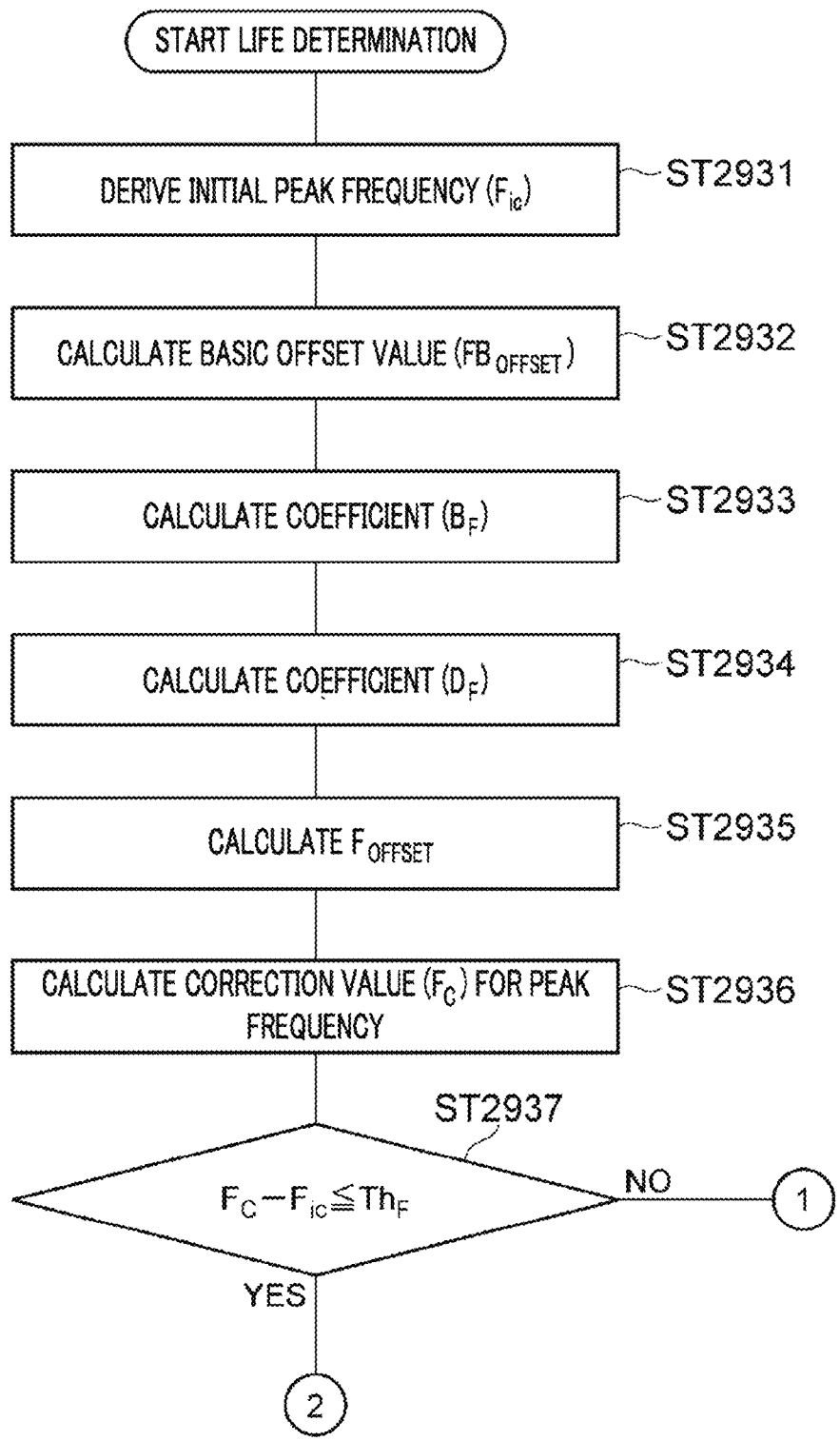
FIG. 21 is a flowchart showing a process which can be used in the process S29 of the method illustrated in FIG. 16.

Before the method MT2 is performed, the magnetron 42 does not generate the high frequency power. That is, the magnetron 42 stops the operation thereof before the method MT2 is performed. Therefore, the operation signal $MW_{on}$ is "0". Then, in the method MT2, a process ST21 is performed. In the process ST21, a coefficient is initialized. If the process illustrated in FIG. 18 is included in the life determination, the coefficient initialized in the process ST21 includes a coefficient $C_V$; if the process illustrated in FIG. 19 is included in the life determination, the coefficient includes a coefficient $C_\eta$; if the process illustrated in FIG. 20 is included in the life determination, the coefficient includes a coefficient $C_I$; and if the process illustrated in FIG. 21 is included in the life determination, the coefficient includes a coefficient $C_F$. The coefficients $C_V$, $C_\eta$, $C_I$, and $C_F$ are initialized to 0 in the process ST21.

In a subsequent process ST22, the timer $T_{ON}$ and a timer $T_{OFF}$ are initialized by the processor 110. The timer $T_{ON}$ is configured to measure a time period during which the magnetron 42 continuously generates the high frequency power, and the timer $T_{OFF}$ is configured to measure a time period during which the magnetron 42 stops generation of the high frequency power.

In a subsequent process ST23, the timer $T_{OFF}$ is counted up by the processor 110. In a subsequent process ST24 which is the same process as the process ST2, the operation signal $MW_{on}$, the measurement value $P_{fm}$ for the power of the progressive wave, the measurement value $P_{rm}$ for the power of the reflection wave, the measurement value $I_m$ for the anode current, the measurement value $V_m$ for the anode voltage, and the measurement value $F_m$ for the peak frequency are detected by the processor 110.

A subsequent process ST25 is the same process as the process ST3. In the process ST25, the processor 110 determines whether or not the measurement value $P_{fm}$ for the power of the progressive wave detected in the process ST24 is higher than 0 and whether or not the operation signal $MW_{on}$ is "1". That is, it is determined whether or not the generation of the high frequency power by the magnetron 42 is started. In the process ST25, if it is determined that the measurement value $P_{fm}$ for the power of the progressive wave is equal to or lower than 0 and the operation signal $MW_{on}$ is "0", since the generation of the high frequency power by the magnetron 42 is not started, the process ST23 is repeated. Meanwhile, in the process ST25, if it is determined that the measurement value $P_{fm}$ for the power of the progressive wave is higher than 0 or the operation signal $MW_{on}$ is "1", since the generation of the high frequency power by the magnetron 42 is started, the timer $T_{ON}$ is counted up by the processor 110 in a subsequent process ST26.

A subsequent process ST27 is the same process as the process ST5. In the process ST27, the processor 110 determines whether or not the time point for detecting the measurement values in the latest process ST24 is a time point when a time period having a predetermined duration or more has elapsed after the start time point at which the generation of the high frequency power by the magnetron 42 is started. To be specific, if a count value of the timer $T_{ON}$ is lower than a predetermined value, it is determined that the time point for detecting the measurement values in the latest process ST24 is not the time point when the time period having the predetermined duration or more has elapsed after the generation of the high frequency power by the magnetron 42 is started. Meanwhile, if the count value of the timer $T_{ON}$ is equal to or higher than the predetermined value, it is determined that the time point for detecting the measurement values in the latest process ST24 is the time point when the time period having the predetermined duration or more has elapsed after the start time point at which the generation of the high frequency power by the magnetron 42 is started. In the process ST27, if it is determined that the time point for detecting the measurement values in the latest process ST24 is not the time point when the time period having a predetermined duration or more has elapsed after the start time point at which the generation of the high frequency power by the magnetron 42 is started, the process from the process ST24 is repeated. Meanwhile, in the process ST27, if it is determined that the time point for detecting the measurement values in the latest process ST24 is the time point when the time period having the predetermined duration or more elapsed after the start time point at which the generation of the high frequency power by the magnetron 42 is started, a subsequent process ST28 is performed by the processor 110.

A subsequent process ST28 is the same process as the process ST6. In the process ST28, it is determined whether or not the set power $P_{sin}$ is substantially equal to the power of the progressive wave (measurement value $P_{fm}$) and whether or not the power of the reflection wave (measurement value $P_{rm}$) is approximately zero (0). By way of example, the processor 110 determines whether or not a difference between the measurement value $P_{fm}$ for the power of the progressive wave and the set power $P_{sin}$ is equal to or lower than a first predetermined value and whether or not the measurement value $P_{rm}$ for the power of the reflection wave is equal to or lower than a second predetermined value. In the process ST28, if it is determined that the set power $P_{sin}$ is not substantially equal to the power of the progressive wave (measurement value $P_{fm}$) or the power of the reflection wave (measurement value $P_{rm}$) is not approximately zero (0), it is assumed that the operation of the magnetron 42 is still unstable. Therefore, the process ST24 is performed again. Meanwhile, if it is determined that the set power $P_{sin}$ is substantially equal to the power of the progressive wave (measurement value $P_{fm}$) and the power of the reflection wave (measurement value $P_{rm}$) is approximately zero (0), life determination of the magnetron 42 is performed by the processor 110 in a subsequent process ST29.

FIG. 18 to FIG. 21 are flowcharts each showing a process which can be used in a process ST29 of the method illustrated in FIG. 16. All of the processes illustrated in FIG. 18 to FIG. 21 are performed to determine whether or not the life of the magnetron 42 is ended on the basis of a comparison between the current parameters, which indicates the current status of the magnetron 42 and which are obtained from the current measurement values as the measurement values at a time point when the use conditions i.e., the determination reference in the process ST27 and the determination reference in the process ST28 are satisfied and the initial parameters indicating the initial status of the magnetron 42. Hereinafter, the processes respectively illustrated in FIG. 18 to FIG. 21 will be described.

In the process illustrated in FIG. 18, it is determined whether or not the life of the magnetron 42 is ended on the basis of a comparison between a correction value for an absolute value of a current anode voltage as a current parameter indicating a current status of the magnetron 42 and an absolute value of an initial anode voltage of the magnetron 42 as an initial parameter.

To be specific, in the process illustrated in FIG. 18, in a process ST2901, an absolute value $V_{ic}$ of an initial anode voltage is derived in the same manner as the process ST711.

Figure 22:
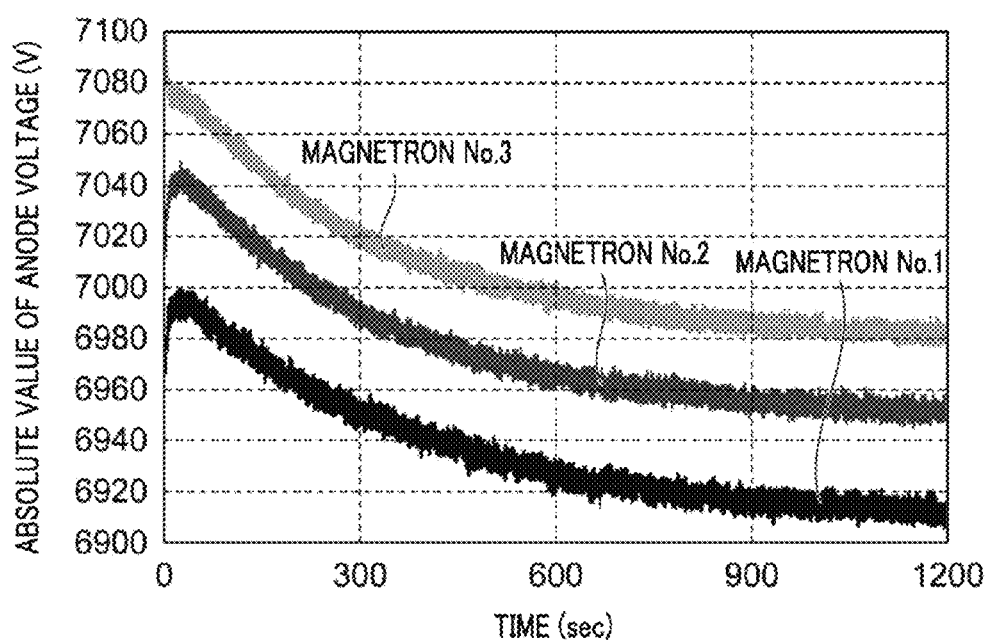
FIG. 22 is a diagram illustrating the change in the absolute value of the anode voltage of the magnetron with the lapse of time.

In a subsequent process ST2902, a basic offset value $VB_{OFFSET}(T_L)$ is obtained by using a fourth function $f_4(t_A)$. Herein, referring to FIG. 22, FIG. 22 is a diagram illustrating a change in an absolute value of an anode voltage of a magnetron with the lapse of time. FIG. 22 illustrates a change in an absolute value of an anode voltage with the lapse of time while three other magnetrons No. 1 to No. 3 having the same configuration as the magnetron 42 continuously generate the high frequency power under a predetermined condition. To be specific, the change in the absolute value of the anode voltage with the lapse of time illustrated in FIG. 22 is obtained when the set power $P_{set}$ is 3000 W.

As illustrated in FIG. 22, the magnetrons No. 1 to No. 3 are different from each other in the absolute value of the anode voltage. However, the magnetrons No. 1 to No. 3 have substantially the same tendency in which the absolute value of the anode voltage decreases from the start time point at which the generation of the high frequency power is started and reaches a convergence value after a time period, e.g., 900 seconds or more, has elapsed. Further, in each of the magnetrons No. 1 to No. 3, differences between the absolute values of the anode voltages at a certain time and the convergence values thereof, i.e., offset values are substantially the same.

In the method MT2, the fourth function $f_4(t_A)$ is prepared in advance from the change in the anode voltage with the lapse of time, which is obtained under a predetermined condition, and the fourth function $f_4(t_A)$ is used. The fourth function $f_4(t_A)$ is a function defining a relationship between an elapsed time period $t_A$ from a time point at which the continuous generation of the high frequency power by a magnetron having the same configuration as the magnetron 42 is started under a predetermined condition to a certain time point during the continuous generation of the high frequency power and a basic offset value $VB_{OFFSET}(t_A)$ as an absolute value of a difference between the anode voltage of the magnetron at the certain time point and the convergence value of the anode voltage of the magnetron while the magnetron continuously generates the high frequency power under the predetermined condition. Further, the predetermined condition includes a predetermined stop time period, for example, a sufficient time period of 20 minutes, of the magnetron before generating the high frequency power, and a predetermined power as a set power of the progressive wave in the high frequency power generated by the magnetron.

By way of example, the fourth function $f_4(t_A)$ is determined as the following equations:

| | |
|---|---|
| $f_4(t_A) = VB_{OFFSET}(t_A) = a1_V \times t_A + b1_V$ | if $t_A$ is shorter than 300 seconds |
| $f_4(t_A) = VB_{OFFSET}(t_A) = a2_V \times t_A + b2_V$ | if $t_A$ is equal to or longer than 300 seconds and shorter than 600 seconds |
| $f_4(t_A) = VB_{OFFSET}(t_A) = a3_V \times t_A + b3_V$ | if $t_A$ is equal to or longer than 600 seconds and equal to or shorter than 900 seconds |

In the above equations, $a1_V$, $b1_V$, $a2_V$, $b2_V$, $a3_V$, and $b3_V$ are coefficients in the fourth function, and may be, for example, −0.1850, 95, −0.0837, 64, −0.0235, and 28, respectively. Further, the fourth function $f_4(t_A)$ may be any function if the function approximates a relationship between the elapsed time period $t_A$ and the absolute value of the difference between the anode voltage and the convergence value of the anode voltage at the certain time point while the magnetron continuously generates the high frequency power under the predetermined condition.

In the process ST2902, an elapsed time period $T_L$ from a time point at which the generation of the high frequency power by the magnetron 42 is started to a current time point at which the above-described use conditions are satisfied is inputted as an elapsed time period $t_A$ to the fourth function $f_4(t_A)$, and a basic offset value $VB_{OFFSET}(T_L)$ is outputted as the output of the fourth function. Further, the elapsed time period $T_L$ may be obtained from the count value of the timer $T_{ON}$.

Figure 23:
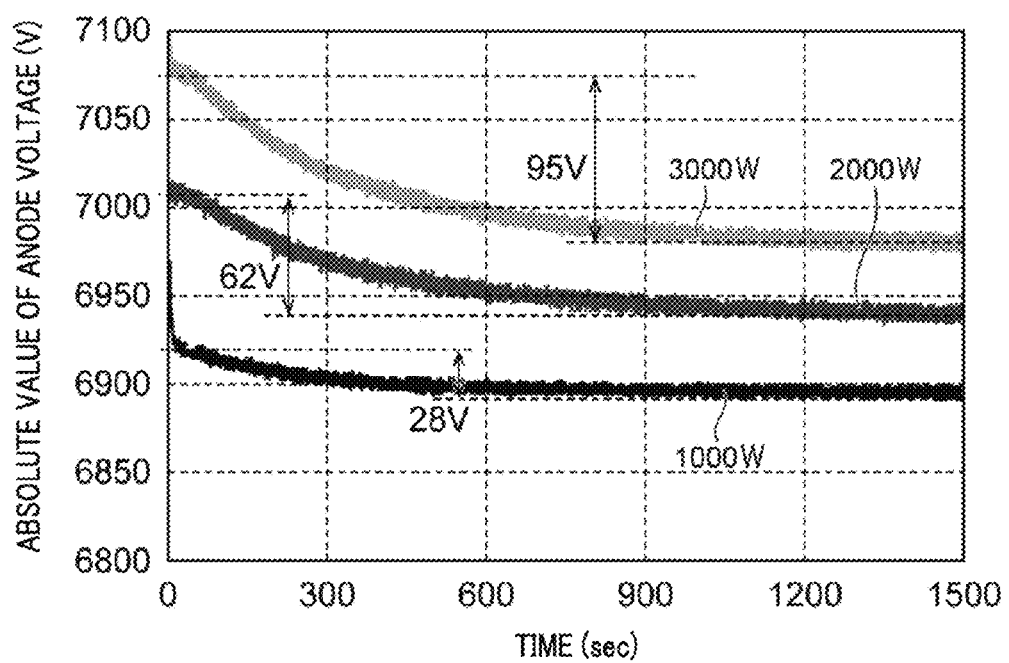
FIG. 23 is a diagram illustrating the change in the absolute value of the anode voltage of the magnetron with the lapse of time.

Herein, referring to FIG. 23, FIG. 23 is a diagram illustrating changes in the absolute value of the anode voltage of the magnetron with the lapse of time. FIG. 23 illustrates changes in the anode voltage with the lapse of time when a magnetron having the same configuration as the magnetron 42 generates high frequency powers of progressive waves having three set powers (1000 W, 2000 W, 3000 W), respectively. As illustrated in FIG. 23, as the set power of the progressive wave decreases, a variation in the anode voltage with respect to the convergence value in the change of the anode voltage with the lapse of time decreases. That is, when the set power of the progressive wave decreases, the offset value for the convergence value of the anode voltage at a certain time point also decreases. By way of example, if the set power is 3000 W, the maximum variation in the anode voltage is 95 V; if the set power is 2000 W, the maximum variation in the anode voltage is 62 V; and if the set power is 1000 W, the maximum variation in the anode voltage is 28 V.

As described above, the offset value for the convergence value of the anode voltage of the magnetron varies depending on the power of the progressive wave. Therefore, in a subsequent process ST2903, a coefficient $B_V(P_{fm})$ indicating a rate of change in the offset value corresponding to the measurement value $P_{fm}$ for the power of the progressive wave at the current time point at which the above-described use conditions are satisfied is obtained. For this reason, in the method MT2, a fifth function $f_5(P_A)$ is prepared in advance, and the fifth function $f_5(P_A)$ is used. The fifth function $f_5(P_A)$ is a function defining a relationship between a power $P_A$ of a certain progressive wave and a coefficient $B_V(P_A)$ indicating a ratio of a predetermined value as a maximum variation in an anode voltage of a magnetron having the same configuration as the magnetron 42 while the magnetron continuously generates the high frequency power under the power $P_A$ of the certain progressive wave with respect to a predetermined maximum value of a basic offset value $VB_{OFFSET}(t_A)$. Further, the maximum variation in the anode voltage is defined as a difference between a maximum value of an absolute value for an anode voltage and a convergence value of the anode voltage.

By way of example, the fifth function $f_5(P_A)$ is determined as the following equations:

| | |
|---|---|
| $f_5(P_A) = B_V(P_A) = 0$ | if $P_A$ is equal to or higher than 0 kW and lower than 0.5 kW |
| $f_5(P_A) = B_V(P_A) = c_V \times P_A - d_V$ | if $P_A$ is equal to or higher than 0.5 kW and lower than 3.5 kW |

In the above equations, $c_V$ and $d_V$ are coefficients in the fifth function, and may be, for example, 0.35 and 0.05, respectively. The values of $c_V$ and $d_V$ are obtained by deriving the fifth function $f_5(P_A)$ as a linear function approximating a relationship between the above-described set powers 3000 W, 2000 W and 1000 W and the ratio of the maximum variations 95 V, 62 V and 28 V in the anode voltage with respect to the predetermined maximum value 95 V of the basic offset value $VB_{OFFSET}(t_A)$. Further, the fifth function $f_5(P_A)$ may be any function if the function approximates a relationship between a power $P_A$ of a certain progressive wave and a ratio of a predetermined value as a maximum variation in an anode voltage of a magnetron while the magnetron continuously generates the high frequency power under the power $P_A$ of the certain progressive wave with respect to a predetermined maximum value of a basic offset value $VB_{OFFSET}(t_A)$.

In the process ST2903, the measurement value $P_{fm}$ for the power of the progressive wave at the current time point is inputted as the power $P_A$ of the progressive wave to the fifth function $f_5(P_A)$, and the coefficient $B_V(P_{fm})$ is outputted as the output of the fifth function $f_5(P_A)$.

Figure 24:
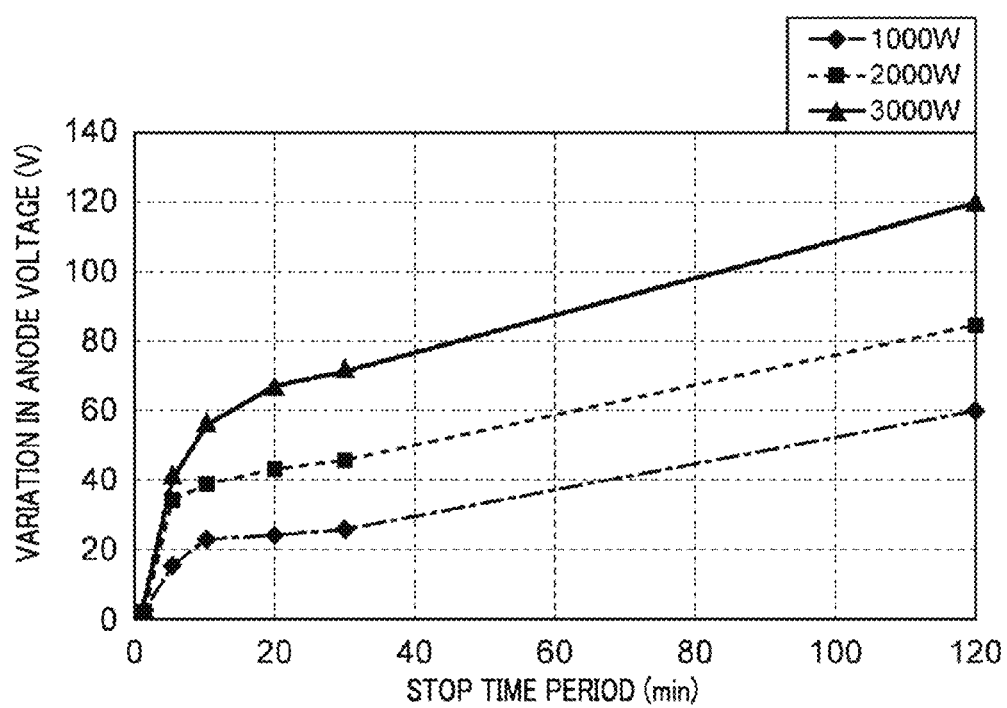
FIG. 24 is a diagram illustrating a relationship between a stop time period of the magnetron and a maximum variation in the anode voltage of the magnetron during a period in which a high frequency power is generated immediately after the stop time period.

Herein, referring to FIG. 24, FIG. 24 is a diagram illustrating a relationship between a stop time period of a magnetron and a maximum variation in an anode voltage of the magnetron during a period in which a high frequency power is generated immediately after the stop time period.

The relationship illustrated in FIG. 24 is obtained by using a magnetron having the same configuration as the magnetron 42. In FIG. 24, the stop time period of the magnetron is defined as a time period in which the magnetron stops the generation of the high frequency power, and the maximum variation in the anode voltage of the magnetron is defined as a maximum value of the offset value for the convergence value of the anode voltage of the magnetron when the high frequency power is generated immediately after the stop time period.

As illustrated in FIG. 24, the maximum variation in the anode voltage of the magnetron depends on the stop time period of the magnetron just before a period in which the magnetron generates the high frequency power. Therefore, in a subsequent process ST2904, a coefficient $D_V(T_S)$ indicating a rate of change in the maximum variation in the anode voltage corresponding to the stop time period $T_S$ just before the start time point at which the generation of the high frequency power by the magnetron 42 is started is obtained. For this reason, in the method MT2, a sixth function $f_6(t_{SA})$ is prepared in advance, and the sixth function $f_6(t_{SA})$ is used. The sixth function $f_6(t_{SA})$ is a function defining a relationship between a certain stop time period $t_{SA}$ during which a magnetron having the same configuration as the magnetron 42 stops the generation of the high frequency power and a coefficient $D_V(t_{SA})$ indicating a ratio of the maximum variation in the anode voltage of the magnetron while the magnetron continuously generates the high frequency power immediately after the magnetron stops the generation of the high frequency power for the certain stop time period with respect to the maximum variation in the anode voltage of the magnetron while the magnetron continuously generates the high frequency power immediately after the magnetron stops the generation of the high frequency power for a predetermined stop time period.

By way of example, the sixth function $f_6(t_{SA})$ is determined as the following equations:

$$f_6(t_{SA}) = D_V(t_{SA}) = e_V \times \log_{10}(t_{SA}) + f_V$$

In the above equation, $e_V$, $f_V$ are coefficients in the sixth function, and may be, for example, 0.19741 and 0.00201, respectively. As illustrated in FIG. 24, the values of $e_V$ and $f_V$ are obtained by standardizing the maximum variation in the anode voltage to 1 when the set power is 3000 W and the stop time period is 120 minutes and by approximating a relationship between the standardized maximum variation and the stop time period by using a logarithmic function. Further, the sixth function $f_6(t_{SA})$ may be any function if the function approximates a relationship between a certain stop time period $t_{SA}$ and a ratio of a maximum variation in an anode voltage of the magnetron while the magnetron continuously generates the high frequency power immediately after the magnetron stops the generation of the high frequency power for the certain stop time period with respect to a maximum variation in an anode voltage of the magnetron while the magnetron continuously generates the high frequency power immediately after the magnetron stops the generation of the high frequency power for a predetermined stop time period.

In the process ST2904, a stop time period $T_S$ just before the start time point at which the generation of the high frequency power by the magnetron 42 is started is inputted as a stop time period $t_{SA}$ to the sixth function $f_6(t_{SA})$, and the coefficient $D_V(T_S)$ is outputted as the output of the sixth function $f_6(t_{SA})$. Further, the stop time period $T_S$ may be obtained from the count value of the timer $T_{OFF}$.

In a subsequent process ST2905, the offset value $V_{OFFSET}$ for the anode voltage of the magnetron 42 may be obtained by using the basic offset value $VB_{OFFSET}(T_L)$, the coefficient $B_V(P_{fm})$, the coefficient $C_V$, and the coefficient $D_V(T_S)$ in the following equation (3):

[Numerical Expression 13]

$$\left.\begin{aligned} V_{OFFSET} &= VB_{OFFSET}(T_L) \times B_V(P_{fm}) \times & \text{if } C_V + D_V(T_S) \le 1 \\ &\quad (C_V + D_V(T_S)) \\ V_{OFFSET} &= VB_{OFFSET}(T_L) \times B_V(P_{fm}) \times 1 & \text{if } C_V + D_V(T_S) > 1 \end{aligned}\right\} \quad (3)$$

The coefficient $C_V$ in the equation (3) is the coefficient $C_V$ initialized in the process ST21 if the process illustrated in FIG. 18 is first performed immediately after the stop time period of the magnetron 42. Further, the coefficient $C_V$ in the equation (3) is the coefficient $C_V$ updated in a process ST33 to be described later if the process illustrated in FIG. 18 is performed after a second cycle. The coefficient $C_V$ is obtained by dividing the offset value $V_{OFFSET}$ for the anode voltage of the magnetron 42 obtained for a period during which the magnetron 42 generates the high frequency power just before the stop time period during which the magnetron 42 stops the generation of the high frequency power just before the start time point at which the generation of the high frequency power by the magnetron 42 is started by a predetermined maximum value (e.g., 95 V) of the basic offset value $VB_{OFFSET}(t_A)$.

In a subsequent process ST2906, a correction value $V_C$ for the absolute value of the current anode voltage is obtained by using the measurement value $V_m$ for the current anode voltage of the magnetron 42 and the offset value $V_{OFFSET}$ at a time point when the above-described use conditions are satisfied in the following equation (4):

[Numerical expression 14]

$$V_C = |V_m| - V_{OFFSET} \quad (4)$$

In a subsequent process ST2907, the life determination is performed on the basis of a comparison between the correction value $V_C$ for the absolute value of the current anode voltage and the absolute value $V_{ic}$ of the initial anode voltage. To be specific, it is determined whether or not the correction value $V_C$ for the absolute value of the current anode voltage is increased by a predetermined value $Th_V$ or more as compared with the absolute value $V_{ic}$ of the initial anode voltage. Further, $Th_V$ is a positive value. In the process ST2907, if it is determined that the correction value $V_C$ for the absolute value of the current anode voltage is not increased by the predetermined value or more as compared with the absolute value $V_{ic}$ of the initial anode voltage, processes leading to the process ST30 in the flowchart illustrated in FIG. 16 is performed. Meanwhile, if it is determined that the correction value $V_C$ for the absolute value of the current anode voltage is increased by the predetermined value or more as compared with the absolute value $V_{ic}$ of the initial anode voltage, it is determined that the life of the magnetron 42 is ended, and in a subsequent process ST31, the replacement request signal is outputted from the processor 110.

The process ST30 is the same process as the process ST8. In the process ST30, a remaining time period to the life of the magnetron 42 is predicted. In a subsequent process ST32, it is determined whether or not the operation signal $MW_{on}$ is 0. In the process ST32, if it is determined that the operation signal $MW_{on}$ is not zero (0), i.e., if it is determined that the magnetron 42 continuously generates the high frequency power, the process from the process ST24 is performed again. Meanwhile, in the process ST32, if it is determined that the operation signal $MW_{on}$ is zero (0), i.e., if it is determined that the magnetron 42 stops the generation of the high frequency power, a coefficient C is updated in a subsequent process ST33. By way of example, if the process illustrated in FIG. 18 is included in the life determination, the coefficient $C_V$ is updated. Further, the coefficient $C_V$ is obtained by dividing the offset value $V_{OFFSET}$ obtained just before the process ST33 by a predetermined maximum value (e.g., 95 V) of the basic offset value $VB_{OFFSET}(t_A)$. Further, if a process illustrated in FIG. 19 to be descried later is included in the life determination, the coefficient $C_\eta$ is updated in the process ST33; if a process illustrated in FIG. 20 to be descried later is included in the life determination, the coefficient $C_i$ is updated in the process ST33; and if a process illustrated in FIG. 21 to be descried later is included in the life determination, the coefficient $C_F$ is updated in the process ST33.

Hereinafter, the process illustrated in FIG. 19 will be described. In the process illustrated in FIG. 19, it is determined whether or not the life of the magnetron 42 is ended on the basis of a comparison between a correction value for a current high frequency conversion efficiency as a current parameter indicating a current status of the magnetron 42 and an initial high frequency conversion efficiency of the magnetron 42 as an initial parameter.

To be specific, in the process illustrated in FIG. 19, in a process ST2911, a current high frequency conversion efficiency $\eta_m$ is calculated in the same manner as the process ST701. In a subsequent process ST2912, an initial high frequency conversion efficiency $\eta_{ic}$ is obtained in the same manner as the process ST702.

In a subsequent process ST2913, a basic offset value $\eta B_{OFFSET}(T_L)$ is obtained by using a first function $f_1(t_A)$. In the method MT2, the first function $f_1(t_A)$ is prepared in advance from the change in the high frequency conversion efficiency with the lapse of time, which is obtained when a magnetron having the same configuration as the magnetron 42 generates a high frequency power under a predetermined condition, and the first function $f_1(t_A)$ is used. The first function $f_1(t_A)$ is a function defining a relationship between an elapsed time period $t_A$ from a time point at which the continuous generation of the high frequency power by a magnetron having the same configuration as the magnetron 42 is started under a predetermined condition to a certain time point during the continuous generation of the high frequency power and a basic offset value $\eta B_{OFFSET}(t_A)$ as an absolute value of a difference between the high frequency conversion efficiency of the magnetron at the certain time point and the convergence value of a high frequency conversion efficiency of the magnetron while the magnetron continuously generates the high frequency power under the predetermined condition. Further, the predetermined condition includes a predetermined stop time period, for example, a sufficient time period of 20 minutes, of the magnetron before generating the high frequency power, and a predetermined power as a set power of the progressive wave in the high frequency power generated by the magnetron.

By way of example, the first function $f_1(t_A)$ is determined as the following equations:

| | |
|---|---|
| $f_1(t_A) = \eta B_{OFFSET}(t_A) =$ $a1_\eta \times t_A + b1_\eta$ | if $t_A$ is shorter than 300 seconds |
| $f_1(t_A) = \eta B_{OFFSET}(t_A) =$ $a2_\eta \times t_A + b2_\eta$ | if $t_A$ is equal to or longer than 300 seconds and shorter than 600 seconds |
| $f_1(t_A) = \eta B_{OFFSET}(t_A) =$ $a3_\eta \times t_A + b3_\eta$ | if $t_A$ is equal to or longer than 600 seconds and equal to or shorter than 900 seconds |

In the above equations, $a1_\eta$, $b1_\eta$, $a2_\eta$, $b2_\eta$, $a3_\eta$, and $b3_\eta$ are coefficients in the first function. Further, the first function $f_1(t_A)$ may be any function if the function approximates a relationship between the elapsed time period $t_A$ at the certain time point and the absolute value of the difference between the high frequency conversion efficiency and a convergence value of the high frequency conversion efficiency at the certain time point while the magnetron continuously generates the high frequency power under the predetermined condition.

In the process ST2913, an elapsed time period $T_L$ from a time point at which the generation of the high frequency power by the magnetron 42 is started to a current time point at which the above-described use conditions are satisfied is inputted as an elapsed time period $t_A$ to the first function $f_1(t_A)$, and a basic offset value $\eta B_{OFFSET}(T_L)$ is outputted as the output of the first function. Further, the elapsed time period $T_L$ may be obtained from the count value of the timer $T_{ON}$.

In a subsequent process ST2914, a coefficient $B_\eta(P_{fm})$ indicating a rate of change in the offset value for a high frequency conversion efficiency corresponding to the measurement value $P_{fm}$ for the power of the progressive wave at the current time point at which the above-described use conditions are satisfied is obtained. For this reason, in the method MT2, a second function $f_2(P_A)$ is prepared in advance, and the second function $f_2(P_A)$ is used. The second function $f_2(P_A)$ is a function defining a relationship between a power $P_A$ of a certain progressive wave and a coefficient $B_\eta(P_A)$ indicating a ratio of a predetermined value as a maximum variation in a high frequency conversion efficiency of a magnetron having the same configuration as the magnetron 42 while the magnetron continuously generates the high frequency power under the power of the certain progressive wave with respect to a predetermined maximum value of a basic offset value $\eta B_{OFFSET}(t_A)$. Further, the maximum variation in the high frequency conversion efficiency is defined as a difference between a maximum value of a high frequency conversion efficiency and a convergence value of the high frequency conversion efficiency.

By way of example, the second function $f_2(P_A)$ is determined as the following equations:

| | |
|---|---|
| $f_2(P_A) = B_\eta(P_A) = 0$ | if $P_A$ is equal to or higher than 0 kW and lower than 0.5 kW |
| $f_2(P_A) = B_\eta(P_A) =$ $c_\eta \times P_A - d_\eta$ | if $P_A$ is equal to or higher than 0.5 kW and lower than 3.5 kW |

In the above equations, $c_\eta$ and $d_\eta$ are coefficients in the second function. Further, the second function $f_2(P_A)$ may be any function if the function approximates a relationship between a power $P_A$ of a certain progressive wave and a ratio of a predetermined value as a maximum variation in a high frequency conversion efficiency of a magnetron while the magnetron continuously generates the high frequency power under the power $P_A$ of the certain progressive wave with respect to a predetermined maximum value of a basic offset value $\eta B_{OFFSET}(t_A)$.

In the process ST2914, the measurement value $P_{fm}$ for the power of the progressive wave at the current time point is inputted as the power $P_A$ of the progressive wave to the second function $f_2(P_A)$, and the coefficient $B_\eta(P_{fm})$ is outputted as the output of the second function $f_2(P_A)$.

In a subsequent process ST2915, a coefficient $D_\eta(T_S)$ indicating a rate of change in the maximum variation in the high frequency conversion efficiency corresponding to the stop time period $T_S$ just before the start time point at which the generation of the high frequency power by the magnetron 42 is started is obtained. For this reason, in the method MT2, a third function $f_3(t_{SA})$ is prepared in advance, and the third function $f_3(t_{SA})$ is used. The third function $f_3(t_{SA})$ is a function defining a relationship between a certain stop time period $t_{SA}$ during which a magnetron having the same configuration as the magnetron 42 stops the generation of the high frequency power and a coefficient $D_\eta(t_{SA})$ indicating a ratio of the maximum variation in the high frequency conversion efficiency of the magnetron while the magnetron continuously generates the high frequency power immediately after the magnetron stops the generation of the high frequency power for the certain stop time period with respect to the maximum variation in the high frequency conversion efficiency of the magnetron while the magnetron continuously generates the high frequency power immediately after the magnetron stops the generation of the high frequency power for a predetermined stop time period.

By way of example, the third function $f_3(t_{SA})$ is determined as the following equations:

$$f_3(t_{SA})=D_\eta(t_{SA})=e_\eta \times \log_{10}(t_{SA})+f_\eta$$

In the above equation, $e_\eta$ and $f_\eta$ are coefficients in the third function. Further, the third function $f_3(t_{SA})$ may be any function if the function approximates a relationship between a certain stop time period $t_{SA}$ and a ratio of a maximum variation in a high frequency conversion efficiency of the magnetron while the magnetron continuously generates the high frequency power immediately after the magnetron stops the generation of the high frequency power for the certain stop time period with respect to a maximum variation in a high frequency conversion efficiency of the magnetron while the magnetron continuously generates the high frequency power immediately after the magnetron stops the generation of the high frequency power for a predetermined stop time period.

In the process ST2915, a stop time period $T_S$ just before the start time point at which the generation of the high frequency power by the magnetron 42 is started is inputted as a stop time period $t_{SA}$ to the third function $f_3(t_{SA})$, and the coefficient $D_\eta(T_S)$ is outputted as the output of the third function $f_3(t_{SA})$. Further, the stop time period $T_S$ may be obtained from the count value of the timer $T_{OFF}$.

In a subsequent process ST2916, the offset value $\eta_{OFFSET}$ for the high frequency conversion efficiency of the magnetron 42 may be obtained by using the basic offset value $\eta B_{OFFSET}(T_L)$, the coefficient $B_\eta(P_{fm})$, the coefficient $C_\eta$, and the coefficient $D_\eta(T_S)$ in the following equation (1):

[Numerical Expression 15]

$$\begin{aligned} \eta_{OFFSET} &= \eta B_{OFFSET}(T_L) \times B_\eta(P_{fm}) \times & \text{if } C_\eta + D_\eta(T_S) \leq 1 \\ & (C_\eta + D_\eta(T_S)) & \\ \eta_{OFFSET} &= \eta B_{OFFSET}(T_L) \times B_\eta(P_{fm}) \times 1 & \text{if } C_\eta + D_\eta(T_S) > 1 \end{aligned} \quad (1)$$

Further, the coefficient $C_\eta$ in the equation (1) is the coefficient $C_\eta$ initialized in the process ST21 if the process illustrated in FIG. 19 is first performed immediately after the stop time period of the magnetron 42. Further, the coefficient $C_\eta$ in the equation (1) is the coefficient $C_\eta$ updated in the process ST33 if the process illustrated in FIG. 19 is performed after a second cycle. The coefficient $C_\eta$ is obtained by dividing the offset value $\eta_{OFFSET}$ for the high frequency conversion efficiency of the magnetron 42 obtained for a period during which the magnetron 42 generates the high frequency power just before the stop time period during which the magnetron 42 stops the generation of the high frequency power just before the start time point at which the generation of the high frequency power by the magnetron 42 is started by a predetermined maximum value of the basic offset value $\eta B_{OFFSET}(t_A)$.

In a subsequent process ST2917, a correction value $\eta_C$ for the absolute value of the current high frequency conversion efficiency is obtained by using the current high frequency conversion efficiency $\eta_m$ of the magnetron 42 and the offset value $\eta_{OFFSET}$ at a time point when the above-described use conditions are satisfied in the following equation (2):

[Numerical expression 16]

$$\eta_C = \eta_m - \eta_{OFFSET} \quad (2)$$

In a subsequent process ST2918, life determination is performed on the basis of a comparison between the correction value $\eta_C$ for the current high frequency conversion efficiency and the initial high frequency conversion efficiency $\eta_{ic}$. To be specific, it is determined whether or not the correction value $\eta_C$ for the current high frequency conversion efficiency is decreased by a predetermined ratio ($-Th_\eta$) or more as compared with the initial high frequency conversion efficiency $\eta_{ic}$. Further, $Th_\eta$ is a positive ratio (%). In the process ST2918, if it is determined that the correction value $\eta_C$ for the current high frequency conversion efficiency is not decreased by the predetermined ratio or more as compared with the initial high frequency conversion efficiency $\eta_{ic}$, processes leading to the process ST30 in the flowchart illustrated in FIG. 16 is performed. Meanwhile, if it is determined that the correction value $\eta_C$ for the current high frequency conversion efficiency is decreased by the predetermined ratio or more as compared with the initial high frequency conversion efficiency $\eta_{ic}$, it is determined that the life of the magnetron 42 is ended, and in the subsequent process ST31, the replacement request signal is outputted from the processor 110.

Further, if the process illustrated in FIG. 19 is included in the life determination, the coefficient $C_\eta$ is updated in the process ST33. The coefficient $C_\eta$ is obtained by dividing the offset value $\eta_{OFFSET}$ obtained just before the process ST33 by a predetermined maximum value of the basic offset value $\eta B_{OFFSET}(t_A)$.

Hereinafter, the process illustrated in FIG. 20 will be described. In the process illustrated in FIG. 20, it is determined whether or not the life of the magnetron 42 is ended on the basis of a comparison between a correction value for a current anode current as a current parameter indicating a current status of the magnetron 42 and an initial anode current of the magnetron 42 as an initial parameter.

To be specific, in the process illustrated in FIG. 20, in a process ST2921, an initial anode current $I_{ic}$ is obtained in the same manner as the process ST721.

In a subsequent process ST2922, a basic offset value $IB_{OFFSET}(T_L)$ is obtained by using a seventh function $f_7(t_A)$. In the method MT2, the seventh function $f_7(t_A)$ is prepared in advance from the change in the anode current with the lapse of time, which is obtained when a magnetron having the same configuration as the magnetron 42 generates a high frequency power under a predetermined condition, and the seventh function $f_7(t_A)$ is used. The seventh function $f_7(t_A)$ is a function defining a relationship between an elapsed time period $t_A$ from a time point at which the continuous generation of the high frequency power by a magnetron having the same configuration as the magnetron 42 is started under a predetermined condition to a certain time point during the continuous generation of the high frequency power and a basic offset value $IB_{OFFSET}(t_A)$ as an absolute value of a difference between the anode current of the magnetron at the certain time point and the convergence value of an anode current of the magnetron while the magnetron continuously generates the high frequency power under the predetermined condition. Further, the predetermined condition includes a predetermined stop time period, for example, a sufficient time period of 20 minutes, of the magnetron before generating the high frequency power, and a predetermined power as a set power of the progressive wave in the high frequency power generated by the magnetron.

By way of example, the seventh function $f_7(t_A)$ is determined as the following equations:

| | |
|---|---|
| $f_7(t_A) = IB_{OFFSET}(t_A) =$ $a1_I \times t_A + b1_I$ | if $t_A$ is shorter than 300 seconds |
| $f_7(t_A) = IB_{OFFSET}(t_A) =$ $a2_I \times t_A + b2_I$ | if $t_A$ is equal to or longer than 300 seconds and shorter than 600 seconds |
| $f_7(t_A) = IB_{OFFSET}(t_A) =$ $a3_I \times t_A + b3_I$ | if $t_A$ is equal to or longer than 600 seconds and equal to or shorter than 900 seconds |

In the above equations, $a1_I$, $b1_I$, $a2_I$, $b2_I$, $a3_I$, and $b3_I$ are coefficients in the seventh function. Further, the seventh function $f_7(t_A)$ may be any function if the function approximates a relationship between the elapsed time period $t_A$ at the certain time point and the absolute value of the difference between the anode current and the convergence value of the anode current at the certain time point while the magnetron continuously generates the high frequency power under the predetermined condition.

In the process ST2922, an elapsed time period $T_L$ from a time point at which the generation of the high frequency power by the magnetron 42 is started to a current time point at which the above-described use conditions are satisfied is inputted as an elapsed time period $t_A$ to the seventh function $f_7(t_A)$, and a basic offset value $IB_{OFFSET}(T_L)$ is outputted as the output of the seventh function. Further, the elapsed time period $T_L$ may be obtained from the count value of the timer $T_{ON}$.

In a subsequent process ST2923, a coefficient $B_I(P_{fm})$ indicating a rate of change in the offset value for an anode current corresponding to the measurement value $P_{fm}$ for the power of the progressive wave at the current time point at which the above-described use conditions are satisfied is obtained. For this reason, in the method MT2, an eighth function $f_8(P_A)$ is prepared in advance, and the eighth function $f_8(P_A)$ is used. The eighth function $f_8(P_A)$ is a function defining a relationship between a power $P_A$ of a certain progressive wave and a coefficient $B_I(P_A)$ indicating a ratio of a predetermined value as a maximum variation in an anode current of a magnetron having the same configuration as the magnetron 42 while the magnetron continuously generates the high frequency power under the power of the certain progressive wave with respect to a predetermined maximum value of a basic offset value $IB_{OFFSET}(t_A)$.

Further, the maximum variation in the anode current is defined as a difference between a minimum value of an anode current and a convergence value of the anode current.

By way of example, the eighth function $f_8(P_A)$ is determined as the following equations:

| | |
|---|---|
| $f_8(P_A) = B_I(P_A) = 0$ | if $P_A$ is equal to or higher than 0 kW and lower than 0.5 kW |
| $f_8(P_A) = B_I(P_A) =$ $c_I \times P_A - d_I$ | if $P_A$ is equal to or higher than 0.5 kW and lower than 3.5 kW |

In the above equations, $c_I$ and $d_I$ are coefficients in the eighth function. Further, the eighth function $f_8(P_A)$ may be any function if the function approximates a relationship between a power $P_A$ of a certain progressive wave and a ratio of a predetermined value as a maximum variation in an anode current of a magnetron while the magnetron continuously generates the high frequency power under the power $P_A$ of the certain progressive wave with respect to a predetermined maximum value of a basic offset value $IB_{OFFSET}(t_A)$.

In the process ST2923, the measurement value $P_{fm}$ for the power of the progressive wave at the current time point is inputted as the power $P_A$ of the progressive wave to the eighth function $f_8(P_A)$, and the coefficient $B_I(P_{fm})$ is outputted as the output of the eighth function $f_8(P_A)$.

In a subsequent process ST2924, a coefficient $D_I(T_S)$ indicating a rate of change in the maximum variation in the anode current corresponding to the stop time period $T_S$ just before the start time point at which the generation of the high frequency power by the magnetron 42 is started is obtained. For this reason, in the method MT2, a ninth function $f_9(t_{SA})$ is prepared in advance, and the ninth function $f_9(t_{SA})$ is used. The ninth function $f_9(t_{SA})$ is a function defining a relationship between a certain stop time period $t_{SA}$ during which a magnetron having the same configuration as the magnetron 42 stops the generation of the high frequency power and a coefficient $D_I(t_{SA})$ indicating a ratio of the maximum variation in the anode current of the magnetron while the magnetron continuously generates the high frequency power immediately after the magnetron stops the generation of the high frequency power for the certain stop time period with respect to the maximum variation in the anode current of the magnetron while the magnetron continuously generates the high frequency power immediately after the magnetron stops the generation of the high frequency power for a predetermined stop time period.

By way of example, the ninth function $f_9(t_{SA})$ is determined as the following equations:

$$f_9(t_{SA}) = D_I(t_{SA}) = e_I \times \log_{10}(t_{SA}) + f_I$$

In the above equation, $e_I$ and $f_I$ are coefficients in the ninth function. Further, the ninth function $f_9(t_{SA})$ may be any function if the function approximates a relationship between a certain stop time period $t_{SA}$ and a ratio of a variation in an anode current of the magnetron while the magnetron continuously generates the high frequency power immediately after the magnetron stops the generation of the high frequency power for the certain stop time period with respect to a variation in an anode current of the magnetron while the magnetron continuously generates the high frequency power immediately after the magnetron stops the generation of the high frequency power for a predetermined stop time period.

In the process ST2924, a stop time period $T_S$ just before the start time point at which the generation of the high frequency power by the magnetron 42 is started is inputted as a stop time period $t_{S4}$ to the ninth function $f_9(t_{S4})$, and the coefficient $D_I(T_S)$ is outputted as the output of the ninth function $f_9(t_{S4})$. Further, the stop time period $T_S$ may be obtained from the count value of the timer $T_{OFF}$.

In a subsequent process ST2925, the offset value $I_{OFFSET}$ for the anode current of the magnetron 42 may be obtained by using the basic offset value $IB_{OFFSET}(T_L)$, the coefficient $B_I(P_{fm})$, the coefficient $C_I$, and the coefficient $D_I(T_S)$ in the following equation (5):

[Numerical Expression 17]

$$I_{OFFSET} = IB_{OFFSET}(T_L) \times B_I(P_{fm}) \times \quad \text{if } C_I + D_I(T_S) \le 1$$
$$(C_I + D_I(T_S))$$
$$I_{OFFSET} = IB_{OFFSET}(T_L) \times B_I(P_{fm}) \times 1 \quad \text{if } C_I + D_I(T_S) > 1$$
(5)

Further, the coefficient $C_I$ in the equation (5) is the coefficient $C_I$ initialized in the process ST21 if the process illustrated in FIG. 20 is first performed immediately after the stop time period of the magnetron 42. Further, the coefficient $C_I$ in the equation (5) is the coefficient $C_I$ updated in the process ST33 if the process illustrated in FIG. 20 is performed after a second cycle. The coefficient $C_I$ is obtained by dividing the offset value $I_{OFFSET}$ for the anode current of the magnetron 42 obtained for a period during which the magnetron 42 generates the high frequency power just before the stop time period during which the magnetron 42 stops the generation of the high frequency power just before the start time point at which the generation of the high frequency power by the magnetron 42 is started by a predetermined maximum value of the basic offset value $IB_{OFFSET}(t_A)$.

In a subsequent process ST2926, a correction value $I_C$ for the current anode current is obtained by using the current anode current $I_m$ of the magnetron 42 and the offset value $I_{OFFSET}$ at a time point when the above-described use conditions are satisfied in the following equation (6):

[Numerical expression 18]

$$I_C = I_m + I_{OFFSET} \quad (6)$$

In a subsequent process ST2927, life determination is performed on the basis of a comparison between the correction value $I_C$ for the current anode current and the initial anode current $I_{ic}$. To be specific, it is determined whether or not the correction value $I_C$ for the current anode current is increased by a predetermined value $Th_I$ or more as compared with the initial anode current $I_{ic}$. Further, $Th_I$ is a positive value. In the process ST2927, if it is determined that the correction value $I_C$ for the current anode current is not increased by the predetermined value or more as compared with the initial anode current $I_{ic}$, processes leading to the process ST30 in the flowchart illustrated in FIG. 16 is performed. Meanwhile, if it is determined that the correction value $I_C$ for the current anode current is increased by the predetermined ratio or more as compared with the initial anode current $I_{ic}$, it is determined that the life of the magnetron 42 is ended, and in the subsequent process ST31, the replacement request signal is outputted from the processor 110.

Further, if the process illustrated in FIG. 20 is included in the life determination, the coefficient $C_I$ is updated in the process ST33. The coefficient $C_I$ is obtained by dividing the offset value $I_{OFFSET}$ obtained just before the process ST33 by a predetermined maximum value of the basic offset value $IB_{OFFSET}(t_A)$.

Hereinafter, the process illustrated in FIG. 21 will be described. In the process illustrated in FIG. 21, it is determined whether or not the life of the magnetron 42 is ended on the basis of a comparison between a correction value for a current peak frequency of a progressive wave as a current parameter indicating a current status of the magnetron 42 and an initial peak frequency of the progressive wave of the magnetron 42 as an initial parameter.

To be specific, in the process illustrated in FIG. 21, in a process ST2931, an initial peak frequency $F_{ic}$ is obtained in the same manner as the process ST731.

In a subsequent process ST2932, a basic offset value $FB_{OFFSET}(T_L)$ is obtained by using a tenth function $f_{10}(t_A)$. In the method MT2, the tenth function $f_{10}(t_A)$ is prepared in advance from the change in the peak frequency with the lapse of time, which is obtained when a magnetron having the same configuration as the magnetron 42 generates a high frequency power under a predetermined condition, and the tenth function $f_{10}(t_A)$ is used. The tenth function $f_{10}(t_A)$ is a function defining a relationship between an elapsed time period $t_A$ from a time point at which the continuous generation of the high frequency power by a magnetron having the same configuration as the magnetron 42 is started under a predetermined condition to a certain time point during the continuous generation of the high frequency power and a basic offset value $FB_{OFFSET}(t_A)$ as an absolute value of a difference between the peak frequency of a progressive wave of the magnetron at the certain time point and the convergence value of a peak frequency of a progressive wave of the magnetron while the magnetron continuously generates the high frequency power under a set condition of a predetermined power of the progressive wave. Further, the predetermined condition includes a predetermined stop time period, for example, a sufficient time period of 20 minutes, of the magnetron before generating the high frequency power, and a predetermined power as a set power of the progressive wave in the high frequency power generated by the magnetron.

By way of example, the tenth function $f_{10}(t_A)$ is determined as the following equations:

| | |
|---|---|
| $f_{10}(t_A) = FB_{OFFSET}(t_A) =$ $a1_F \times t_A + b1_F$ | if $t_A$ is shorter than 300 seconds |
| $f_{10}(t_A) = FB_{OFFSET}(t_A) =$ $a2_F \times t_A + b2_F$ | if $t_A$ is equal to or longer than 300 seconds and shorter than 600 seconds |
| $f_{10}(t_A) = FB_{OFFSET}(t_A) =$ $a3_F \times t_A + b3_F$ | if $t_A$ is equal to or longer than 600 seconds and equal to or shorter than 900 seconds |

In the above equations, $a1_F$, $b1_F$, $a2_F$, $b2_F$, $a3_F$, and $b3_F$ are coefficients in the tenth function. Further, the tenth function $f_{10}(t_A)$ may be any function if the function approximates a relationship between the elapsed time period $t_A$ at the certain time point and the absolute value of the difference between a peak frequency and the convergence value of the peak frequency at the certain time point while the magnetron continuously generates the high frequency power under the predetermined condition.

In the process ST2932, an elapsed time period $T_L$ from a time point at which the generation of the high frequency power by the magnetron 42 is started to a current time point at which the above-described use conditions are satisfied is inputted as an elapsed time period $t_A$ to the tenth function $f_{10}(t_A)$, and a basic offset value $FB_{OFFSET}(T_L)$ is outputted as the output of the tenth function. Further, the elapsed time period $T_L$ may be obtained from the count value of the timer $T_{ON}$.

In a subsequent process ST2933, a coefficient $B_F(P_{fm})$ indicating a rate of change in the offset value for a peak frequency corresponding to the measurement value $P_{fm}$ for the power of the progressive wave at the current time point at which the above-described use conditions are satisfied is obtained. For this reason, in the method MT2, an eleventh function $f_{11}(P_A)$ is prepared in advance, and the eleventh function $f_{11}(P_A)$ is used. The eleventh function $f_{11}(P_A)$ is a function defining a relationship between a power $P_A$ of a certain progressive wave and a coefficient $B_F(P_A)$ indicating a ratio of a predetermined value as a maximum variation in a peak frequency of a progressive wave when a magnetron having the same configuration as the magnetron 42 continuously generates a high frequency power under the power $P_A$ of the certain progressive wave with respect to a predetermined maximum value of a basic offset value $FB_{OFFSET}(t_A)$. Further, a maximum variation in the peak frequency is defined as a difference between a maximum value of a peak frequency and a convergence value of the peak frequency.

By way of example, the eleventh function $f_{11}(P_A)$ is determined as the following equations:

| | |
|---|---|
| $f_{11}(P_A) = B_F(P_A) = 0$ | if $P_A$ is equal to or higher than 0 kW and lower than 0.5 kW |
| $f_{11}(P_A) = B_F(P_A) =$ $c_F \times P_A - d_F$ | if $P_A$ is equal to or higher than 0.5 kW and lower than 3.5 kW |

In the above equations, $c_F$ and $d_F$ are coefficients in the eleventh function. Further, the eleventh function $f_{11}(P_A)$ may be any function if the function approximates a relationship between a power $P_A$ of a certain progressive wave and a ratio of a predetermined value as a maximum variation in a peak frequency while a magnetron continuously generates the high frequency power under the power $P_A$ of the certain progressive wave with respect to a predetermined maximum value of a basic offset value $FB_{OFFSET}(t_A)$.

In the process ST2933, the measurement value $P_{fm}$ for the power of the progressive wave at the current time point is inputted as the power $P_A$ of the progressive wave to the eleventh function $f_{11}(P_A)$, and the coefficient $B_F(P_{fm})$ is outputted as the output of the eleventh function $f_{11}(P_A)$.

In a subsequent process ST2934, a coefficient $D_F(T_S)$ indicating a rate of change in the maximum variation in the peak frequency corresponding to the stop time period $T_S$ just before the start time point at which the generation of the high frequency power by the magnetron 42 is started is obtained. For this reason, in the method MT2, a twelfth function $f_{12}(t_{SA})$ is prepared in advance, and the twelfth function $f_{12}(t_{SA})$ is used. The twelfth function $f_{12}(t_{SA})$ is a function defining a relationship between a certain stop time period $t_{SA}$ during which a magnetron having the same configuration as the magnetron 42 stops the generation of the high frequency power and a coefficient $D_F(t_{SA})$ indicating a ratio of the maximum variation in the peak frequency of a progressive wave while the magnetron continuously generates the high frequency power immediately after the magnetron stops the generation of the high frequency power for the certain stop time period with respect to the maximum variation in the peak frequency of a progressive wave while the magnetron continuously generates the high frequency power immediately after the magnetron stops the generation of the high frequency power for a predetermined stop time period.

By way of example, the twelfth function $f_{12}(t_{SA})$ is determined as the following equations:

$$f_{12}(t_{SA}) = D_F(t_{SA}) = e_F \times \log_{10}(t_{SA}) + f_F$$

In the above equation, $e_F$ and $f_F$ are coefficients in the twelfth function. Further, the twelfth function $f_{12}(t_{SA})$ may be any function if the function approximates a relationship between a certain stop time period $t_{SA}$ and a ratio of a maximum variation in a peak frequency while the magnetron continuously generates the high frequency power immediately after the magnetron stops the generation of the high frequency power for the certain stop time period with respect to a maximum variation in a peak frequency while the magnetron continuously generates the high frequency power immediately after the magnetron stops the generation of the high frequency power for a predetermined stop time period.

In the process ST2934, a stop time period $T_S$ just before the start time point at which the generation of the high frequency power by the magnetron 42 is started is inputted as a stop time period $t_{SA}$ to the twelfth function $f_{12}(t_{SA})$, and the coefficient $D_F(T_S)$ is outputted as the output of the twelfth function $f_{12}(t_{SA})$. Further, the stop time period $T_S$ may be obtained from the count value of the timer $T_{OFF}$.

In a subsequent process ST2935, the offset value $F_{OFFSET}$ for the peak frequency of the magnetron 42 may be obtained by using the basic offset value $FB_{OFFSET}(T_L)$, the coefficient $B_F(P_{fm})$, the coefficient $C_F$, and the coefficient $D_F(T_S)$ in the following equation (7):

[Numerical Expression 19]

$$\begin{aligned} F_{OFFSET} &= FB_{OFFSET}(T_L) \times B_F(P_{fm}) \times && \text{if } C_F + D_F(T_S) \leq 1 \\ & (C_F + D_F(T_S)) \\ F_{OFFSET} &= FB_{OFFSET}(T_L) \times B_F(P_{fm}) \times 1 && \text{if } C_F + D_F(T_S) > 1 \end{aligned} \quad (7)$$

Further, the coefficient $C_F$ in the equation (7) is the coefficient $C_F$ initialized in the process ST21 if the process illustrated in FIG. 21 is first performed immediately after the stop time period of the magnetron 42. Further, the coefficient $C_F$ in the equation (7) is the coefficient $C_F$ updated in the process ST33 if the process illustrated in FIG. 21 is performed after a second cycle. The coefficient $C_F$ is obtained by dividing the offset value $F_{OFFSET}$ for the peak frequency of the magnetron 42 obtained for a period during which the magnetron 42 generates the high frequency power just before the stop time period during which the magnetron 42 stops the generation of the high frequency power just before the start time point at which the generation of the high frequency power by the magnetron 42 is started by a predetermined maximum value of the basic offset value $FB_{OFFSET}(t_A)$.

In a subsequent process ST2936, a correction value $F_C$ for the current peak frequency is obtained by using the measurement value $F_m$ for the current peak frequency of the magnetron 42 and the offset value $F_{OFFSET}$ at a time point when the above-described use conditions are satisfied in the following equation (8):

[Numerical expression 20]

$$F_C = F_m - F_{OFFSET} \quad (8)$$

In a subsequent process ST2937, life determination is performed on the basis of a comparison between the correction value $F_C$ for the current peak frequency and the initial peak frequency $F_{ic}$. To be specific, it is determined whether or not the correction value $F_C$ for the current peak frequency is decreased by a predetermined value or more as compared with the initial peak frequency $F_{ic}$. Further, $Th_F$ in FIG. 21 is a negative value. In the process ST2937, if it is determined that the correction value $F_C$ for the current peak frequency is not decreased by the predetermined value or more as compared with the initial peak frequency $F_{ic}$, processes leading to the process ST30 in the flowchart illustrated in FIG. 16 is performed. Meanwhile, if it is determined that the correction value $F_C$ for the current peak frequency is decreased by the predetermined value or more as compared with the initial peak frequency $F_{ic}$, it is determined that the life of the magnetron 42 is ended, and in the subsequent process ST31, the replacement request signal is outputted from the processor 110.

Further, if the process illustrated in FIG. 21 is included in the life determination, the coefficient $C_F$ is updated in the process ST33. The coefficient $C_F$ is obtained by dividing the offset value $F_{OFFSET}$ obtained just before the process ST33 by a predetermined maximum value of the basic offset value $FB_{OFFSET}(t_A)$.

In the method MT2 using the processes for the life determination illustrated in FIG. 18 to FIG. 21, the correction value for the current parameter reflecting the offset value is obtained. Therefore, in the method MT2, the current parameter having a small difference from the convergence value is obtained. As a result, the values of determination references such as $Th_F$, $Th_\eta$, $Th_f$, and $Th_F$ may be set to have small absolute values. Therefore, it is possible to determine the life of the magnetron with higher accuracy.

Further, in the method MT2, the processes for the life determination illustrated in FIG. 18 to FIG. 21 may be substituted by the processes for the life determination illustrated in FIG. 10, FIG. 9, FIG. 11, and FIG. 12, respectively. Furthermore, desirably, the number of significant digits of the measurement values or the like used in the method MT and the method MT2 is 3 or more. By using the number of significant digits as such, the accuracy in the life determination is further improved.

Although various exemplary embodiments have been described above, the present disclosure is not limited to the above-described exemplary embodiments and can be modified and changed in various ways. By way of example, the configurations of the plasma processing apparatus 10, the microwave generator 41a, and the control circuit 100 illustrated in FIG. 1 to FIG. 5 are just examples, and the method MT and the method MT2 can be performed in order to a magnetron provided in a certain plasma processing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A method for inspecting a magnetron, comprising:
   starting generation of a high frequency power by a magnetron based on a set power;
   detecting one or more measurement values for specifying a status of the magnetron; and
   determining, with at least one processor, whether or not use conditions are satisfied, wherein the determining includes:
   determining whether or not a time period having a predetermined duration or more has elapsed after a start time point at which the generation of the high frequency power by the magnetron is started;
   determining whether or not a difference between a power of a progressive wave based on the high frequency power generated by the magnetron and the set power is equal to or lower than a first predetermined value;
   determining whether or not a power of a reflection wave outputted from a directional coupler provided between the magnetron and a load is equal to or lower than a second predetermined value; and
   determining that the use conditions are satisfied if the time period having the predetermined duration or more has elapsed after the start time point, the difference between the power of the progressive wave and the set power is equal to or lower than the first predetermined value, and the power of the reflection wave is equal to or lower than the second predetermined value,
   wherein if it is determined that the use conditions are satisfied, determining, with the at least one processor, a life of the magnetron on the basis of a comparison between a current parameter, which indicates a current status of the magnetron and is obtained from the one or more measurement values at a time point satisfying the use conditions, and an initial parameter, which indicates an initial status of the magnetron and corresponds to the current parameter, and
   if it is determined that the use conditions are not satisfied, detecting one or more measurement values for specifying the status of the magnetron until the use conditions are satisfied.

2. The method of claim 1,
   wherein the current parameter includes a current high frequency conversion efficiency of the magnetron,
   the high frequency conversion efficiency is a value obtained by dividing a power of a progressive wave included in the one or more measurement values by an input power inputted to the magnetron, and
   in the determining of the life of the magnetron, when the current high frequency conversion efficiency is decreased by a predetermined ratio or more as compared with an initial high frequency conversion efficiency of the magnetron included in the initial parameter, the life of the magnetron is detected.

3. The method of claim 2, further comprising:
   predicting a remaining time period to the life of the magnetron,
   wherein in the predicting of the remaining time period,
   a current use time period of the magnetron corresponding to the current high frequency conversion efficiency is obtained by referring to data in which the use time period of the magnetron is corresponded to the high frequency conversion efficiency of the magnetron, and
   a difference between a predetermined life of the magnetron and the current use time period of the magnetron is obtained as the remaining time period.

4. The method of claim 2, further comprising:
   predicting a remaining time period to the life of the magnetron,
   wherein in the predicting of the remaining time period,
   a constant A is calculated by substituting a current use time period $t_c$ of the magnetron, the initial high frequency conversion efficiency $\eta_{ic}$, and the current high frequency conversion efficiency $\eta_m$ in an equation (9)

[Numerical expression 9]

$$t_c = \frac{1}{A}\log_e\frac{\eta_m}{\eta_{ic}}, \quad (9)$$

a life $t_d$ is obtained by substituting a high frequency conversion efficiency $\eta_d$ when a predetermined life of the magnetron is ended, the calculated constant A, and the initial high frequency conversion efficiency in an equation (10)

[Numerical expression 10]

$$t_d = \frac{1}{A}\log_e\frac{\eta_d}{\eta_{ic}}, \quad (10)$$

and a difference between the calculated life $t_d$ and the current use time period $t_c$ is obtained as the remaining time period.

5. The method of claim 1, further comprising:

obtaining a first basic offset value $\eta B_{OFFSET}(T_L)$ as an output of a first function by inputting an elapsed time period $T_L$ from the start time point to the time point when the use conditions are satisfied to the first function, the first function defining a relationship between an elapsed time period $t_A$ from a time point at which a continuous generation of the high frequency power by the magnetron under a predetermined power of the progressive wave is started to a preset time point during the continuous generation of the high frequency power and a first basic offset value $\eta B_{OFFSET}(t_A)$ as an absolute value of a difference between a high frequency conversion efficiency of the magnetron at the preset time point and a convergence value of the high frequency conversion efficiency of the magnetron during the continuous generation of the high frequency power by the magnetron under the predetermined power of the progressive wave;

obtaining a coefficient $B_\eta(P_{fm})$ as an output of a second function by inputting a measurement value $P_{fm}$ for the power of the progressive wave at the time point when the use conditions are satisfied to the second function, the second function defining a relationship between a power $P_A$ of the progressive wave and a coefficient $B_\eta(P_A)$ indicating a ratio of a predetermined value as a maximum variation in the high frequency conversion efficiency of the magnetron during the continuous generation of the high frequency power by the magnetron under the power of the progressive wave with respect to a predetermined maximum value of the first basic offset value $\eta B_{OFFSET}(t_A)$;

obtaining a coefficient $C_\eta$ by dividing an offset value for the high frequency conversion efficiency of the magnetron obtained during the continuous generation of the high frequency power by the magnetron just before a stop time period during which the magnetron stops the generation of the high frequency power just before the start time point by the predetermined maximum value of the first basic offset value $\eta B_{OFFSET}(t_A)$;

obtaining a coefficient $D_\eta(T_S)$ as an output of a third function by inputting the stop time period $T_S$ to the third function, the third function defining a relationship between a stop time period $t_{SA}$ during which the magnetron stops the generation of the high frequency power and a coefficient $D_\eta(t_{SA})$ indicating a ratio of a maximum variation in the high frequency conversion efficiency of the magnetron during the continuous generation of the high frequency power by the magnetron immediately after the magnetron stops the generation of the high frequency power for the stop time period with respect to a maximum variation in the high frequency conversion efficiency of the magnetron during the continuous generation of the high frequency power by the magnetron immediately after the magnetron stops the generation of the high frequency power for a predetermined stop time period;

obtaining an offset value $\eta_{OFFSET}$ for the high frequency conversion efficiency of the magnetron by substituting the first basic offset value $\eta B_{OFFSET}(T_L)$, the coefficient $B_\eta(P_{fm})$, the coefficient $C_\eta$, and the coefficient $D_\eta(T_S)$ in an equation (1)

[Numerical Expression 1]

$$\begin{aligned}\eta_{OFFSET} &= \eta B_{OFFSET}(T_L) \times B_\eta(P_{fm}) \times & \text{if } C_\eta + D_\eta(T_S) \le 1 \\ & (C_\eta + D_\eta(T_S)) \\ \eta_{OFFSET} &= \eta B_{OFFSET}(T_L) \times B_\eta(P_{fm}) \times 1 & \text{if } C_\eta + D_\eta(T_S) > 1\end{aligned} \quad (1);$$

and obtaining a correction value $\eta_C$ for the high frequency conversion efficiency by substituting a current high frequency conversion efficiency $\eta_m$ obtained by dividing the power of the progressive wave included in the one or more measurement values at the time point when the use conditions are satisfied by the input power inputted to the magnetron and the offset value $\eta_{OFFSET}$ in an equation (2)

[Numerical expression 2]

$$\eta_C = \eta_m - \eta_{OFFSET} \quad (2),$$

wherein the current parameter includes the correction value $\eta_C$ for the high frequency conversion efficiency, and in the determining of the life of the magnetron, when the correction value $\eta_C$ for the high frequency conversion efficiency included in the current parameter is decreased by a predetermined ratio or more as compared with an initial high frequency conversion efficiency of the magnetron included in the initial parameter, the life of the magnetron is detected.

6. The method of claim 1, wherein the current parameter includes an absolute value of a measurement value for an anode voltage of the magnetron, which is included in the one or more measurement values, at the time point when the use conditions are satisfied, as an absolute value of a current anode voltage of the magnetron, and in the determining of the life of the magnetron, when the absolute value of the current anode voltage of the magnetron included in the current parameter is increased by a predetermined value or more as compared with an absolute value of an initial anode voltage of the magnetron included in the initial parameter, the life of the magnetron is detected.

7. The method of claim 1, further comprising:

obtaining a second basic offset value $VB_{OFFSET}(T_L)$ as an output of a fourth function by inputting an elapsed time period $T_L$ from the start time point to the time point when the use conditions are satisfied to the fourth function, the fourth function defining a relationship between an elapsed time period $t_A$ from a time point at which a continuous generation of the high frequency power by the magnetron under a predetermined power of the progressive wave is started to a preset time point during the continuous generation of the high frequency power and a second basic offset value $VB_{OFFSET}(t_A)$ as an absolute value of a difference between an anode voltage of the magnetron at the preset time point and a convergence value of the anode voltage of the magnetron during the continuous generation of the high frequency power by the magnetron under the predetermined power of the progressive wave;

obtaining a coefficient $B_V(P_{fm})$ as an output of a fifth function by inputting a measurement value $P_{fm}$ for the power of the progressive wave at the time point when the use conditions are satisfied to the fifth function, the fifth function defining a relationship between a power $P_A$ of the progressive wave and a coefficient $B_V(P_A)$ indicating a ratio of a predetermined value as a maximum variation in the anode voltage of the magnetron during the continuous generation of the high frequency power by the magnetron under the power $P_A$ of the progressive wave with respect to a predetermined maximum value of the second basic offset value $VB_{OFFSET}(t_A)$;

obtaining a coefficient $C_V$ by dividing an offset value for the anode voltage of the magnetron obtained during the generation of the high frequency power by the magnetron just before a stop time period during which the magnetron stops the generation of the high frequency power just before the start time point by the predetermined maximum value of the second basic offset value $VB_{OFFSET}(t_A)$;

obtaining a coefficient $D_V(T_S)$ as an output of a sixth function by inputting the stop time period $T_S$ to the sixth function, the sixth function defining a relationship between a stop time period $t_{SA}$ during which the magnetron stops the generation of the high frequency power and a coefficient $D_V(t_{SA})$ indicating a ratio of a maximum variation in the anode voltage of the magnetron during the continuous generation of the high frequency power by the magnetron immediately after the magnetron stops the generation of the high frequency power for the stop time period with respect to a maximum variation in the anode voltage of the magnetron during the continuous generation of the high frequency power by the magnetron immediately after the magnetron stops the generation of the high frequency power for a predetermined stop time period;

obtaining an offset value $V_{OFFSET}$ for the anode voltage of the magnetron by substituting the second basic offset value $VB_{OFFSET}(T_L)$, the coefficient $B_V(P_{fm})$, the coefficient $C_V$, and the coefficient $D_V(T_S)$ in an equation (3)

[Numerical Expression 3]

$$V_{OFFSET} = VB_{OFFSET}(T_L) \times B_V(P_{fm}) \times (C_V + D_V(T_S)) \quad \text{if } C_V + D_V(T_S) \le 1 \\ V_{OFFSET} = VB_{OFFSET}(T_L) \times B_V(P_{fm}) \times 1 \quad \text{if } C_V + D_V(T_S) > 1$$ (3)

and obtaining a correction value $V_C$ for the absolute value of the anode voltage by substituting a measurement value $V_m$ for a current anode voltage of the magnetron included in the one or more measurement values at the time point when the use conditions are satisfied and the offset value $V_{OFFSET}$ in an equation (4)

[Numerical expression 4]

$$V_C = |V_m| - V_{OFFSET}$$ (4), wherein in the determining of the life of the magnetron, when the correction value $V_C$ for the absolute value of the anode voltage included in the current parameter is increased by a predetermined value or more as compared with an absolute value of an initial anode voltage of the magnetron included in the initial parameter, the life of the magnetron is detected.

8. The method of claim 1,
wherein the current parameter includes a measurement value for an anode current of the magnetron, which is included in the one or more measurement values at the time point when the use conditions are satisfied, as a current anode current of the magnetron, and
in the determining of the life of the magnetron, when the current anode current of the magnetron included in the current parameter is increased by a predetermined value or more as compared with an initial anode current of the magnetron included in the initial parameter, the life of the magnetron is detected.

9. The method of claim 1, further comprising:
obtaining a third basic offset value $IB_{OFFSET}(T_L)$ as an output of a seventh function by inputting an elapsed time period $T_L$ from the start time point to the time point when the use conditions are satisfied to the seventh function, the seventh function defining a relationship between an elapsed time period $t_A$ from a time point at which a continuous generation of the high frequency power by the magnetron under a predetermined power of a progressive wave is started to a preset time point during the continuous generation of the high frequency power and a third basic offset value $IB_{OFFSET}(t_A)$ as an absolute value of a difference between an anode current of the magnetron at the preset time point and a convergence value of the anode current of the magnetron during the continuous generation of the high frequency power by the magnetron under the predetermined power of the progressive wave;

obtaining a coefficient $B_I(P_{fm})$ as an output of an eighth function by inputting a measurement value $P_{fm}$ for the power of the progressive wave at the time point when the use conditions are satisfied to the eighth function, the eighth function defining a relationship between a power $P_A$ of the progressive wave and a coefficient $B_I(P_A)$ indicating a ratio of a predetermined value as a maximum variation in the anode current of the magnetron during the continuous generation of the high frequency power by the magnetron under the power of the progressive wave with respect to a predetermined maximum value of the third basic offset value $IB_{OFFSET}(t_A)$;

obtaining a coefficient $C_I$ by dividing an offset value for the anode current of the magnetron obtained during the generation of the high frequency power by the magnetron just before a stop time period during which the magnetron stops the generation of the high frequency power just before the start time point by the predetermined maximum value of the third basic offset value $IB_{OFFSET}(t_A)$;

obtaining a coefficient $D_I(T_S)$ as an output of a ninth function by inputting the stop time period $T_S$ to the ninth function, the ninth function defining a relationship between a stop time period $t_{SA}$ during which the magnetron stops the generation of the high frequency power and a coefficient $D_I(t_{SA})$ indicating a ratio of a maximum variation in the anode current of the magnetron during the continuous generation of the high frequency power by the magnetron immediately after the magnetron stops the generation of the high frequency power for the stop time period with respect to a maximum variation in the anode current of the magnetron during the continuous generation of the high frequency power by the magnetron immediately after the magnetron stops the generation of the high frequency power for a predetermined stop time period;

obtaining an offset value $I_{OFFSET}$ for the anode current of the magnetron by substituting the third basic offset value $IB_{OFFSET}(T_L)$, the coefficient $B_I(P_{fm})$, the coefficient $C_I$, and the coefficient $D_I(T_S)$ in an equation (5)

[Numerical Expression 5]

$$\left.\begin{array}{l}I_{OFFSET} = IB_{OFFSET}(T_L) \times B_I(P_{fm}) \times \quad \text{if } C_I + D_I(T_S) \leq 1 \\ (C_I + D_I(T_S)) \\ I_{OFFSET} = IB_{OFFSET}(T_L) \times B_I(P_{fm}) \times 1 \quad \text{if } C_I + D_I(T_S) > 1\end{array}\right\} \quad (5)$$

and obtaining a correction value $I_C$ for the anode current by substituting a measurement value $I_m$ for a current anode current of the magnetron included in the one or more measurement values at the time point when the use conditions are satisfied and the offset value $I_{OFFSET}$ in an equation (6)

[Numerical expression 6]

$$I_C = I_m + I_{OFFSET} \quad (6),$$

wherein in the determining of the life of the magnetron, when the correction value $I_C$ for the anode current included in the current parameter is increased by a predetermined value or more as compared with an initial anode current of the magnetron included in the initial parameter, the life of the magnetron is detected.

10. The method of claim 1, wherein the current parameter includes a measurement value for a peak frequency of the progressive wave included in the one or more measurement values at the time point when the use conditions are satisfied, as a current peak frequency of the progressive wave, and in the determining of the life of the magnetron, when the current peak frequency of the progressive wave included in the current parameter is decreased by a predetermined value or more as compared with an initial peak frequency of the progressive wave included in the initial parameter, the life of the magnetron is detected.

11. The method of claim 1, further comprising:

obtaining a fourth basic offset value $FB_{OFFSET}(T_L)$ as an output of a tenth function by inputting an elapsed time period $T_L$ from the start time point to the time point when the use conditions are satisfied to the tenth function, the tenth function defining a relationship between an elapsed time period $t_A$ from a time point at which a continuous generation of the high frequency power by the magnetron under a predetermined power of a progressive wave is started to a preset time point during the continuous generation of the high frequency power and a fourth basic offset value $FB_{OFFSET}(t_A)$ as an absolute value of a difference between a peak frequency of a progressive wave of the magnetron at the preset time point and a convergence value of the peak frequency of the progressive wave of the magnetron during the continuous generation of the high frequency power by the magnetron under the predetermined power of the progressive wave;

obtaining a coefficient $B_F(P_{fm})$ as an output of an eleventh function by inputting a measurement value $P_{fm}$ for the power of the progressive wave at the time point when the use conditions are satisfied to the eleventh function, the eleventh function defining a relationship between a power $P_A$ of the progressive wave and a coefficient $B_F(P_A)$ indicating a ratio of a predetermined value as a maximum variation in the peak frequency of the progressive wave during the continuous generation of the high frequency power by the magnetron under the power $P_A$ of the progressive wave with respect to a predetermined maximum value of the fourth basic offset value $FB_{OFFSET}(t_A)$;

obtaining a coefficient $C_F$ by dividing an offset value for the peak frequency of the progressive wave obtained during the generation of the high frequency power by the magnetron just before a stop time period during which the magnetron stops the generation of the high frequency power just before the start time point by the predetermined maximum value of the fourth basic offset value;

obtaining a coefficient $D_F(T_S)$ as an output of a twelfth function by inputting the stop time period $T_S$ to the twelfth function, the twelfth function defining a relationship between a stop time period $t_{SA}$ during which the magnetron stops the generation of the high frequency power and a coefficient $D_F(t_{SA})$ indicating a ratio of a maximum variation in the peak frequency of the progressive wave during the continuous generation of the high frequency power by the magnetron immediately after the magnetron stops the generation of the high frequency power for the stop time period with respect to a maximum variation in the peak frequency of the progressive wave during the continuous generation of the high frequency power by the magnetron immediately after the magnetron stops the generation of the high frequency power for a predetermined stop time period;

obtaining an offset value $F_{OFFSET}$ for the peak frequency of the progressive wave by substituting the fourth basic offset value $FB_{OFFSET}(T_L)$, the coefficient $B_F(P_{fm})$, the coefficient $C_F$, and the coefficient $D_F(T_S)$ in an equation (7)

[Numerical Expression 7]

$$\left.\begin{array}{l}F_{OFFSET} = FB_{OFFSET}(T_L) \times B_F(P_{fm}) \times \quad \text{if } C_F + D_F(T_S) \leq 1 \\ (C_F + D_F(T_S)) \\ F_{OFFSET} = FB_{OFFSET}(T_L) \times B_F(P_{fm}) \times 1 \quad \text{if } C_F + D_F(T_S) > 1\end{array}\right\} \quad (7)$$

and
   obtaining a correction value $F_C$ for the peak frequency of the progressive wave by substituting a measurement value $F_m$ for the peak frequency of the progressive wave included in the one or more measurement values at the time point when the use conditions are satisfied and the offset value $F_{OFFSET}$ in an equation (8)

[Numerical expression 8]

$$F_C = F_m - F_{OFFSET} \qquad (8),$$

wherein in the determining of the life of the magnetron, when the correction value $F_C$ for the peak frequency of the progressive wave included in the current parameter is decreased by a predetermined value or more as compared with an initial peak frequency of the progressive wave included in the initial parameter, the life of the magnetron is detected.

\* \* \* \* \*

UNITED STATES PATENT AND TRADEMARK OFFICE
CERTIFICATE OF CORRECTION

PATENT NO. : 9,977,070 B2
APPLICATION NO. : 14/886425
DATED : May 22, 2018
INVENTOR(S) : Kazushi Kaneko et al.

Page 1 of 1

It is certified that error appears in the above-identified patent and that said Letters Patent is hereby corrected as shown below:

In the Specification

Column 19, Line 31, "q is derived." should be -- $\eta_{ic}$ is derived. --.

Column 19, Line 32, "$P_{set}$, $P_{set}(1)$" should be -- $P_{set}$, *i.e.*, $P_{set}(1)$ --.

Signed and Sealed this
Twenty-eighth Day of August, 2018

Andrei Iancu
*Director of the United States Patent and Trademark Office*